(12) United States Patent
Shimazaki et al.

(10) Patent No.: US 7,225,418 B2
(45) Date of Patent: May 29, 2007

(54) OPERATION ANALYZING METHOD FOR SEMICONDUCTOR INTEGRATED CIRCUIT DEVICE, ANALYZING SYSTEM USED IN THE SAME, AND OPTIMIZATION DESIGN METHOD USING THE SAME

(75) Inventors: Kenji Shimazaki, Hyogo (JP); Kazuhiro Sato, Osaka (JP); Takahiro Ichinomiya, Osaka (JP); Nobufusa Iwanishi, Osaka (JP); Naoki Amekawa, Kyoto (JP); Masaaki Hirata, Osaka (JP); Shouzou Hirano, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 218 days.

(21) Appl. No.: 10/863,231

(22) Filed: Jun. 9, 2004

(65) Prior Publication Data

US 2004/0249588 A1    Dec. 9, 2004

(30) Foreign Application Priority Data

Jun. 9, 2003    (JP)    ............... P.2003-164036

(51) Int. Cl.
*G06F 17/50*    (2006.01)
(52) U.S. Cl. ............... 716/6; 716/1; 716/4; 716/11
(58) Field of Classification Search ............... 716/1, 716/4, 6, 11
See application file for complete search history.

(56) References Cited

U.S. PATENT DOCUMENTS

| 6,519,748 B2 * | 2/2003 | Sakamoto ............... 716/6 |
| 6,564,357 B2 | 5/2003 | Kay et al. |
| 2002/0174409 A1 | 11/2002 | Cohn et al. |

FOREIGN PATENT DOCUMENTS

| JP | 7-239865 | 9/1995 |
| JP | 10-143553 | 5/1998 |
| JP | 2000-194732 | 7/2000 |
| JP | 2000-195960 | 7/2000 |

OTHER PUBLICATIONS

Japanese Office Action issued in corresponding Japanese Patent Application No. 2003-164036, mailed Mar. 7, 2007.

* cited by examiner

*Primary Examiner*—Thuan Do
(74) *Attorney, Agent, or Firm*—McDermott Will & Emery LLP

(57) ABSTRACT

There are contained the step of forming voltage waveform information by calculating a voltage waveform of each instance of a semiconductor integrated circuit at a power-supply terminal based on circuit information and analyzing the voltage waveform of each instance, the step of forming voltage abstraction information by abstracting the voltage waveform information, and the step of calculating a delay value of the instance based on the voltage abstraction information.

38 Claims, 50 Drawing Sheets

VOLTAGE ABSTRACTION (MODELING)

R SAME AREA (MESH)

CASE 1: MAXIMUM VOLTAGE DIFFERENCE ON THE PERIOD A

LIBRARY FORMATION USING COMBINATIONS OF VOLTAGES vdd, vdd1, vdd2, TIMES t1, t2

⇒ LIBRARY

Tw: TIMING WINDOW

CELL LIBRARY

CELL A

INPUT PIN CAPACITANCE INFORMATION: 4

POWER CONSUMPTION INFORMATION:

|  | GRADIENT 1 | GRADIENT 2 | GRADIENT 3 |
|---|---|---|---|
| CAPACITANCE 1 | 1 | 2 | 3 |
| CAPACITANCE 2 | 2 | 3 | 4 |
| CAPACITANCE 3 | 3 | 4 | 5 |

POWER CONSUMPTION INFORMATION:

|  | GRADIENT 1 | GRADIENT 2 | GRADIENT 3 |
|---|---|---|---|
| CAPACITANCE 1 | 0.01 | 0.05 | 0.1 |
| CAPACITANCE 2 | 0.02 | 0.06 | 0.11 |
| CAPACITANCE 3 | 0.03 | 0.07 | 0.12 |

VOLTAGE-DROP ANALYZING MACRO CURRENT MODEL

VOLTAGE-DROP ANALYZING MACRO CURRENT MODEL

READ MODE

WRITE MODE

FIG. 43

READ MODE 1 BIT

READ MODE ALL BIT

WRITE MODE 1 BIT

WRITE MODE ALL BIT

WRITE MODE

OPERATION ANALYZING METHOD FOR SEMICONDUCTOR INTEGRATED CIRCUIT DEVICE, ANALYZING SYSTEM USED IN THE SAME, AND OPTIMIZATION DESIGN METHOD USING THE SAME

The present application is based on Japanese Patent Application No. 2003-164036, which is incorporated herein by reference.

BACKGROUND OF THE INVENTION

1. Field of the Invention

The present invention relates to an operation analyzing method for a semiconductor integrated circuit device, an analyzing system used in the same, and an optimization design method using the same and, more particularly, a method of applying a high-speed and high-precision operation analysis to a large-scale and high-speed driven LSI (large-scale semiconductor integrated circuit).

2. Description of the Related Art

Normally, a timing analysis is important in the design of the semiconductor integrated circuit. For example, the optimization must be achieved by executing the timing analysis to decide whether or not timings among flip-flops are matched mutually. Therefore, there is employed a method that executes an optimum design of the semiconductor integrated circuit by executing a circuit operation analysis to calculate a delay value such that the delay value is suppressed within a tolerance. However, the numbers of transistors, resistors, capacitors, etc. constituting the semiconductor integrated circuit increases steadily with the higher speed and the higher integration of the semiconductor integrated circuit. For this reason, although the circuit is designed to reduce power consumption of each circuit element, a large voltage is simultaneously consumed since the number of elements is increased. Also, a huge amount of computation is needed to execute the analysis every circuit element.

As a result, it becomes an important matter to calculate a high-precision delay value while preventing an increase in an amount of computation. Thus, various methods were proposed.

In the related art, a logic simulation applied to analyze the circuit operation is carried out by taking account of not only representative delay conditions but also power-supply voltage variation, operating temperature variation, and process variation. However, a delay variation of each element due to the operating voltage of each element in the circuit is not considered. Thus, with an increase of an integration degree, it becomes impossible to neglect an influence of such delay variation upon a delay of each element.

Therefore, there was proposed a delay calculation method that attains an improvement of reliability by calculating a voltage drop due to the power-supply wiring to consider a voltage drop of each element (See Unexamined Japanese Patent Publication No. 2000-195960).

According to this method, a power-supply voltage of each element is calculated with taking a voltage drop in the power-supply wiring of the object-of-design circuit into consideration, and then a delay value of each element is calculated by using the calculated power-supply voltage of each element.

However, according to this method, a calculation of the voltage drop is carried out, based on element voltage-drop resistance value information read out from the library that stores the voltage-drop resistance values of respective elements, and an average power-supply current value in the operation of each element. Therefore, the voltage-drop information of each element calculated herein gives average voltage information of each element in the circuit.

More particularly, as shown in FIG. 56, a voltage analyzing means 2002 executes a voltage analysis based on the average power-supply current in the operation of each element from circuit information 2001 to calculate an average voltage-drop value 2003, then a delay calculating means 2005 picks up a delay value based on the resultant average voltage-drop value by referring to a library 2004 and then outputs the delay value formed in a standard delay format (SDF: Standard Delay Format established by the nonprofit organization in USA, Silicon Integration Initiative, to represent the delay time) 2006, then a timing analyzing means 2007 executes a timing analysis by using the delay value and then outputs the result analyzed by the timing analyzing means as a timing report 2008, and then an optimizing means 2009 executes a change of design based on this analyzed result to optimize the timing.

Here, the library 2004 includes a cell library 2013 for storing delay value information every cell, and a macro library 2023 for storing delay value information every so-called macro that an assembly of cells is regarded as one lump. Then, an average voltage drop is calculated based on an average power-supply current in operation of the representative cell from cell information 2011, then this calculated value is abstracted (characterized), and then this characterized value is stored in the cell library 2013. In contrast, an average voltage drop is calculated based on an average power-supply current in operation of the representative macro from macro information 2021, then this calculated value is characterized, and then this characterized value is stored in the macro library 2023.

Also, in order to implement the logic simulation in which an influence of a voltage variation at the time of switching a logic cell upon the delay time is considered, a method of simulating the delay time based on a voltage at a power-supply terminal of a logic gate was proposed (See Unexamined Japanese Patent Publication No. HEI-7-239865).

However, in this method, the simulation is carried out based on a mean value over an execution time of a test pattern of the simulated circuit.

In addition, a method of calculating circuit element delay information in response to time-series voltage variation information during the simulation that takes account of the voltage variation was proposed (See Unexamined Japanese Patent Publication No. 2000-194732).

In the actual circuit operation in above Patent Literature 1, the voltage is varied during when the cell (instance) is operated. In contrast, in this method, since the average voltage-drop value is used to calculate the delay value, a calculation of the delay value at an impossible timing is caused and therefore a practical timing analysis for such calculation of the delay value is desired.

Also, in Patent Literatures 2 and 3, a time-series voltage is considered to calculate the delay value, nevertheless the voltage variation caused when the instance is operated is not considered.

However, in the actual circuit operation, the voltage variation during the operation becomes a big problem.

The present invention has been made in view of the above circumstances, and it is an object of the present invention to provide a semiconductor integrated circuit capable of operating with high precision and having an excellent performance characteristic by taking account of a dynamic voltage drop.

Also, it is another object of the present invention to implement a high-precision and highly reliable timing verification by taking account of a dynamic voltage drop.

SUMMARY OF THE INVENTION

In order to achieve the above objects, an operation analyzing method for a semiconductor integrated circuit device of the present invention, comprises the steps of forming voltage waveform information by calculating a voltage waveform of each instance of a semiconductor integrated circuit at a power-supply terminal based on circuit information of a semiconductor integrated circuit device and analyzing the voltage waveform of each instance; forming voltage abstraction information by abstracting the voltage waveform information; and calculating a delay value of the instance based on the voltage abstraction information.

According to this configuration, the delay value is not calculated based on the average voltage, but such delay value is calculated by measuring a time and a voltage in each instance, i.e., each cell or macro of the semiconductor integrated circuit, setting the voltage obtained as dynamic data containing time data as the voltage waveform information, and abstracting the voltage waveform information. Therefore, an analyzing precision can be improved much more.

Here, assume that the instance includes the unit cell, the circuit element, or the macro as an assembly of circuit elements. Then, the voltage value in each instance is grasped as the voltage information at two time points or more, and the voltage waveform information are derived by using this information.

Also, in the operation analyzing method for a semiconductor integrated circuit device of the present invention, in the above method, the step of forming the voltage waveform information includes the step of calculating the voltage waveform information of all instances in the semiconductor integrated circuit device.

According to this configuration, the voltage waveform information of all instances are derived and then the voltage waveform information are abstracted. Therefore, the high-efficiency analysis can be executed.

Also, the voltage waveform information of a part of the instances may be derived and then the voltage waveform information may be abstracted. Therefore, the processing speed can be accelerated.

In addition, in the operation analyzing method for a semiconductor integrated circuit device of the present invention, in the above method, the step of calculating the delay value is the step of referring to a library in response to the voltage abstraction information to read a concerned delay value from the library, and outputting the delay value as delay value information.

According to this configuration, the delay value is read from the library based on the voltage abstraction information. Therefore, deterioration of the characteristics can be prevented and reduction in an amount of data can be achieved.

Further, in the above method, the operation analyzing method for a semiconductor integrated circuit device of the present invention further comprises the step of calculating an active time of each instance based on the circuit information prior to the step of forming the voltage abstraction information.

According to this configuration, an active time of each instance is calculated previously based on the circuit information. Therefore, since only the information of the concerned active time or its periphery may be abstracted upon abstraction, the calculation can be simplified.

Also, in the operation analyzing method for a semiconductor integrated circuit device of the present invention, in the above method, the library includes a cell library for storing abstracted cell information and a macro library for storing abstracted macro information.

According to this configuration, reduction in an amount of data can be achieved effectively.

Further, in the operation analyzing method for a semiconductor integrated circuit device of the present invention, in the above method, the step of forming the voltage waveform information is the step of forming the voltage waveform by referring to a previously formed library based on the circuit information.

According to this configuration, since the voltage waveform information are formed by referring to the previously formed library based on the circuit information, such voltage waveform information can be formed easily in a short time. Also, such information can be output as the voltage waveform information that are abstracted by the library.

Also, if the actually measured output signal is employed not to refer to the library, a high-accuracy waveform information can be extracted.

Also, in the operation analyzing method for a semiconductor integrated circuit device of the present invention, in the above method, the step of forming the voltage abstraction information includes the linearing step of partitioning the voltage waveform every predetermined unit window and linearing such waveform in the unit window.

According to this configuration, abstraction of the data can be implemented easily.

Also, in the operation analyzing method for a semiconductor integrated circuit device of the present invention, in the above method, the linearing step is the step of forming linear information by connecting a start point and an end point of the voltage waveform in the unit window by a straight line to linearize.

According to this configuration, abstraction of the data can be implemented effectively.

Also, in the operation analyzing method for a semiconductor integrated circuit device of the present invention, in the above method, the linearing step includes the step of forming linear information by linearing the voltage waveform in the unit window by a method of least squares.

Also, in the operation analyzing method for a semiconductor integrated circuit device of the present invention, in the above method, the predetermined unit window is set to a maximum value of delay times of all instances.

In this method, the voltage waveform is not divided into time intervals, but the unit window is set to a maximum value of delay times of all instances and the inside is modeled by PWL or the like. According to this configuration, the more appropriate analysis can be carried out by using a minimum amount of data.

In this case, the unit window is not limited to the maximum value of delay times, and the voltage waveform may be partitioned in response to the operation time of the cell, or the like. For example, the unit window may be decided previously as almost $\frac{1}{10}$ to $\frac{1}{50}$ of the operation period of the cell.

According to this method, since the voltage value is constant in the unit window used in the delay calculation, a change in the voltage should not be considered upon executing the delay calculation. Therefore, the static timing analysis (STA) being employed currently can be applied as it is.

Also, in the operation analyzing method for a semiconductor integrated circuit device of the present invention, in the above method, the step of forming the voltage abstraction information includes the step of forming stepwise information by picking up a maximum value in the unit window from the linear information if an absolute vale of a gradient of the linear information in the unit window is larger than 1 and picking up a minimum value in the unit window if the absolute vale of the gradient is smaller than 1.

According to this method, since the voltage value is constant in the unit window used in the delay calculation, a change in the voltage should not be considered upon executing the delay calculation. Therefore, according to this method, the static timing analysis (STA) being employed currently can also be applied as it is.

Also, in the operation analyzing method for a semiconductor integrated circuit device of the present invention, in the above method, the step of calculating the delay value includes the steps of calculating transition times of an input signal and an output signal of the instance from the circuit information, extracting the unit window through which the input signal and the output signal are translated based on the transition times calculated in the calculating step, deciding whether or not the output signal is translated through the unit window, based on the extracted unit window, and calculating the delay value based on a decision result in the deciding step. In this case, the step of extracting the unit window can be attained by extracting the unit window from the abstraction information based on the transition time, and also attained by calculating the delay value from the circuit information based on the decision result in the deciding step.

Also, in the operation analyzing method for a semiconductor integrated circuit device of the present invention, in the above method, the step of calculating the delay value is the step of employing a steady voltage in delay calculation as a voltage obtained after a voltage drop in the unit window when it is decided in the deciding step that the output signal does not translate over unit windows and a delay time of the instance is smaller than the unit window.

According to this method, the voltage in the unit window can be made constant. Therefore, even if the conventional delay calculation approach such as STA, or the like is employed in the period as it is, a high-precision calculation can be executed.

Also, in the operation analyzing method for a semiconductor integrated circuit device of the present invention, in the above method, the step of calculating the delay value is the step of employing a value calculated with regard to voltage values in both translated unit windows calculation as a voltage obtained after a voltage drop in the unit window when a delay time of the instance is larger than the unit window.

According to this method, the voltage in the unit window can be made constant. Therefore, even if the conventional delay calculation approach such as STA, or the like is employed in the period as it is, a high-precision calculation can be executed. Also, the processing can be attained at a higher speed by modeling the waveform.

Also, in the operation analyzing method for a semiconductor integrated circuit device of the present invention, in the above method, the step of calculating the delay value is the step of calculating the delay value by modeling the instance in terms of the instance and a wiring network by which the instance is driven when a delay time of the instance is larger than the unit window.

Also, in the operation analyzing method for a semiconductor integrated circuit device of the present invention, in the above method, the step of calculating the delay value is the step of calculating an mean value of power-supply voltages (voltage waveform) in translated unit windows and calculating the delay value based on the mean value when it is decided in the deciding step that the output signal translates over unit windows and input/output signals of the instance translate within the unit window.

According to this method, since there is no necessity to calculate the delay by using the translated stepwise voltage waveform, simplification of the delay calculation can be achieved.

Also, in the operation analyzing method for a semiconductor integrated circuit device of the present invention, in the above method, the step of calculating the delay value is the step of calculating a weighted mean value of power-supply voltages based on translated positions in translated unit windows and calculating the delay value based on the weighted mean value when it is decided in the deciding step that the output signal translates over unit windows and input/output signals of the instance translate within the unit window.

Also, in the operation analyzing method for a semiconductor integrated circuit device of the present invention, in the above method, the step of calculating the delay value includes the step of expanding a voltage considering period of the instance up to a threshold voltage of an input signal waveform of the instance when it is decided in the deciding step that the output signal translates over unit windows.

According to this method, because the voltage considering period is expanded, the power-supply voltage by which the transistor is operated can be reflected exactly in the delay time.

Also, in the operation analyzing method for a semiconductor integrated circuit device of the present invention, in the above method, the step of calculating the delay value includes the step of calculating a power-supply voltage in delay calculation from a voltage drop value obtained until an input signal waveform of the instance comes up to a delay measuring threshold voltage when it is decided in the deciding step that the output signal translates over unit windows.

Also, in the operation analyzing method for a semiconductor integrated circuit device of the present invention, in the above method, the library is constructed by combinations of plural times and plural voltages in each cell or each macro consisting of the assembly of cells.

Also, in the operation analyzing method for a semiconductor integrated circuit device of the present invention, in the above method, a longest interval of the plural times is equal to a width of the unit window.

Also, in the operation analyzing method for a semiconductor integrated circuit device of the present invention, in the above method, upon binarizing the voltage, the abstracting step decides the voltage depending on whether or not a value of the voltage waveform at each time is larger than an intermediate point.

Also, in the operation analyzing method for a semiconductor integrated circuit device of the present invention, in the above method, the step of forming the abstraction information divides the semiconductor integrated circuit into plural areas like a mesh such that instances in each area share same voltage data.

If time-series voltage abstraction information of all instances are held, an amount of memory use is increased. However, according to this configuration, since the instances in the same area share the voltage data, not only reduction in an amount of memory use but also improvement in the operating speed can be achieved.

Also, in the operation analyzing method for a semiconductor integrated circuit device of the present invention, in the above method, the same data is voltage data of a central instance in the area.

According to this configuration, time-series voltage data can be held easily.

Also, in the operation analyzing method for a semiconductor integrated circuit device of the present invention, in the above method, the same data is a mean value of all instances in the area.

According to this configuration, time-series voltage data can be used as representative data in the mesh.

Also, in the operation analyzing method for a semiconductor integrated circuit device of the present invention, in the above method, a time constant of the power-supply wiring is calculated based on parasitic element information of the power-supply wiring, and a same group holds voltage data in common in a certain range of the time constant.

According to this configuration, an amount of data can be compressed to have data values that are closer to actual values.

Also, in the operation analyzing method for a semiconductor integrated circuit device of the present invention, in the above method, the same group holds voltage data in common when a waveform difference of the power-supply voltage in the range is within a predetermined range.

According to this configuration, like the above method, an amount of data can also be compressed to have data values that are closer to actual values.

Also, in the operation analyzing method for a semiconductor integrated circuit device of the present invention, in the above method, (a time constant of the power-supply wiring is calculated based on parasitic element information of the power-supply wiring, and a same group holds voltage data in common in a certain range of the time constant, and then) macros are generated by current waveforms of grouped instance groups and a degenerated power-supply wiring RC circuit, and voltage analysis is executed by using respective macros.

If the voltage analysis is applied to all instances, an amount of memory use and a processing time are increased. However, according to this configuration, since the instances are classified into groups and the voltage values in respective groups are calculated, a processing amount can be reduced and an amount of information can be compressed. Also, reduction in an amount of memory use can be achieved and also improvement in the operating speed can be achieved.

Also, in the operation analyzing method for a semiconductor integrated circuit device of the present invention, in the above method, the analyzing step includes the step of calculating the voltage waveform of each circuit element in the semiconductor integrated circuit, and the calculating step of calculating the delay value of the circuit element based on the voltage waveform of each circuit element at the power-supply terminal.

Also, in the operation analyzing method for a semiconductor integrated circuit device of the present invention, in the above method, the step of calculating the delay value includes the step of detecting a voltage drop value at a time when an object cell operates lastly in a timing window, and the step of calculating the delay value based on a detected value, in a calculation to detect a maximum delay time.

In the related art, the delay time is calculated based on the maximum voltage drop amount of the concerned cell. Therefore, since the delay time is calculated based on the voltage drop amount at a time at which actually there is a possibility to cause no timing error, the excessively pessimistic analyzed result is brought about. For this reason, in the method of the present invention, an operation timing is calculated and then a timing calculation is executed by utilizing the drop value at a time when the object cell operates lastly in the window. According to this method, since the delay time at the operation time at which actually there is a possibility to cause the error can be utilized by calculating the voltage drop amount with regard to the timing, the pessimism can be reduced.

Also, in the operation analyzing method for a semiconductor integrated circuit device of the present invention, in the above method, the step of calculating the delay value includes the step of detecting a voltage drop value at a time when an object cell operates first in a timing window, and the step of calculating the delay value based on a detected value, in a calculation to detect a minimum delay time.

Also, in the operation analyzing method for a semiconductor integrated circuit device of the present invention, in the above method, the step of calculating the delay value includes the step of extracting a cell that drives a clock, and the step of calculating selectively only the delay value of the cell that drives the clock. In the related art, the hold delay constraint verification to take account of the voltage variation is not carried out, and the voltage drop of all cells is verified by using the voltage drop value based on the voltage drop value at a certain time point. However, according to this configuration, because the number of calculated objects can be reduced, a time required for the delay calculation can be reduced.

Also, in the operation analyzing method for a semiconductor integrated circuit device of the present invention, in the above method, the step of calculating the delay value executes the delay calculation of respective combinations of time relationships in timing windows based on the voltage waveform, in a circuit in which a plurality of timing windows are present.

Also, in the operation analyzing method for a semiconductor integrated circuit device of the present invention, in the above method, the step of calculating the delay value includes the step of calculating the delay value in response to an amount of voltage change in the unit window of the clock domain as the verified object.

In the related art, since the delay value is calculated based on the maximum voltage drop amount and the minimum voltage drop amount of the concerned cell irrespective of the clock period, the delay calculation is executed based on an amount of voltage variation during a time period that extends over a plurality of unit windows. Therefore, a very large clock delay difference (skew) that is not actually caused is generated in the hold time variation, and thus the too pessimistic result is brought about.

According to this method, the excessive pessimism can be eliminated, and the delay analysis can be carried out based on the power-supply variation in response to the actual operation.

Also, in the operation analyzing method for a semiconductor integrated circuit device of the present invention, in the above method, the step of calculating the delay value includes the steps of calculating a rough voltage drop amount, detecting the instance in which the voltage drop amount becomes maximum, and deciding whether or not a timing in a path that reaches the instance has a margin, and also the delay value is not calculated in the instance that has a margin in the voltage drop amount.

In the related art, the delay calculation to take the voltage drop into consideration is applied to all cells. In this case, the instance on the path, which has a margin for the timing slack at the maximum voltage drop amount, does not cause the setup timing error at all at the timing in which the voltage drop amount being smaller than the maximum voltage drop amount is reflected. Therefore, the rough voltage drop amount is calculated to calculate the maximum voltage drop amount prior to the detailed drop amount calculation, and the delay calculation of the instance on the path, which has a margin in a timing slack at the maximum voltage drop amount, based on the detailed drop is not executed.

Accordingly, reduction in an amount of delay calculation can be attained and shortening of a calculation time can be attained.

Also, in the operation analyzing method for a semiconductor integrated circuit device of the present invention, in the above method, the analyzing step includes the steps of calculating voltage waveforms of respective circuit elements in a semiconductor integrated circuit, and calculating delay values of the circuit elements based on the voltage waveforms of respective circuit elements at a power-supply terminal.

Also, an optimizing method of a semiconductor integrated circuit device of the present invention, comprises the steps of reporting an instance that affects a unit window of a cell that is weak in a voltage drop, based on an analyzed result obtained by using the operation analyzing method; and executing an optimization based on the reporting step.

Also, in the optimizing method of a semiconductor integrated circuit device of the present invention, in the above method, the step of executing the optimization includes the step of moving an affecting cell or instance reported in the reporting step.

Also, in the optimization design method of a semiconductor integrated circuit device of the present invention, in the above method, the step of executing the optimization includes the step of inserting a capacitance cell near an affecting cell or instance reported in the reporting step.

Also, if the processing step and the analyzing step are repeated until it is decided in the analyzing step that a timing difference is smaller than a predetermined value, the highly reliable processing can be executed effectively.

The library used in the operation analyzing method for a semiconductor integrated circuit device of the present invention is formed by combinations of plural times and plural voltages, and their delay values. The delay value calculating method calculates the delay value that corresponds to the voltage abstraction information formed in the abstracting step, be referring to this library.

According to this configuration, the delay value can be obtained in the state close to the actual operation merely by referring to the library without actual calculation.

Here, the library using the voltages detected at two time points or more can be employed. In this case, if data detected at three time points of a start point, an end point, and an intermediate point of the unit window, for example, are employed, the data at the intermediate point may be decided as the start point data or the end point data depending upon whether or not the voltage waveform of the voltage waveform information is upper, i.e., larger than the voltage of the voltage waveform information at the intermediate point in the abstracting step.

BRIEF DESCRIPTION OF THE DRAWINGS

In the accompanying drawings:

FIG. 43 is an explanatory view showing the method of the seventeenth embodiment of the present invention;

DETAILED DESCRIPTION OF THE PREFERRED EMBODIMENTS

An operation analyzing method according to the present invention will be explained in detail with reference to the drawings hereinafter.

First Embodiment

Figure 1:
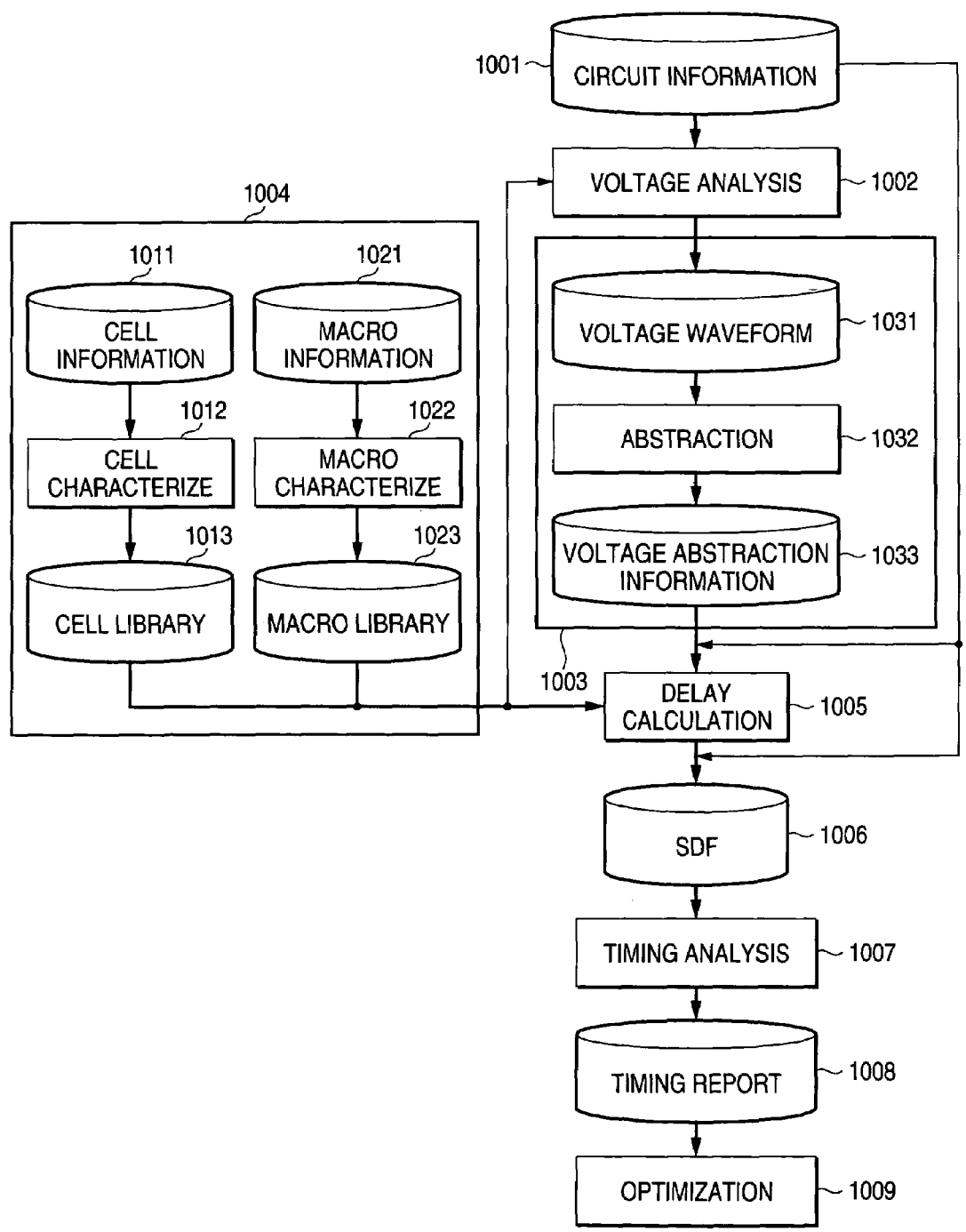
FIG. 1 is a view showing a first embodiment of the present invention.

FIG. 1 is a view showing the principle of operation analyzing procedures in the present embodiment.

Figure 56:
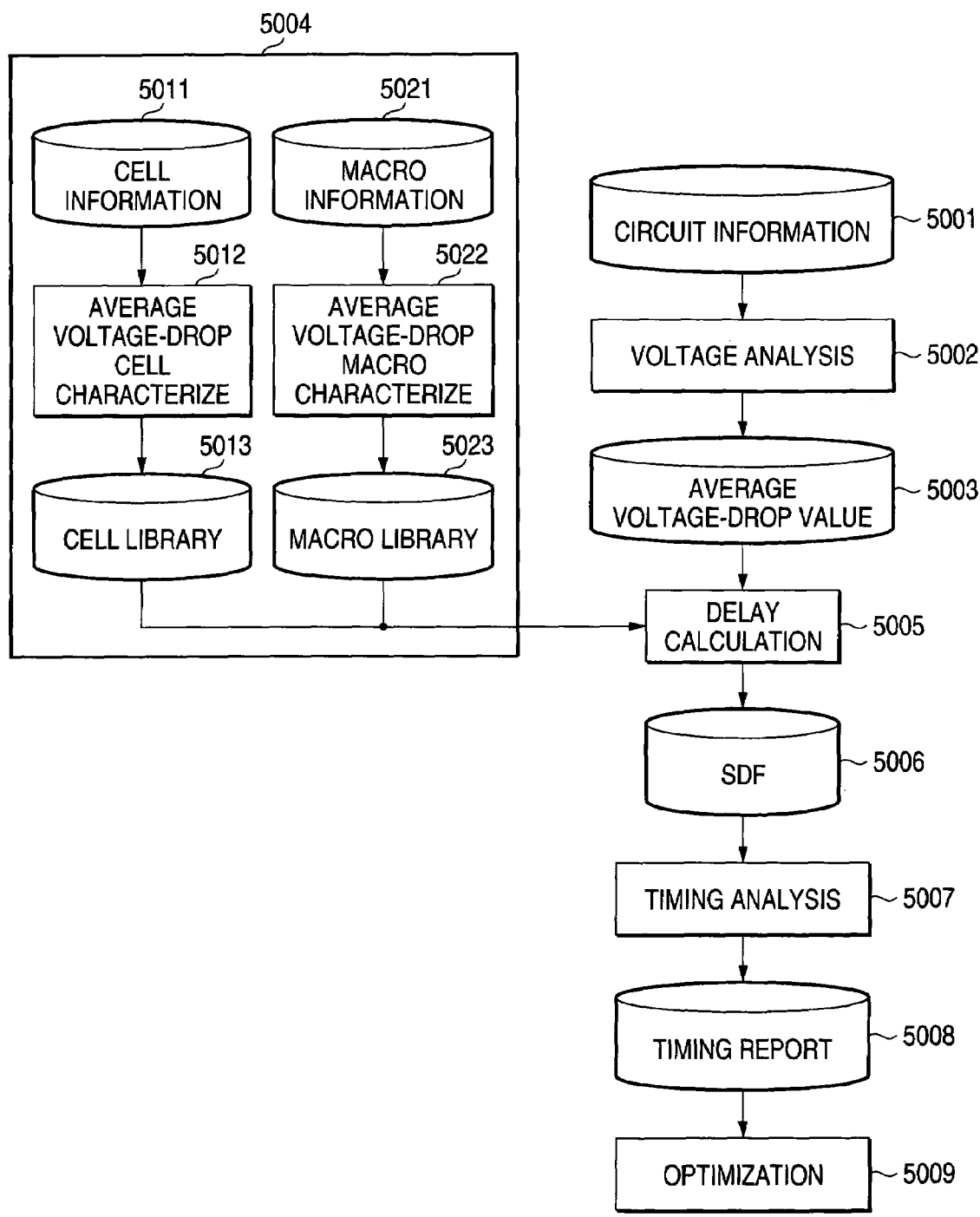
FIG. 56 is an explanatory view showing a method in the related art.

As shown in FIG. 1, an operation analyzing method of this embodiment of the present invention is characterized in that, in place of the step 2003 of calculating the average voltage-drop value in the analysis method shown in FIG. 56, a dynamic voltage of each instance is analyzed (1002) from circuit information 1001 to form a voltage waveform, and then a delay calculation is executed based on voltage abstraction information 1033 derived by abstracting this voltage waveform. Also, a library 1004 that is referred to in the delay calculation is abstracted into an average voltage-drop cell library or an average voltage-drop macro. The present embodiment is characterized in that a library prepared by using an abstracting method that can maintain a dynamic feature instead of the mean value is employed. Others are similar to those in above FIG. 56. In addition, in a voltage analyzing step 1002, the cell or the macro having the average current value and the average wiring RC circuit of grouped instance groups may be generated, and then the voltage analysis may be executed by using respective macros (this will be described later). Here, for example, the "grouping" is implemented by calculating time constants of power-supply wirings based on parasitic element information of the power-supply wirings and then classifying the instances within a range of predetermined time constants into the same groups to share voltage data.

More particularly, according to this method, as a schematic view is shown in FIG. 1, a voltage analyzing means 1002 for calculating a voltage waveform of each instance of the semiconductor integrated circuit at the power-supply terminal from the circuit information 1001 and then analyzing the voltage every instance to form a voltage waveform 1031, a voltage abstracting means 1003 for abstracting the voltage waveform 1031 to form the voltage abstraction information 1033, and a delay value calculating means 1005 for calculating the delay value based on the voltage abstraction information 1033 by referring to the library 1004 are included.

Subsequent steps are similar to those in the operation analyzing method shown in FIG. 56 in the related art.

Then, this delay value is formed in the standard delay format (SDF) 1006, then a timing analyzing means 1007 executes a timing analysis by using this value to output the result analyzed by the timing analyzing means 1007 as a timing report 1008, and then an optimizing means 1009 makes a change in design based on the analyzed result to optimize the timing.

Here, the library 1004 includes a cell library 1013 for storing delay value information every cell, and a macro library 1023 for storing delay value information every so-called macro that the assembly of cells is regarded as one lump. Then, a voltage drop is calculated based on an operating current in operations of all cells from cell information 1011, then this calculated value is abstracted (characterized), and then this characterized value is stored in the cell library 1013. In contrast, a voltage drop is calculated based on a current in operations of all macros from macro information 1021, then this calculated value is characterized (1022), and then this characterized value is stored in the macro library 1023. This abstracting method will be described later.

Next, a method of forming the voltage waveform from the circuit information by the voltage analysis will be explained hereunder.

Figure 2:
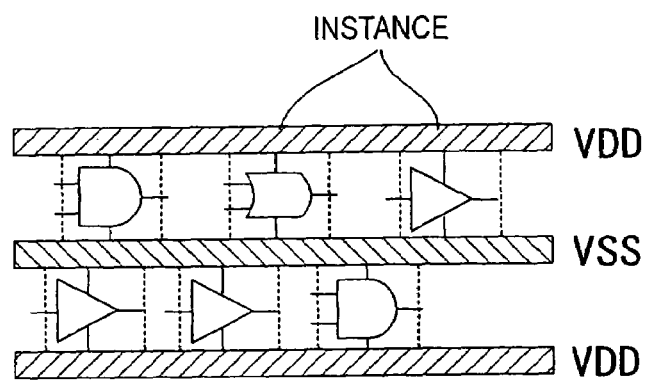
FIG. 2 is a view showing a pertinent portion of an LSI chip as an analyzed object in the first embodiment of the present invention.

First, suppose the circuit that includes a plurality of instances show in FIG. 2, for example, from the circuit information of a chip to be analyzed. Then, voltage waveforms of respective instances are formed from power-supply terminal information. As can be seen from FIG. 2, the cells are arranged to align, and respective instances in areas in which the cells are aligned are connected to power supplies ($V_{SS}$, $V_{DD}$).

Figure 3:
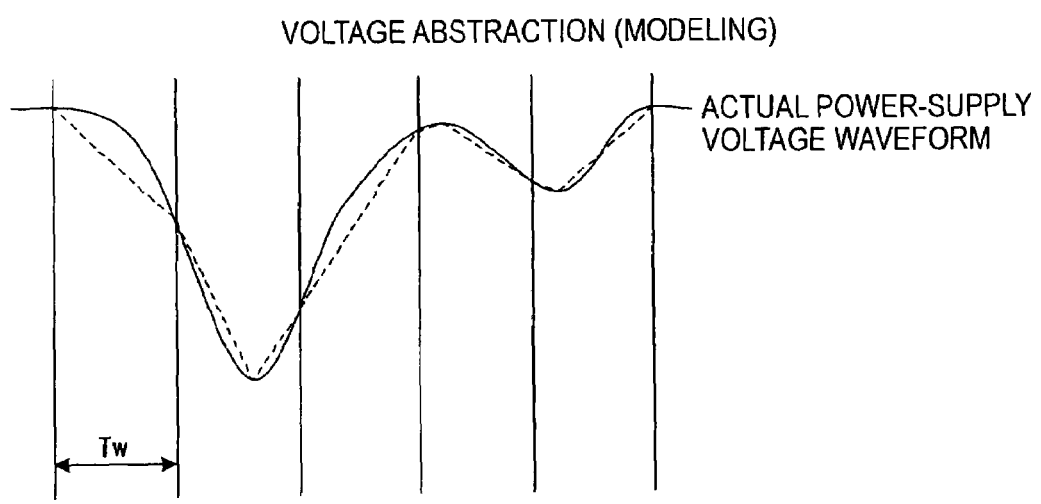
FIG. 3 is an explanatory view showing abstraction of a voltage in the first embodiment of the present invention.

FIG. 3 is an explanatory view showing the abstraction of the voltage. Assume that this voltage waveform is formed as indicated by a solid line in FIG. 3. A time interval is decided based on a cell active time, and this is set as a unit window Tw. This time interval is decided to 1/10 to 1/50 of an operation period, for example. It is desired that delay calculations should be carried out based on an ideal power supply and also the largest delay time among them should be used.

Then, the voltage is linearized as indicated by a broken line by connecting a start point to an end point in the unit window, for example, and thus abstracted (modeled) by the PWL (Pierce-Wise Linear) system. This modeled information can be used as the voltage abstracting information 1033 as it is.

Figure 4:
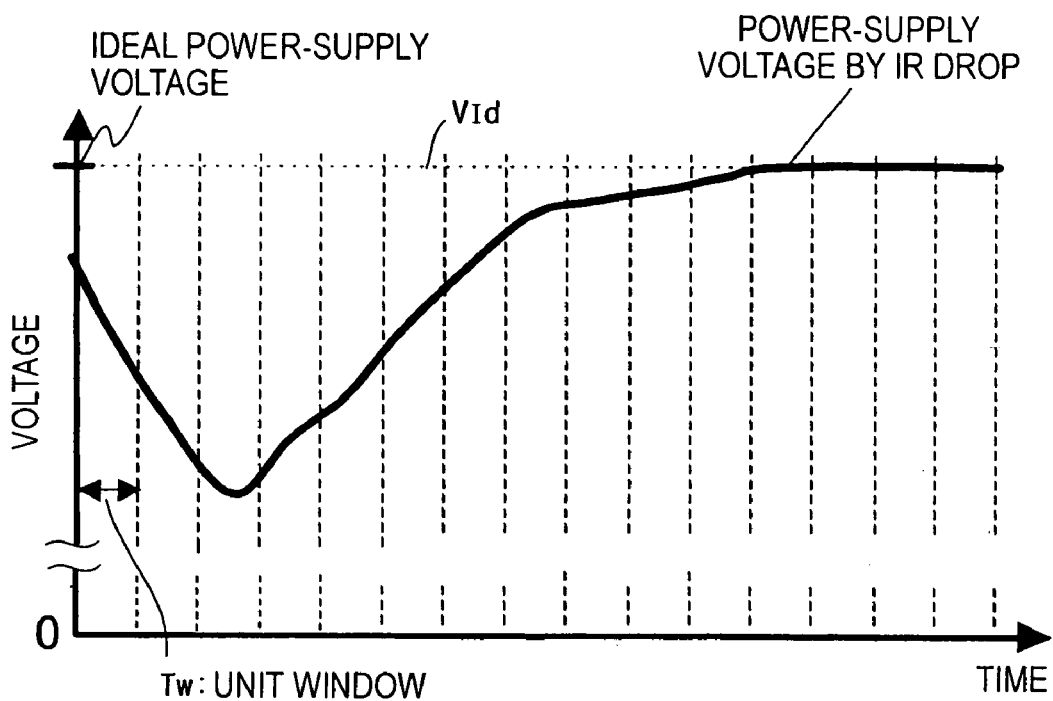
FIG. 4 is an explanatory view showing an abstracting step of the voltage in the first embodiment of the present invention.

Assume that a power-supply voltage waveform curve a obtained from the resultant circuit information 1001 by the voltage analyzing step 1002 is given as shown in FIG. 4. In FIG. 4, Vid denotes an ideal power-supply voltage, and this power-supply voltage curve a corresponds to the power-supply voltage that is dropped by the voltage drop (IR drop).

Figure 5:
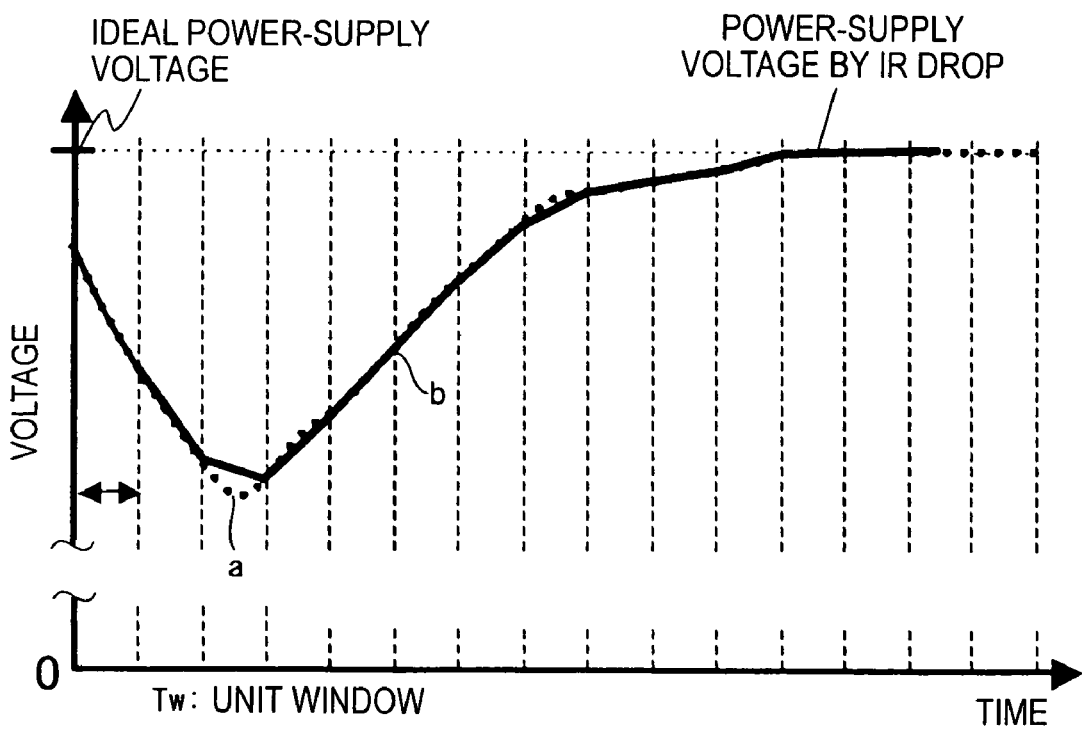
FIG. 5 is an explanatory view showing another abstracting step of the voltage in the first embodiment of the present invention.

As shown in FIG. 5, this information is partitioned by the unit window Tw. Like the model in FIG. 3, the voltage is linearized by connecting a start point to an end point in the unit window, and thus abstracted as indicated by a straight line b in FIG. 5. This modeled information corresponds to the voltage abstraction information 1033.

Also, although described later, the delay value and the power consumption may be calculated based on the abstracted information, and then these information may be stored in the macro library 1023 and may be used the macro information. If this operation is applied to the cell, the cell library 1013 may be formed similarly.

Then, the delay value corresponding to the voltage abstraction information 1032 in the macro is picked up by referring to the library 1004 based on the voltage abstraction information 1032 (delay calculating step 1005), then this delay value is stored in the SDF 1006, and then an estimation of the timing as well as an analysis of the timing error is carried out by executing the timing analyzing step 1007 based on this value to output the timing report 1008 and thus optimize the timing.

In this method, since the voltage waveform information of all instances is obtained and then this voltage waveform information is abstracted, the high-efficiency and high-accuracy analysis can be achieved.

In this case, it can be selected appropriately whether or not the analysis of all instances should be executed based on the voltage waveform information. If the voltage waveform information are classified into groups and the information are held commonly in the same group, data compression can be implemented.

Also, according to this configuration, since the delay value is read from the library 1004 in pursuant to the voltage abstraction information that are abstracted, deterioration in the characteristics can be prevented and also reduction in an amount of data can be achieved.

In this manner, since the cell library 1013 in which the cell information 1011 being abstracted in the abstracting step (1012) are stored and the macro library 1023 in which the macro information 1021 being abstracted in the abstracting step (1022) are stored are contained, it is possible to achieve reduction in an amount of data.

In the first embodiment, the actual power-supply voltage waveform is partitioned by a predetermined unit window, and is linearized by connecting the start point to the end point in the unit window to form linear information. In this case, the power-supply voltage waveform may be linearized by using the method of least squares.

Here, the unit window has a predetermined interval in response to the operating time of the cell. In this case, if this interval is selected appropriately, the good modeling of data can be implemented.

Second Embodiment

Next, a method of forming the abstract information will be explained as a second embodiment of the present invention hereunder.

In the first embodiment, the voltage waveform information are linearized. In this case, since a change of the voltage is generated in the unit window, it is difficult to execute the delay calculation. Therefore, in this example, the voltage is set to have a constant value in the unit window.

Figure 6:
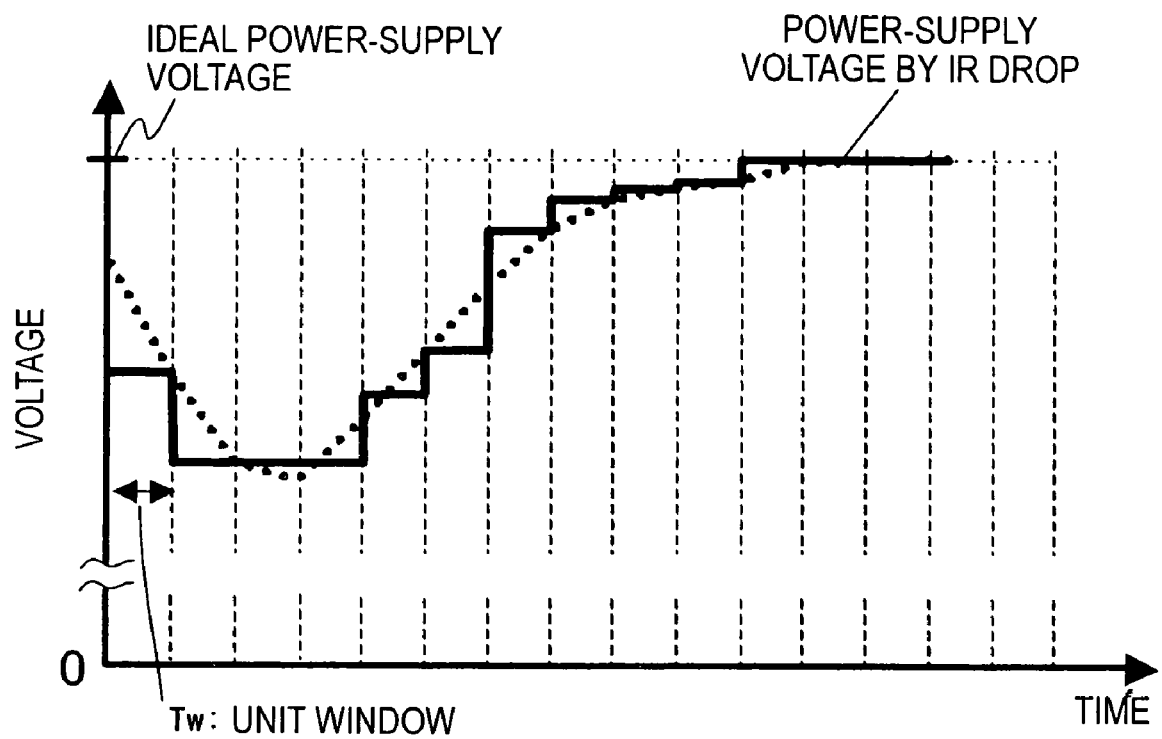
FIG. 6 is an explanatory view showing an abstracting step of a voltage in a second embodiment of the present invention.

In the step of forming the abstracted information as shown in FIG. 6 (1003 in FIG. 1), a maximum value in the unit window is picked up from the linear information obtained as shown in FIG. 5 in the first embodiment if an absolute value of a gradient of the linear information is larger than 1 whereas a minimum value in the unit window is picked up from the linear information if an absolute value of a gradient is smaller than 1, and then a stepwise information is formed as indicated by a straight line c.

As a result, the delay value can be picked up from the information in the library 1004 based on this voltage value without consideration of a change of voltage, and also the timing analysis can be carried out like the first embodiment.

According to this method, the voltage value can be kept constant in the unit window used in the delay calculation. Therefore, the delay calculation can be carried out not to take a change of voltage into consideration and also a delay calculation approach such as STA, or the like, which is employed at present, can be applied as it is.

Third Embodiment

Figure 7:
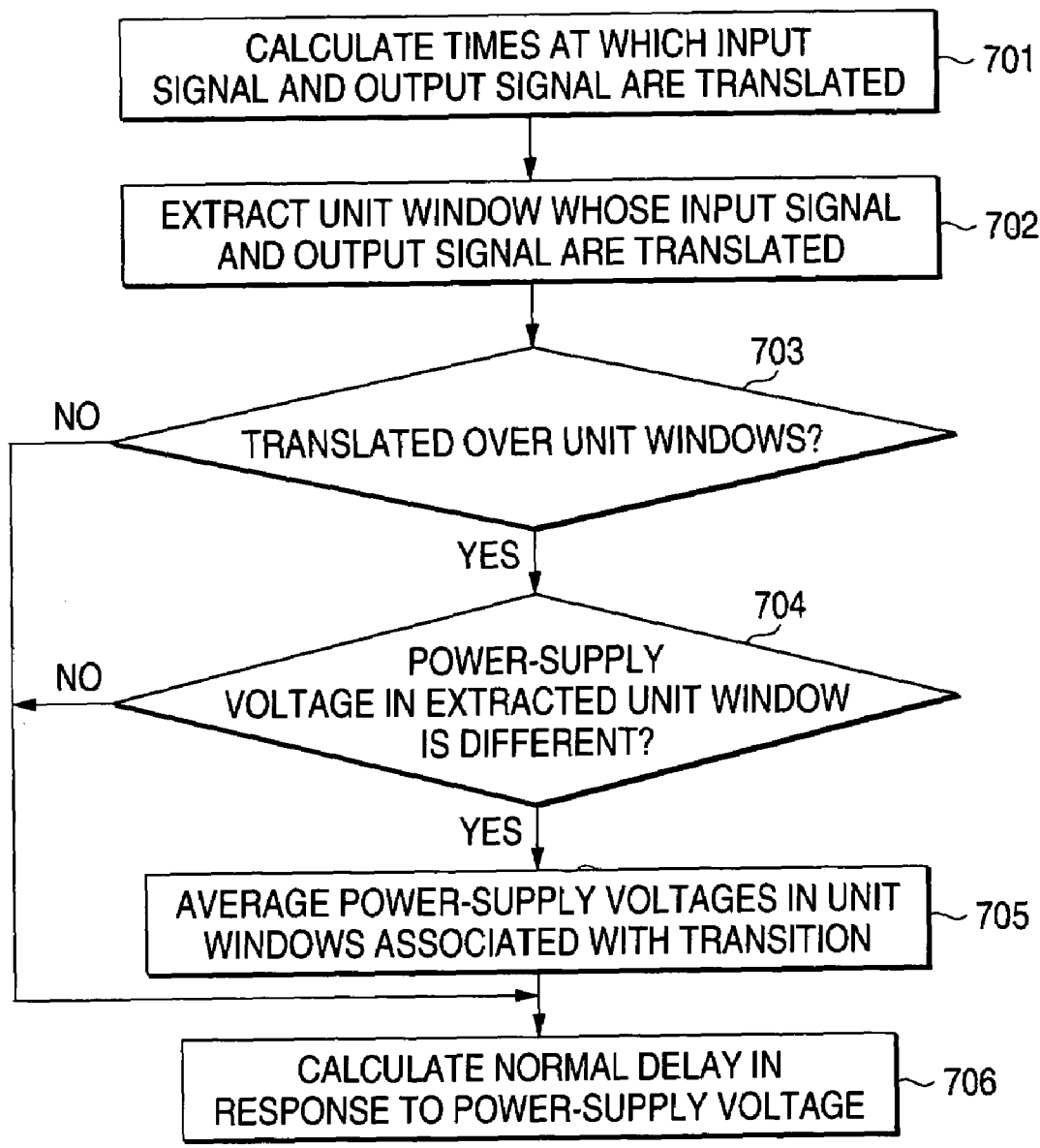
FIG. 7 is a flowchart showing a method of a third embodiment of the present invention.

Next, a method of accelerating a delay calculation in third embodiment of the present invention will be explained hereunder. In this example, as shown in a flowchart of FIG. 7, transition times of an input signal and an output signal of the concerned cell are calculated from the circuit information to be watched, for example (calculation step 701). Then, unit windows whose input signal and output signal are translated are extracted from the abstracted information based on the transition times calculated in the calculation step 701 (extraction step 702).

Then, it is decided based on the extracted unit window whether or not the output signal is translated over the unit windows (decision step 703).

Then, if it is not decided in decision step 703 that the output signal is translated over the unit windows, the delay calculation is executed by using the previously formed library in response to the power-supply voltage (step 706).

In contrast, if it is decided in decision step 703 that the output signal is translated over the unit windows, it is decided whether or not the power-supply voltage in the extracted unit window is different (decision step 704). Then, if it is not decided that the power-supply voltages are different, the normal delay calculation is executed in response to the power-supply voltage like the above (step 706).

Figure 8:
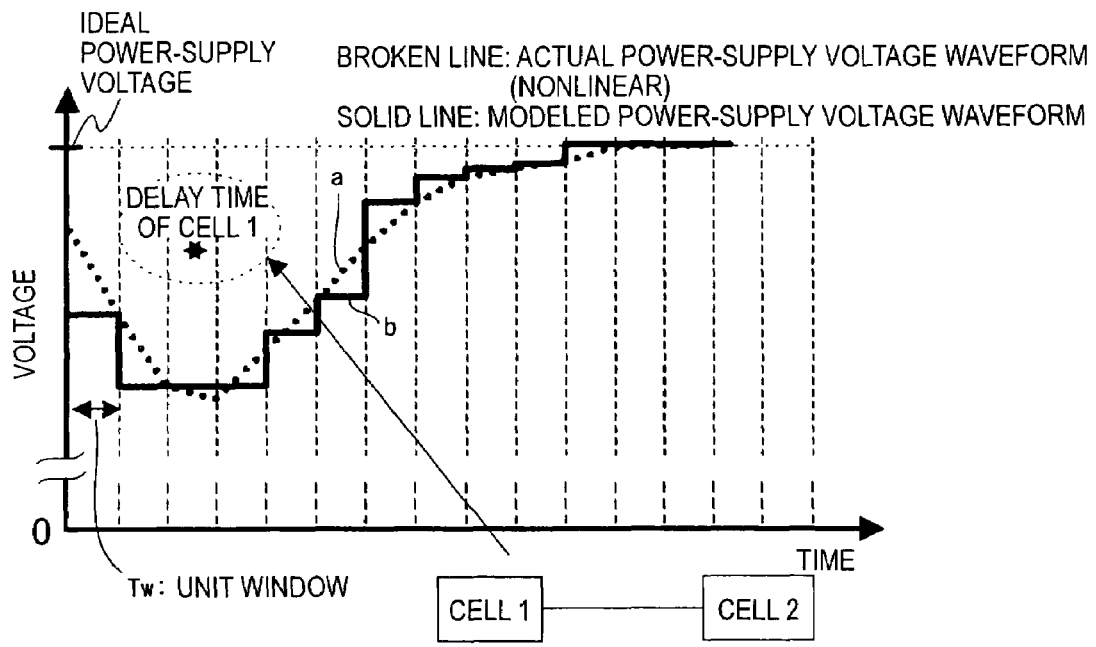
FIG. 8 is an explanatory view showing a voltage waveform in the method of the third embodiment of the present invention.

FIG. 8 is a view showing the abstracted voltage waveform if it is not decided that the power-supply voltage is different. In FIG. 8, a curve a is actual power-supply voltage waveform information and a curve b is a modeled power-supply voltage waveform. If it is not decided in decision step 703 that the output signal is translated over the unit windows and also the delay time of the concerned cell is smaller than a width of the unit window, the normal voltage at the time of calculation of delay is set to the voltage of the unit window after the voltage drop.

Figure 9:
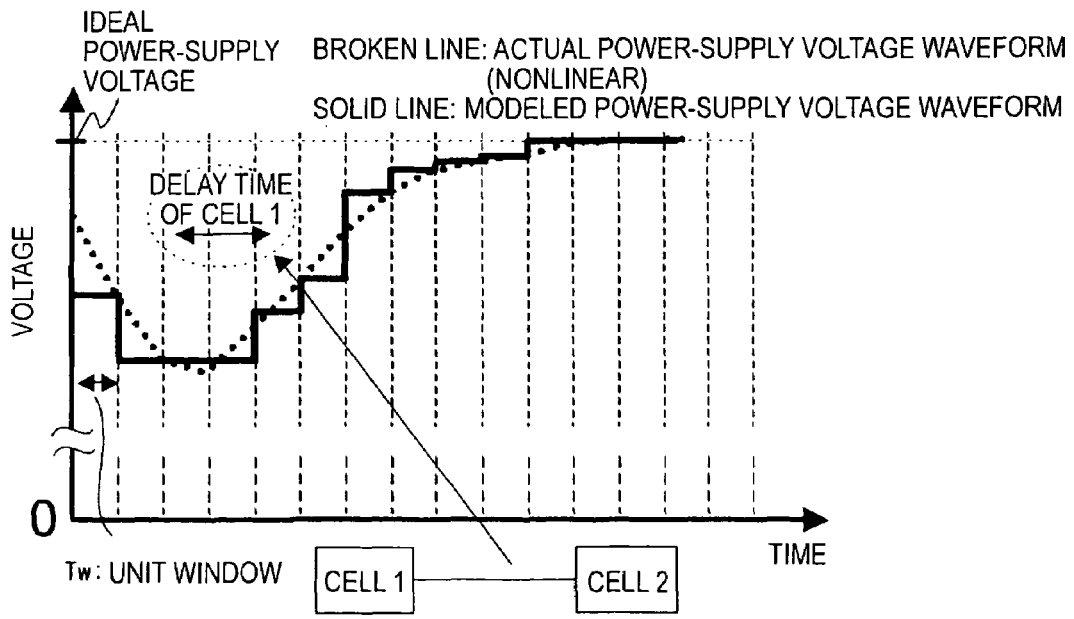
FIG. 9 is an explanatory view showing another voltage waveform in the method of the third embodiment of the present invention.

Then, as shown in FIG. 9, if it is not decided in decision step 703 that the output signal is translated over the unit windows and also the delay time of the concerned cell is larger than the width of the unit window, a following process is executed.

Figure 10:
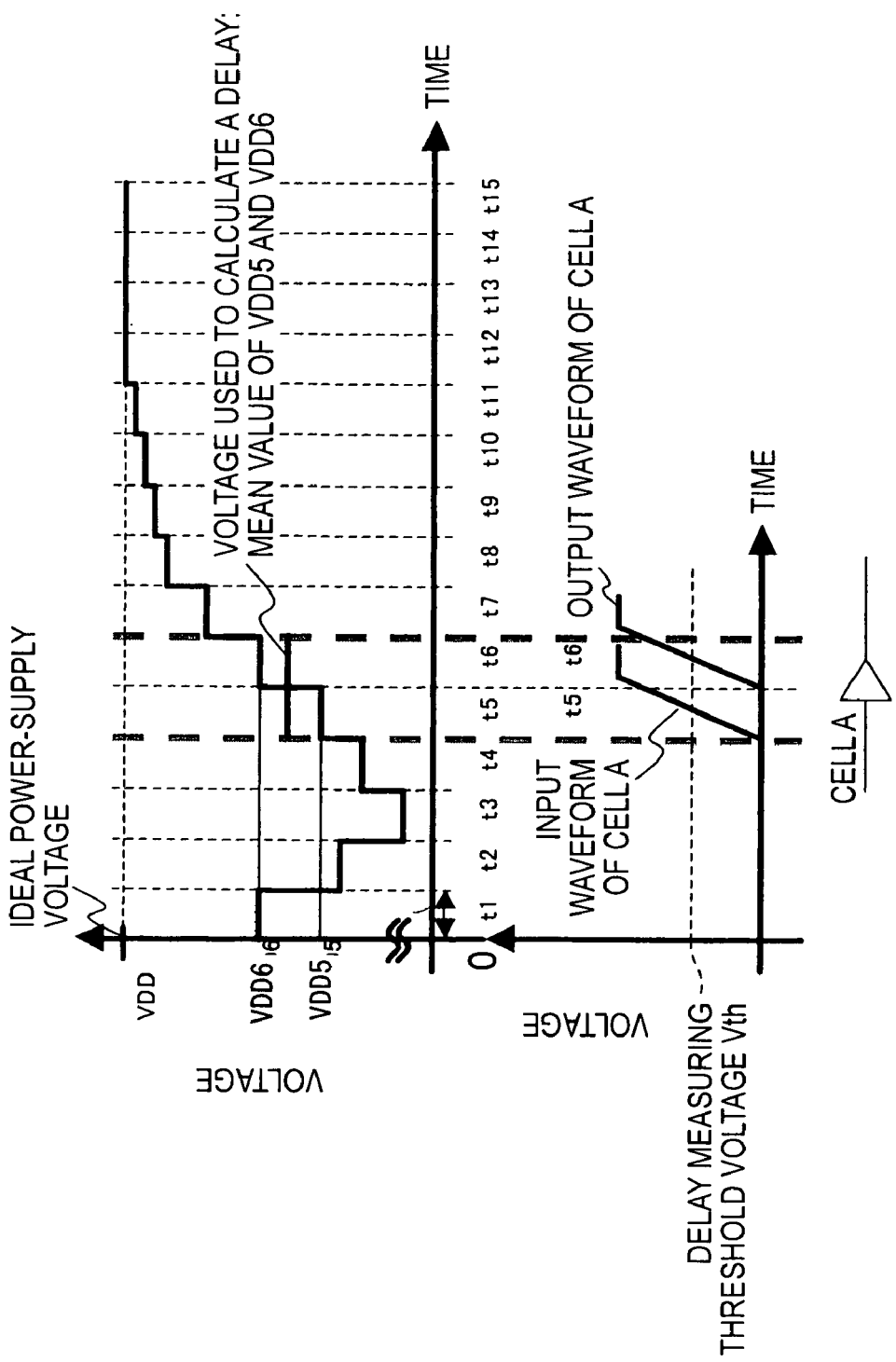
FIG. 10 is an explanatory view showing the method of the third embodiment of the present invention.

For example, if it is decided in decision step 704 that the power-supply voltage in the extracted unit window is different, the power-supply voltages in the unit windows associated with the transition are averaged (705), as shown in FIG. 10, and the delay value is calculated based on this value (this calculation method is set forth in Proc. IEEE Int. Conf. Computer Aided Design, pp. 512–515, 1989, 11, for example).

In this case, since the calculation using the stepwise power-supply voltage waveform is not needed, simplification of the delay calculation can be attained and also reduction in an amount of computation can be achieved.

Further, if the delay time of the concerned cell is larger than the width of the unit window in a state of the ideal power supply in which no voltage drop is generated, the modeling of the wiring network is carried out such that a behavior at an output driving point of the cell becomes identical.

Figure 11:
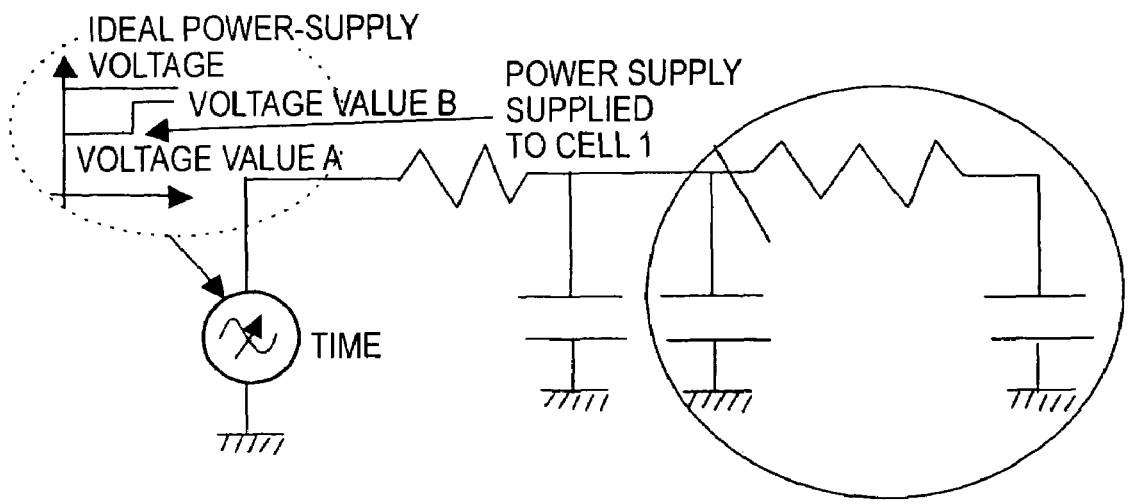
FIG. 11 is an explanatory view showing the method of the third embodiment of the present invention.
Figure 11:
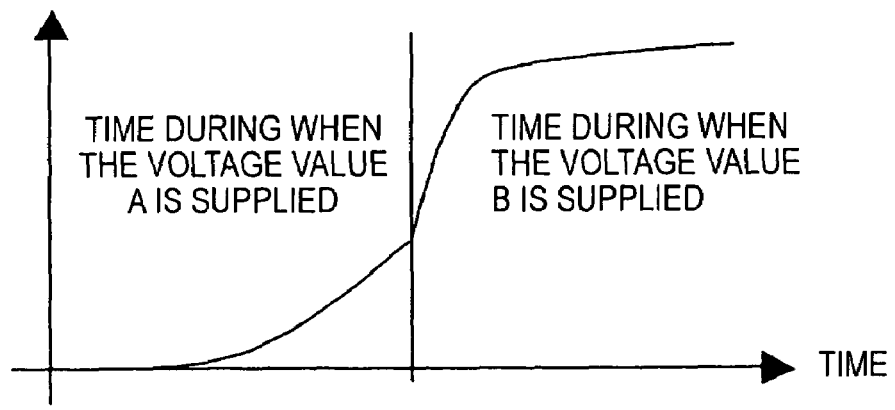

This state is shown in FIG. 11. As shown in FIG. 11A, the cell 1 is modeled by voltage source, internal resistor, and capacitors based on the cell 1 and the wiring network that cell 1 drives, and the wiring network is degenerated by any algorithm. For example, the method set forth in Modeling the Driving-point Characteristic of Resistive Interconnect for Accurate Delay Estimation (Peter R. O'brien and Thomas L. Savarino: 1989 IEEE) may be employed as the degeneration method.

Then, the output signal waveform of the cell is calculated by dividing the voltage source into a plurality of areas, as shown in FIG. 11A, and then solving the circuit equation every area in which the voltage source is constant.

The output signal waveform of the cell 1 has a singular point at a point at which the voltage is changed, as shown in FIG. 11B. In this case, since a continuous waveform is given at this point, a delay calculation at a gate level may be executed as it is.

Fourth Embodiment

Figure 12:
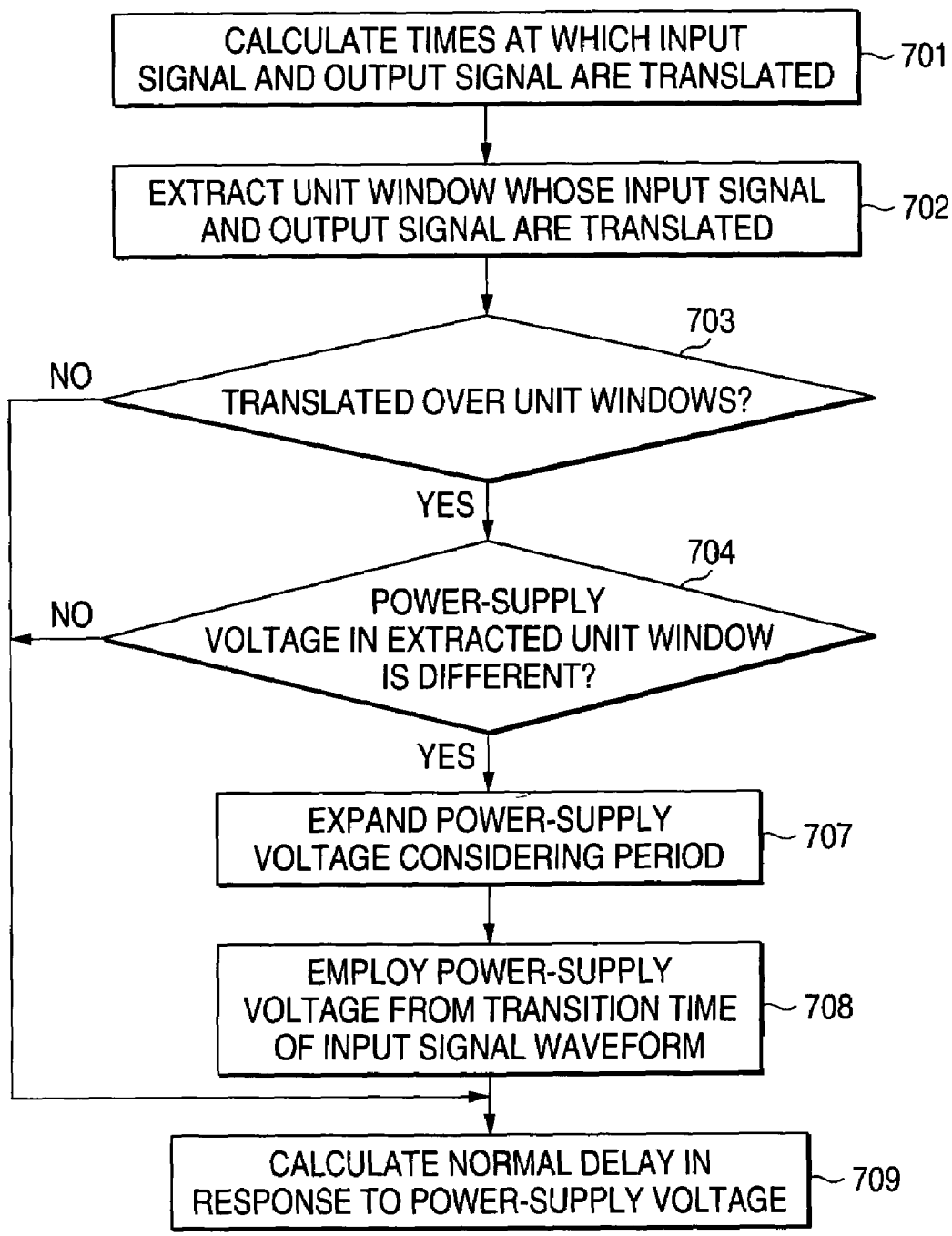
FIG. 12 is a flowchart showing a method of a fourth embodiment of the present invention.

Next, a method of accelerating the delay calculation of a fourth embodiment of the present invention will be explained hereunder. In the third embodiment, the unit window is fixed. In this example, the modeling is executed by enlarging the unit window. In this example, as a flowchart is shown in FIG. 12, like the third embodiment shown in FIG. 7, transition times of the input signal and the output signal are calculated from the watched circuit information (calculation step 701). Then, the unit window containing the transition times is extracted from the abstracted information (extraction step 702). Then, if it is decide in decision step 703 that the output signal is translated over the timing windows and it is decide in decision step 704 that the power-supply voltage in the extracted unit window is different, the power-supply voltages in the unit windows associated with the transition are averaged in the third embodiment. On the contrary, in this example, an expansion of the power-supply voltage considering period is executed (step 707), then the power-supply voltage is employed based on the transition time of the input signal waveform (step 708), and then the normal delay calculation in response to the power-supply voltage is carried out (step 709).

Figure 13:
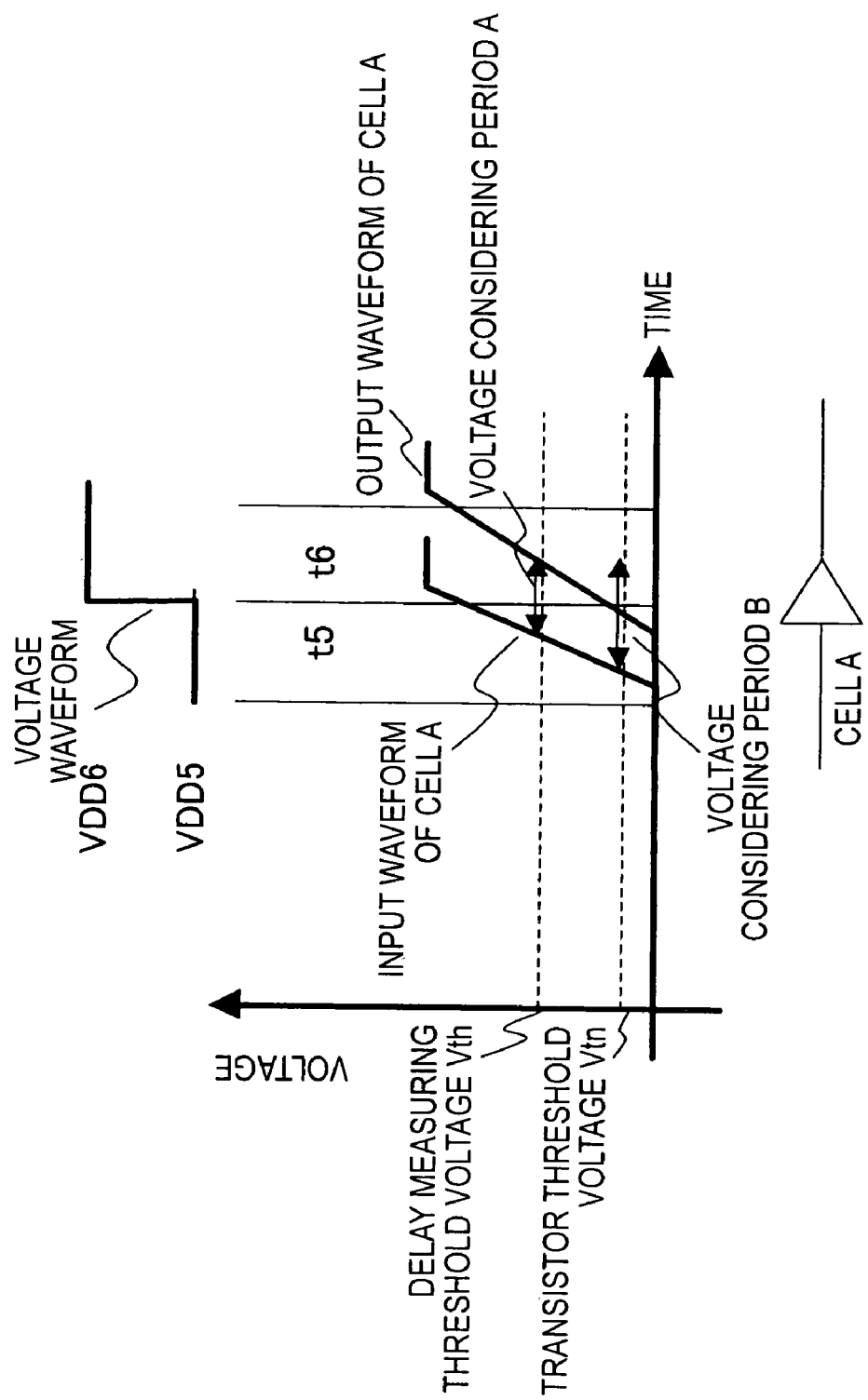
FIG. 13 is an explanatory view showing the method of the fourth embodiment of the present invention.

FIG. 13 is a view showing the expansion of the power-supply voltage considering period. If input/output signals of the cell are translated over the unit windows, the voltage considering period is expanded up to a transistor threshold voltage Vtn of the input signal waveform. Here, in the related art, while considering the operation of the actual transistor in the power-supply voltage expanding step, the voltage considering period is set from the time point at which the input waveform of the cell A exceeds a delay measuring threshold voltage to the time point at which the input waveform of the cell B exceeds the transistor threshold voltage. In contrast, in this example, the voltage considering period is set from the time point at which the input waveform of the cell A exceeds the transistor threshold voltage to the time point at which the input waveform of the cell B exceeds the transistor threshold voltage.

Accordingly, the power-supply voltage at which the transistor is operated can be reflected exactly in the delay time.

Figure 14:
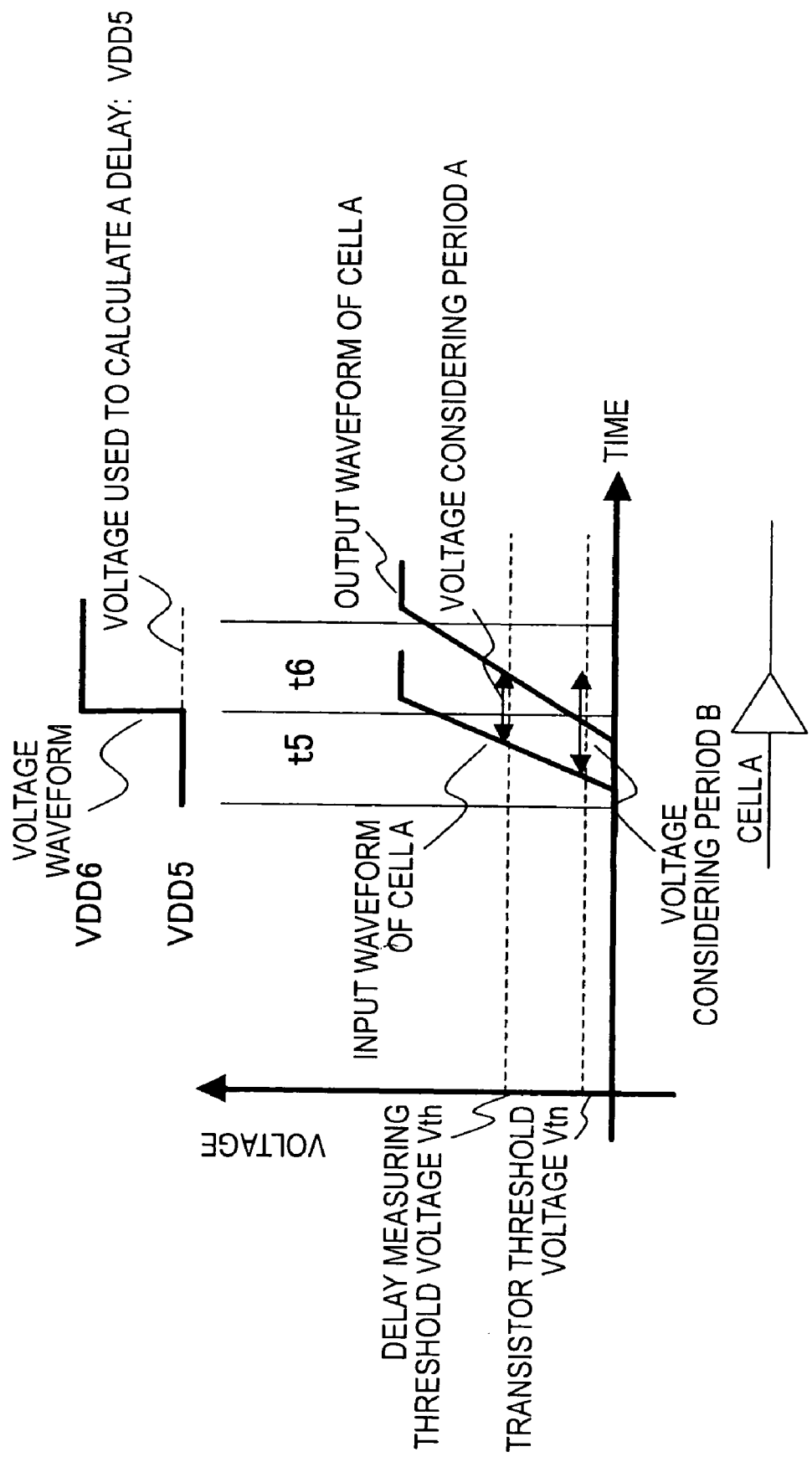
FIG. 14 is an explanatory view showing the method of the third embodiment of the present invention.

Also, as shown in FIG. 14, the power-supply voltage applied to calculate the delay is calculated from the voltage drop value generated in a time required until the input signal waveform reaches the delay measuring threshold voltage from the transistor threshold voltage.

As a result, since the calculation using the stepwise power-supply voltage waveform is not needed, simplification of the delay calculation can be achieved and reduction in an amount of computation can be attained.

Fifth Embodiment

Next, data compression in the step of forming the abstract information indicated by 1003 in FIG. 1 to reduce an amount of memory use and improve the operating speed will be explained hereunder.

Figure 15:
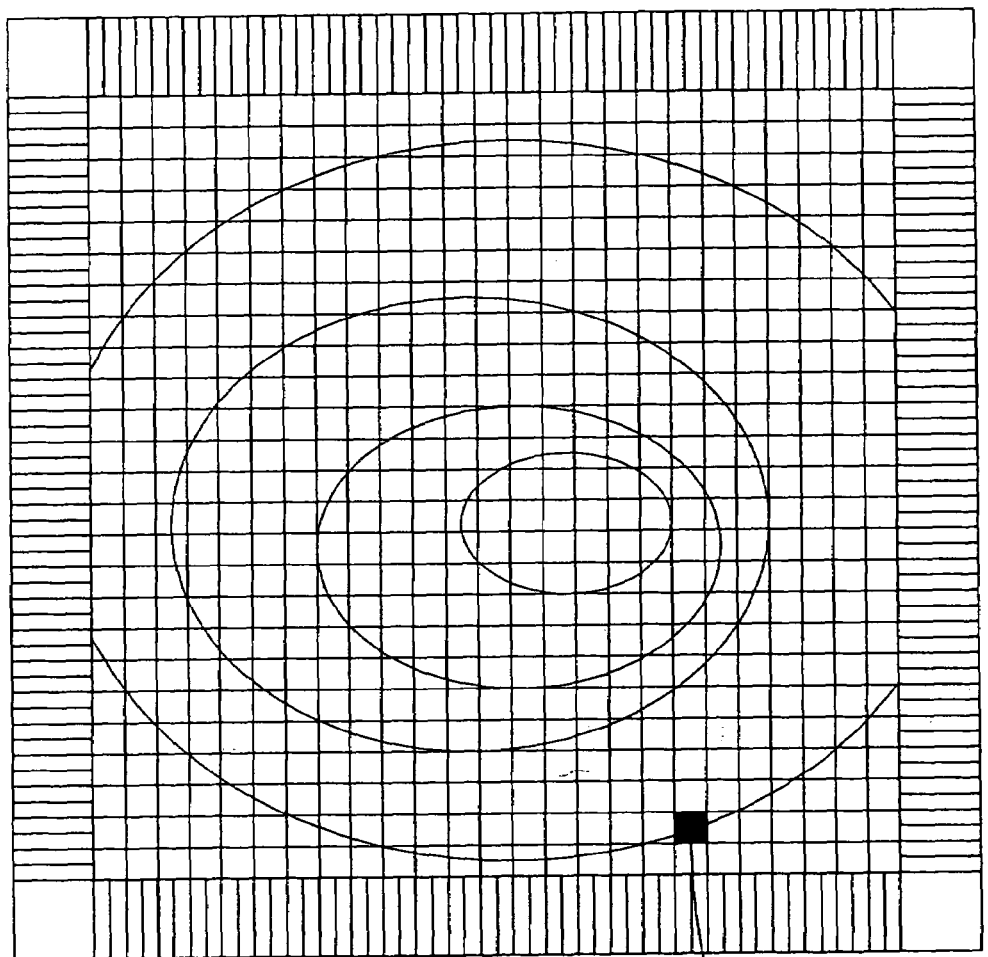
FIG. 15 is an explanatory view showing a method of a fifth embodiment of the present invention.

In this example, as shown in FIG. 15, the data are divided like meshes to hold the voltage data commonly in the same area.

Figure 16:
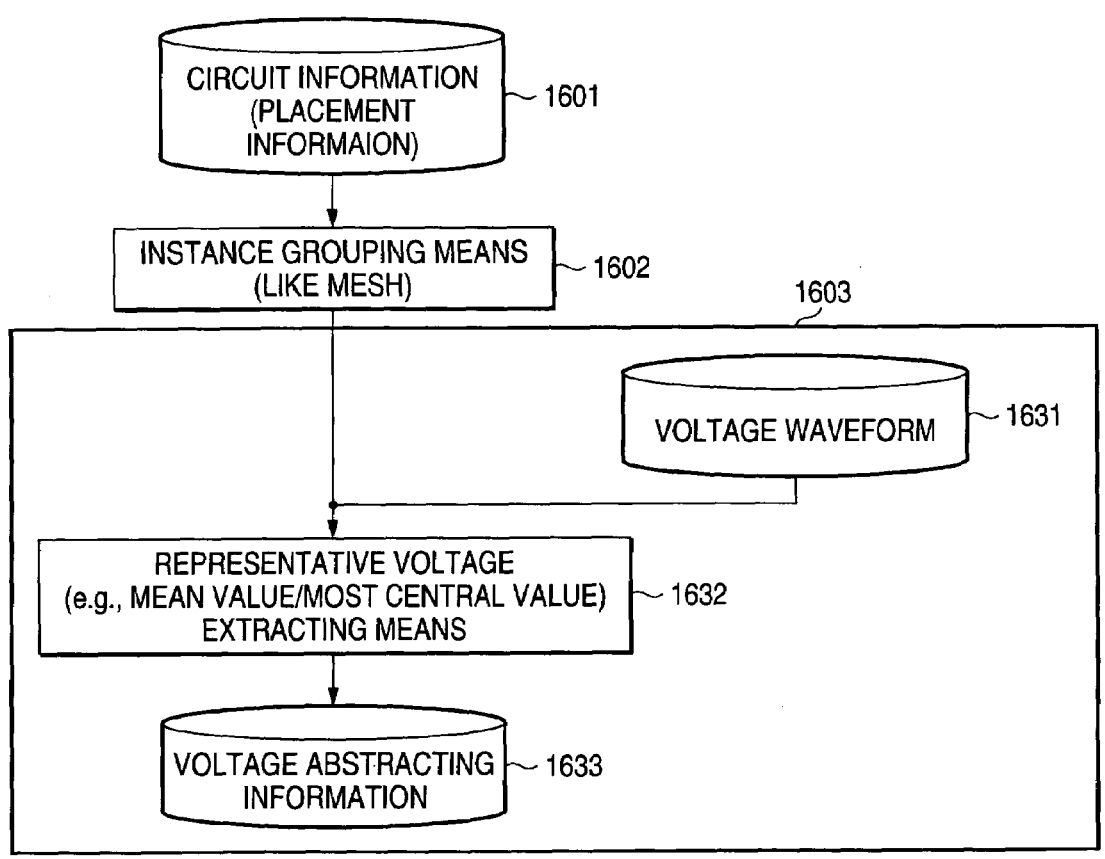
FIG. 16 is a flowchart showing the method of the fifth embodiment of the present invention.
Figure 17:
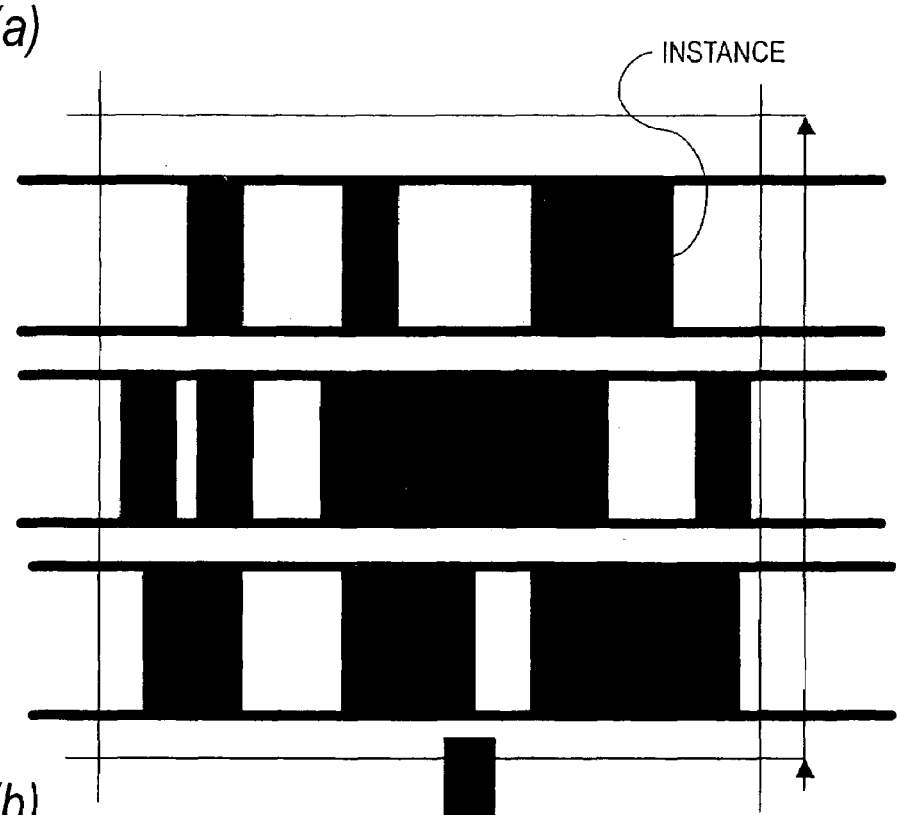
FIG. 17 is an explanatory view showing the method of the fifth embodiment of the present invention.
Figure 17:
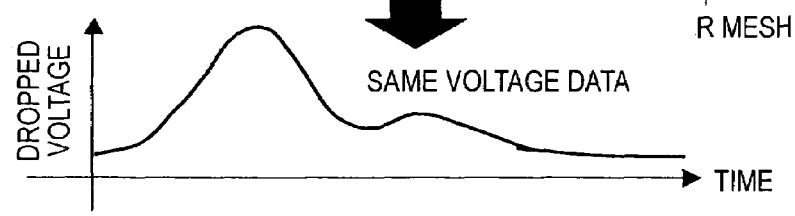

A flowchart is shown in FIG. 16. A chip is divided into mesh-like areas based on circuit information (placement information) 1601, and the instances in the same area share the voltage data, as shown in FIG. 17.

Then, a representative voltage is extracted in the group, and an mean value or a center value is selected as the representative voltage (step 1632). FIG. 17A shows one mesh, and it is understood that a plurality of instances are contained in this mesh. Then, FIG. 17B is a view showing the voltage data in this mesh, wherein an axis of ordinate denotes a dropped voltage and an axis of abscissa denotes a time.

Thus, voltage abstracting information are obtained by doing this (step 1632).

In this manner, if time-series voltage abstract information of all instances are held, an amount of memory use is increased. However, according to this configuration, since the instances in the same area own the voltage data in common, reduction in an amount of memory use can be implemented and also improvement in the operating speed can be attained.

Subsequently, since an amount of information is compressed by grouping these instances, reduction in an amount of memory use can be implemented and also improvement in the operating speed can be attained.

Also, in the above method, the voltage data of the center instance in the area may be employed, or the mean value of all instances in the mesh may be employed.

Sixth Embodiment

In the fifth embodiment, the chip is divided in a mesh-like fashion and the constant voltage value is employed in the same area. In contrast, in this method, a time constant of the power-supply wiring is calculated based on parasitic element information of the power-supply wiring, and the same group shares the voltage data if such time constant is located within a certain time constant range. That is, the range in which the time constants are contained within a predetermined value is set to one area, and then the voltage data are put together into one data in the same area.

Figure 18:
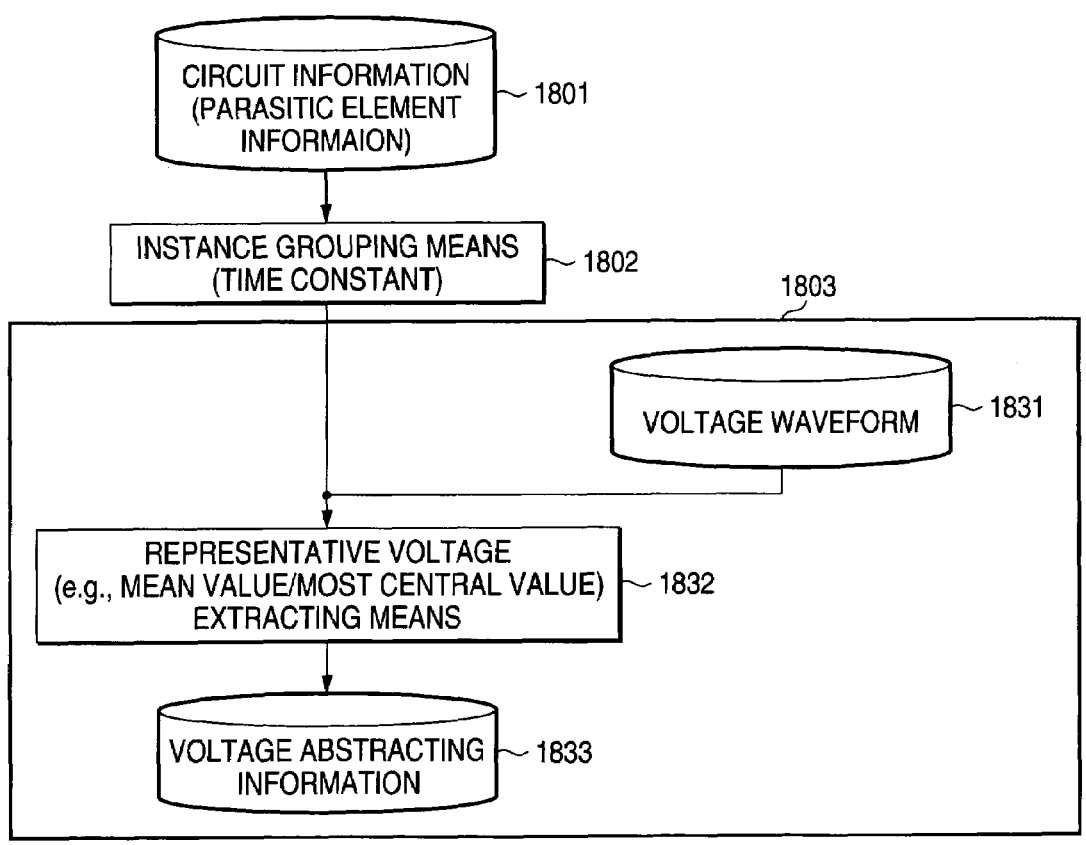
FIG. 18 is an explanatory view showing a method of a sixth embodiment of the present invention.
Figure 19:
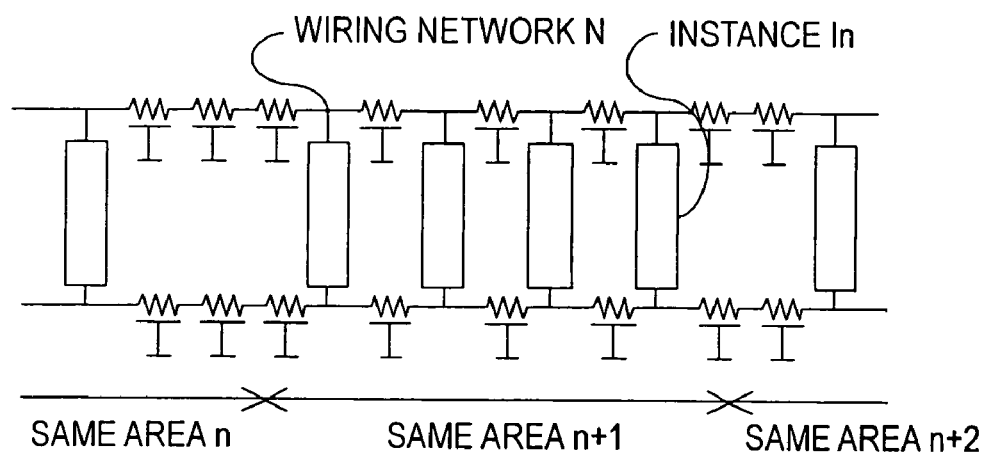
FIG. 19 is a flowchart showing the method of the sixth embodiment of the present invention.
Figure 19:
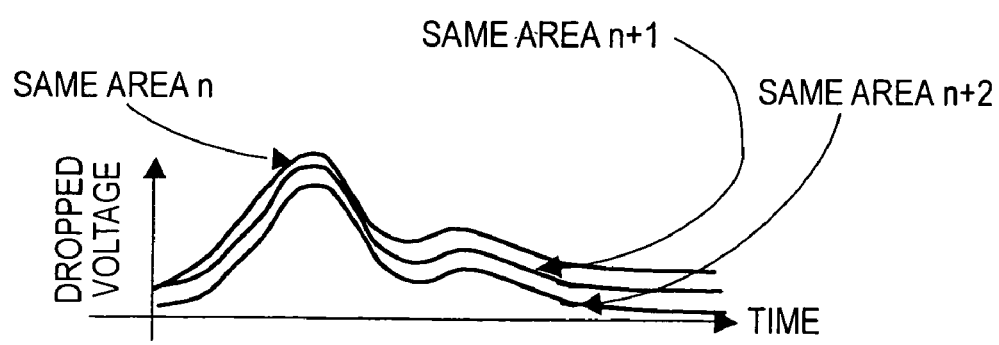

A flowchart of the method is shown in FIG. 18. The chips are grouped in compliance with the time constant (RC) based on circuit information (parasitic element information) 1801, and the instances in each group hold the voltage data commonly. Here, as shown in FIG. 19A, the chip is grasped as a connection body of resistances and capacitors consisting of an wiring network N and an instance In. Then, as shown in FIG. 19B, the range in which resultant time constants are included within a predetermined value is regarded as one area, and the voltage data are arranged into one data in the same area.

According to this method, a precision can be enhanced higher because the power-supply wirings are considered.

Seventh Embodiment

In the present embodiment, when power-supply voltage waveform differences are suppressed within a delay calculation error, they share the voltage data as the same group. In this case, waveform differences at the operation timing for every instance may be employed.

Figure 20:
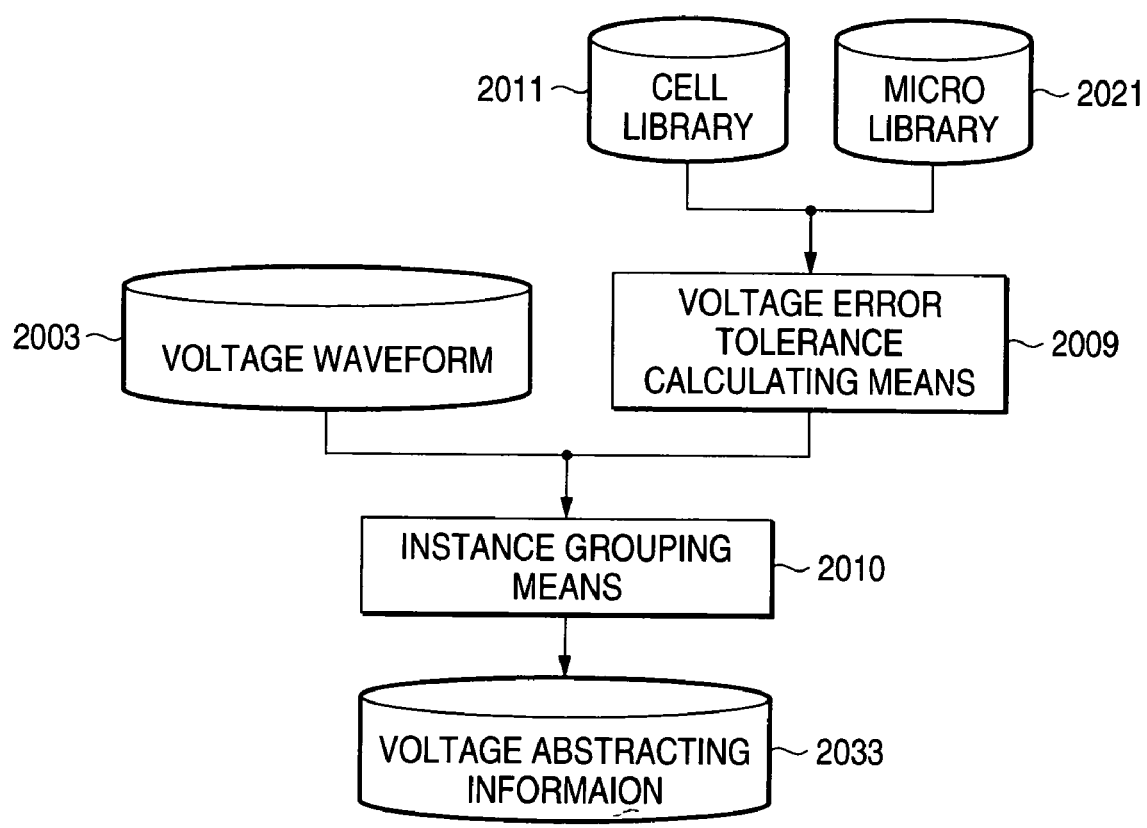
FIG. 20 is an explanatory view showing a method of a seventh embodiment of the present invention.

First, as shown in FIG. 20, the voltage error value is obtained by a voltage error tolerance calculating means 2009 based on the data being read from a cell library 2011 and a macro library 2021. Then, voltage abstracting information 2033 are obtained by an instance grouping means 2010.

Figure 21:
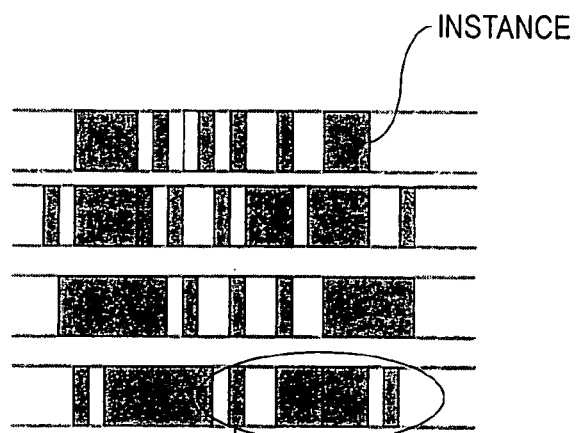
FIG. 21 is an explanatory view showing the method of the seventh embodiment of the present invention.
Figure 21:
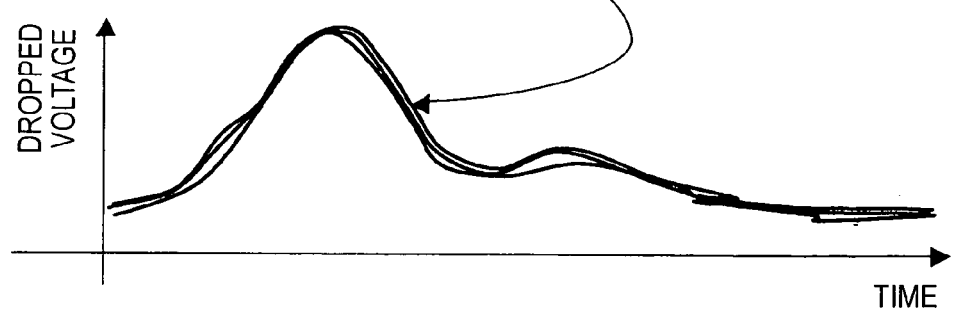

Like the instances and the power-supply voltage waveform differences shown in FIGS. 21A and 21B, if the power-supply voltage waveform differences are suppressed within the (previously decided) delay calculation error, the voltage data are used commonly and stored as one voltage data.

As a result, an amount of information can be largely compressed and also a processing speed can be enhanced.

Eighth Embodiment

In the seventh embodiment, the data compression is implemented by classifying the voltages into groups based on the power-supply voltage waveform differences among respective instances. In the present embodiment, the instances are classified into groups and then the voltage value is calculated every group, and therefore a processing amount can be reduced and an amount of information can be compressed.

Figure 22:
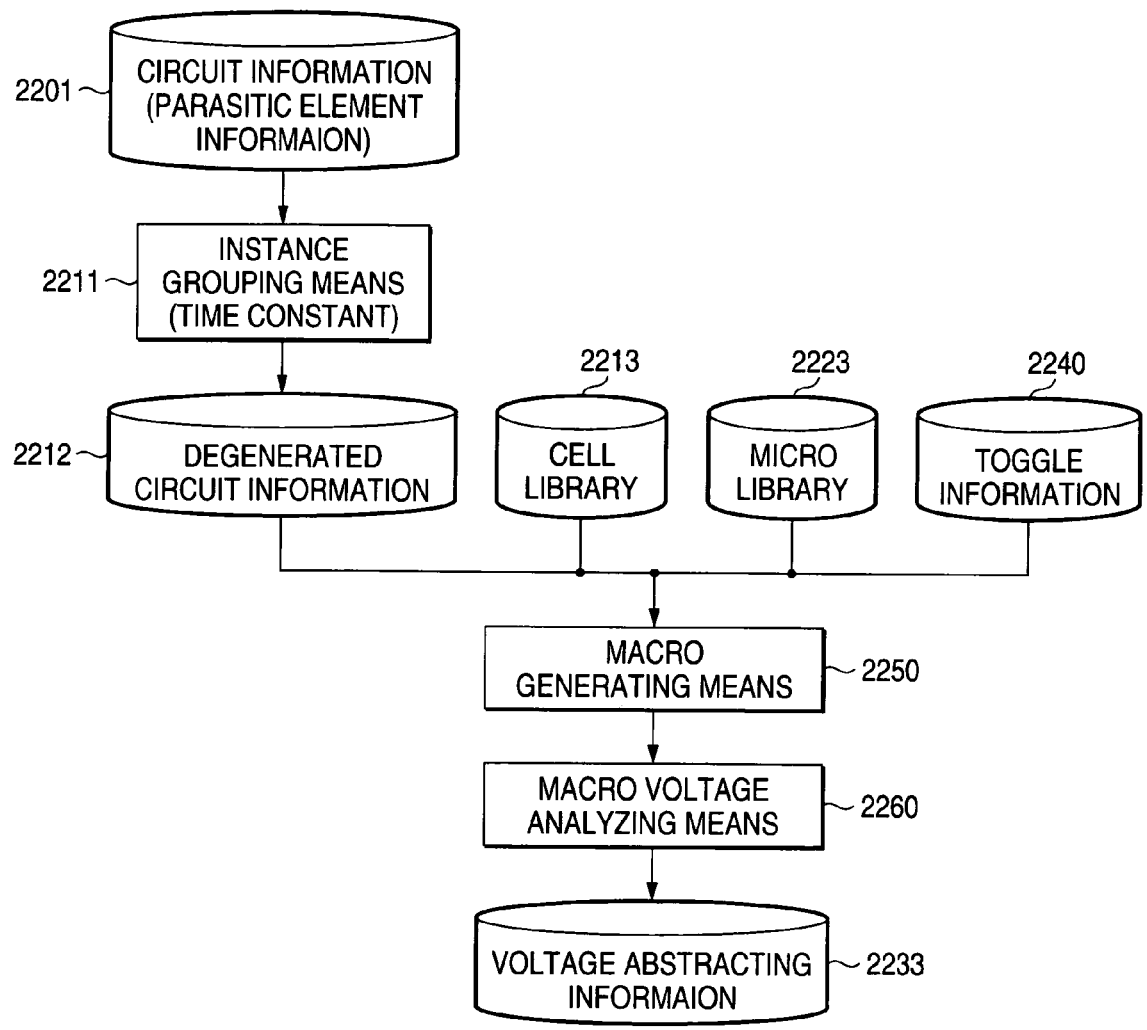
FIG. 22 is a flowchart showing a method of an eighth embodiment of the present invention.

FIG. 22 is a flowchart showing this method of the eighth embodiment.

Figure 23:
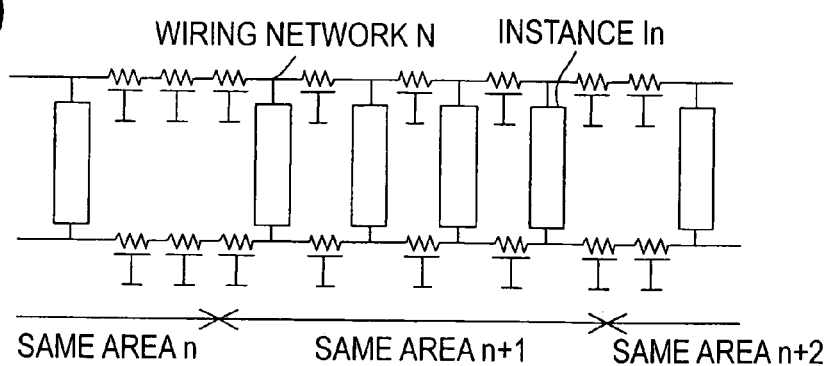
FIG. 23 is an explanatory view showing the method of the eighth embodiment of the present invention.
Figure 23:
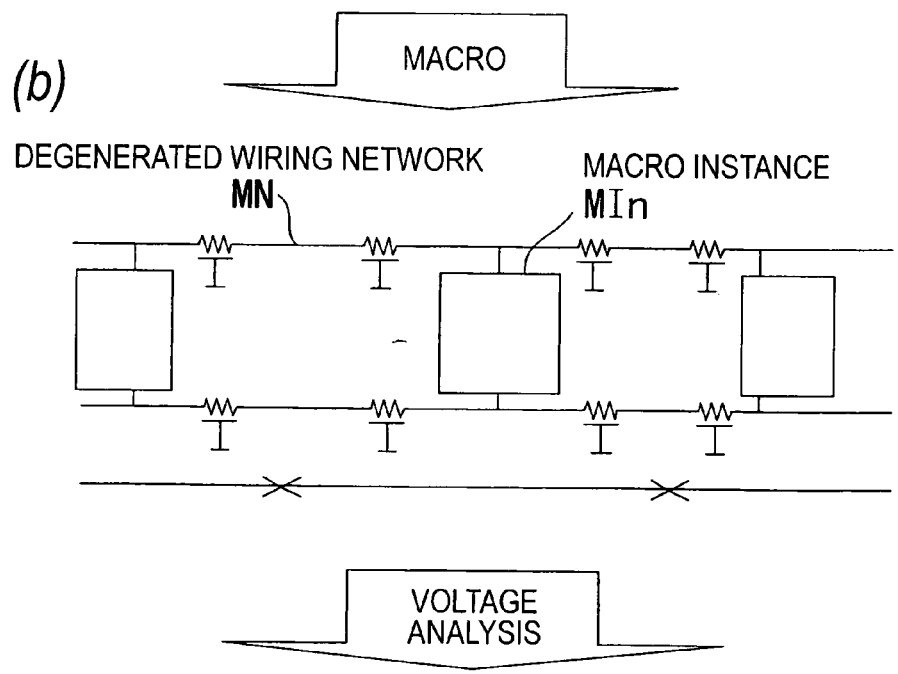

Reduced circuit information 2212 shown in FIG. 23A are obtained by grouping the instances based on circuit information (parasitic element information) 2201 (instance grouping means 2211). That is, as shown in FIG. 23A, the range in which resultant time constants are included within a predetermined value is grasped as one area and then the macros are formed in the same area (macro generating means 2250). Thus, macro instances MIn as well as reduced wiring networks MN are formed.

Then, a time constant of the power-supply wiring is calculated based on the parasitic element information of the power-supply wiring, and the instances that are included within a predetermined time constant are grouped. Then, the macros having a current waveforms and a reduced power-supply wiring RC circuit in the grouped instance groups are generated, and then the voltage analysis is carried out by using respective macros (macro voltage analyzing means 2260). Then, the abstracted voltage information are derived.

As a result, reduction in an amount of memory use and also an improvement in the operating speed can be achieved.

In this way, if the voltage analysis is applied to all instances, an amount of memory use and a processing time are increased. However, according to this configuration, since the instances are classified into groups and then the voltage value is calculated every group, a processing amount can be reduced and an amount of information can be compressed. As a result, reduction in an amount of memory use and also an improvement in the operating speed can be achieved.

Ninth Embodiment

In the above eighth embodiment, reduction of a processing amount and compression of an amount of information are attained by grouping respective instances and then calculating the voltage value every group. In the present embodiment, reduction of a time interval to be analyzed to reduce a processing amount will be explained hereunder.

In order to reduce a memory capacity, a short time interval to be analyzed is desired. In this case, in comparison to the case that the mean value information is used in the analysis like the related art, an analyzing time interval that considers the unit window must be used.

The data compression is executed by grouping respective instances based on the power-supply voltage waveform difference. In the case of a multi-cycle circuit in which a clock signal is used at plural locations, the delay time is analyzed by using a plurality of unit windows.

Figure 24:
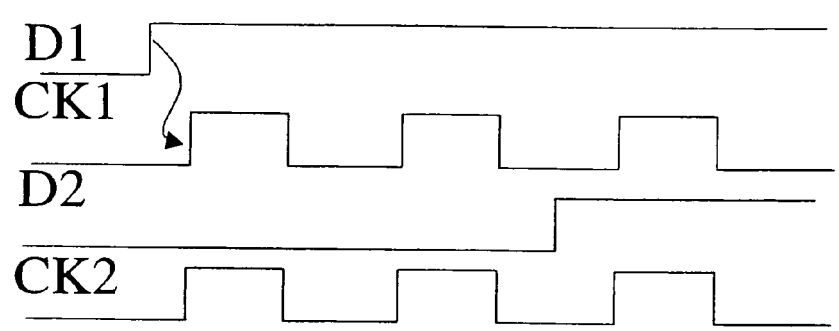
FIG. 24 is an explanatory view showing a method of a ninth embodiment of the present invention.
Figure 24:
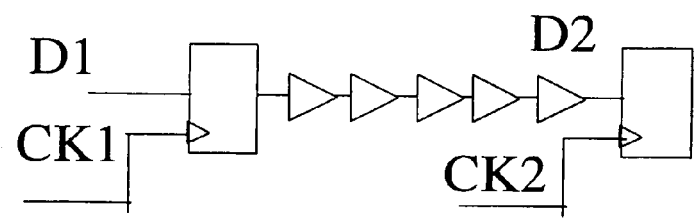
Figure 24:
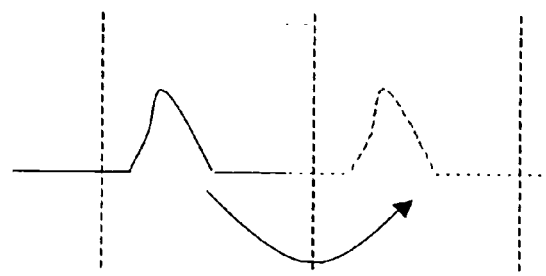

As shown in a block diagram of FIG. 24B, assume that cells C1, C2 are connected and clocks CK1, CK2 are input into the cells respectively. Therefore, as shown in FIG. 24A, assume that an input signal D1 is input into the cell C1 and the cell C1 is driven by the clock CK1 and that an input signal D2 is input into the cell C2, which is connected to an output of the cell 1 via a predetermined circuit, and the cell C2 is driven by the clock CK2. At this time, the clocks CK1, CK2 are clock signals operated at the same timing and an output of the cell C2 is given as shown in FIG. 24C.

In this case, because the operation analysis is executed by using plural (here, two) unit windows Tw, the analysis can be carried out not to bring about reduction of accuracy.

Figure 25:
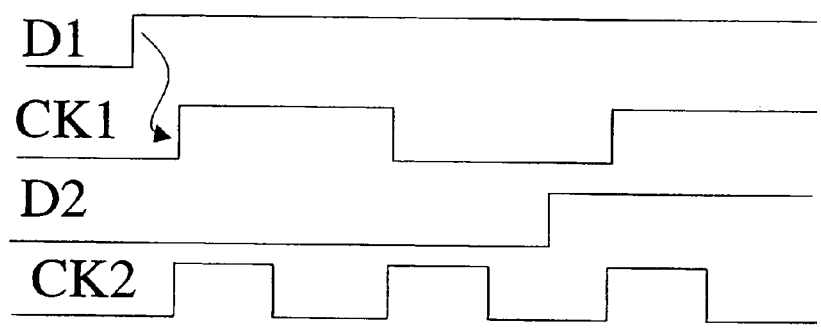
FIGS. 25(*a*), 25(*b*) and 25(*c*) are explanatory views showing the method of the ninth embodiment of the present invention.
Figure 25:
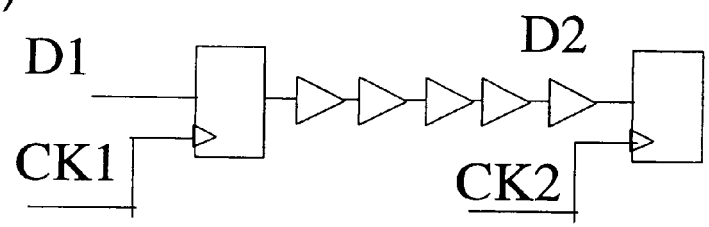
Figure 25:
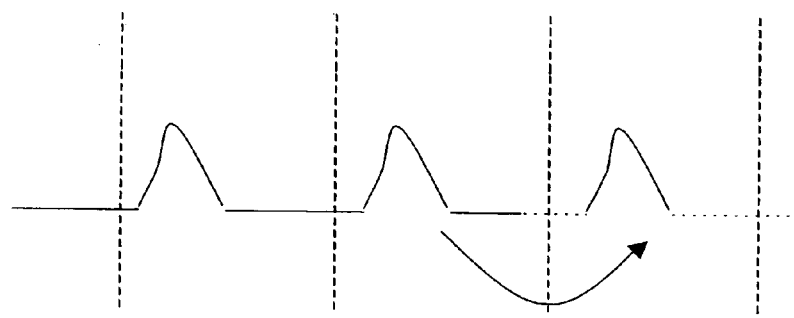

In contrast, as shown in FIG. 25, in case two clocks CK1, CK2 having a different period respectively are used, an evaluation analyzing range should be expanded up to the least common multiple, and then the voltage drop should be evaluated under the worst conditions and the minimum conditions.

Tenth Embodiment

In the present embodiment, upon calculating the maximum delay value, a time point at which the object cell is operated lastly in a timing window is extracted and then the delay value is calculated based on the maximum dropped power-supply voltage at the extracted time point. Here, the "timing window" signifies a time period in which a timing calculation prepared based on each clock period constraint should be executed upon the static timing analysis. Therefore, in many cases the clock period itself is employed herein.

Figure 26:
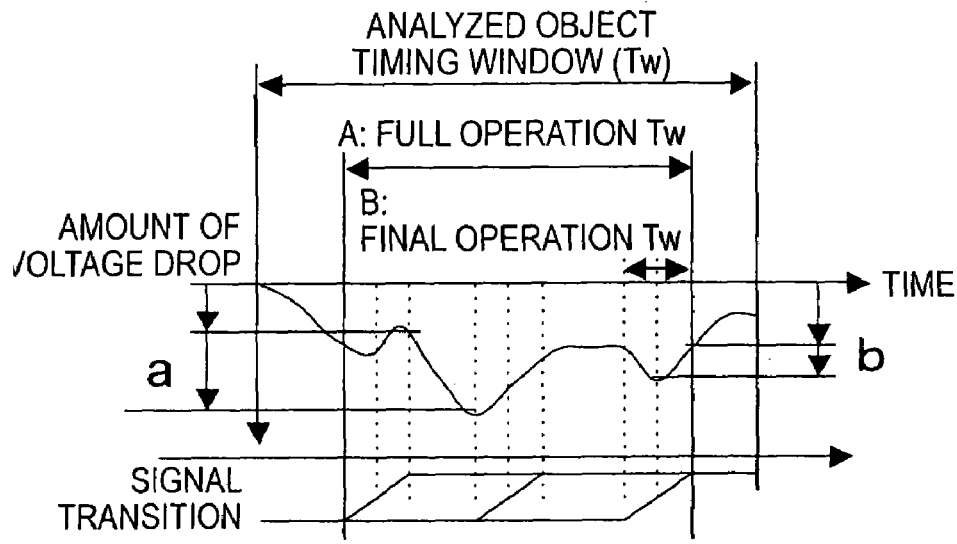
FIG. 26 is an explanatory view showing a method of a tenth embodiment of the present invention.

In the related art, since the delay time is calculated based on the maximum voltage drop amount of the concerned cell without regard to the voltage waveform, in some cases such delay time is calculated based on the voltage drop amount at a time point at which a timing error is never caused actually. In other words, as shown in FIG. 26, the delay value corresponding to the maximum voltage drop amount (a), which is generated at an intermediate point in the timing window Tw of the analyzed object, does not affect the delay in a critical path. For this reason, the excessively pessimistic analyzed result was produced by the approach in the related art.

For example, the delay value at a time point, at which the maximum voltage drop amount in the unit window Tw becomes maximum, does not always affect the delay in the critical path. Therefore, in the present embodiment, as shown in FIG. 26, when the maximum delay time is to be calculated, the final operation window Twf containing the final operation time is extracted, then the maximum voltage drop amount b in the final operation window Twf is detected, and then the delay value corresponding to this value is calculated.

In this fashion, in the present embodiment, the final operation window Twf containing the final operation time is extracted, then the voltage drop amount b in the final operation window Twf is detected, and then the delay value is calculated based on this value.

As a result, the delay value at the operation time at which a possibility to cause an error is present can be utilized actually by calculating the voltage drop amount with regard to the timing, and thus pessimism can be reduced.

In contrast, upon calculating the minimum delay time, the delay time may be calculated based on the minimum power-supply dropped voltage in the timing window (Twa) at the time when the first event is generated in the full operation timing window.

Eleventh Embodiment

Figure 27:
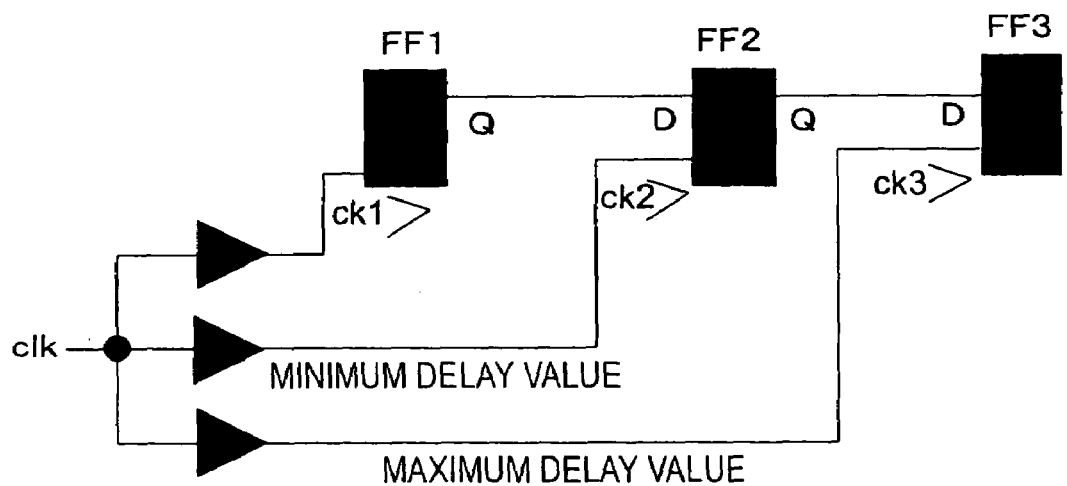
FIG. 27 is an explanatory view showing a method of an eleventh embodiment of the present invention.

In the present embodiment, the cell for driving the clock is extracted, then the delay value of the cell that drives the clock is calculated selectively, and then a timing verification taking the voltage drop into consideration is conducted. For example, an example shown in FIG. 27 will be considered hereunder. In this example, in case flip-flop circuits FF1 to FF3 are connected in a three-stage fashion and a clock clk is driven by three branched clocks clk1, clk2, clk3, the timing verification to check that an input of the data receiving FF1 is translated after a time decided by a clock operation of the data receiving FF1 (hold time) is required.

In the related art, in case the hold delay constraint verification is executed, the delay value that considers the voltage waveform of all cells is calculated and verified. In this case, an amount of data is increased and also such delay value is not always needed. In the hold verification, a time required to verify the state in which the delay time becomes shortest is present in the data portion. The delay time is shortest in a state that the drop is not considered. Therefore, the delay time is never derived excessively optimistically even in a state that the drop is not considered. Therefore, in the present embodiment, the delay calculation that considers the voltage variation is applied only to the clock portion, while the delay value is calculated in portions except the clock portion by using the delay value in the ideal power-supply state.

Also, in case the setup delay constraint verification is executed, when the pessimistic delay value is calculated in portions except the clock portion, the verification from which the optimism is excluded much more can be executed by applying the delay verification that considers the voltage waveform only to the clock portion.

In such situation, according to the configuration of the present embodiment, since the number of calculated objects is reduced, a delay calculating time can be reduced.

Twelfth Embodiment

In the present embodiment, the case that a circuit in which a plurality of timing windows are present is verified in the hold time verification will be considered hereunder.

In the present embodiment, in the circuit in which a plurality of timing windows are present, the delay calculation executed based on the voltage waveform is applied to all time relationships of the timing windows.

Figure 28:
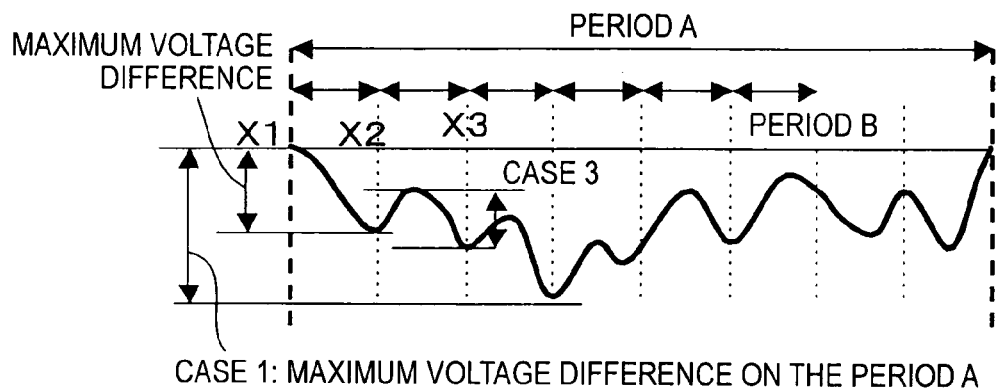
FIG. 28 is an explanatory view showing a method of a twelfth embodiment of the present invention.

For example, as shown in FIG. 28, in case two timing windows having a long period A and a short period B respectively are present in the circuit, the delay calculations such as a delay calculation that considers the voltage waveform in the timing windows X1–X2 and a delay calculation that considers the voltage waveform in the timing windows X2–X3 are carried out every timing window in the present approach.

The voltage waveform in the timing window with the period B is different in connection to the time relationship with the period A. Accordingly, in case the delay calculation to consider the voltage waveform is carried out, the operation of the circuit cannot be guaranteed unless the analysis to consider the voltage waveform is executed every timing window.

If this method is applied, the delay calculations of all possible situations are carried out resultantly. Therefore, it becomes possible to execute the delay analysis in response to the actual operation.

As described above, according to this method, the unit windows are decided to correspond to the timing windows, and then the delay analysis applied based on the power-supply voltage variation in answer to the actual operation to eliminate the excessive optimism can be carried out.

In this case, the timing window is a basic unit used to execute the timing analysis being stipulated every register and is normally stipulated based on the clock period being input into the register. According to the circuit configuration, the case that the timing window does not coincide with the clock period is present.

Thirteenth Embodiment

Figure 29:
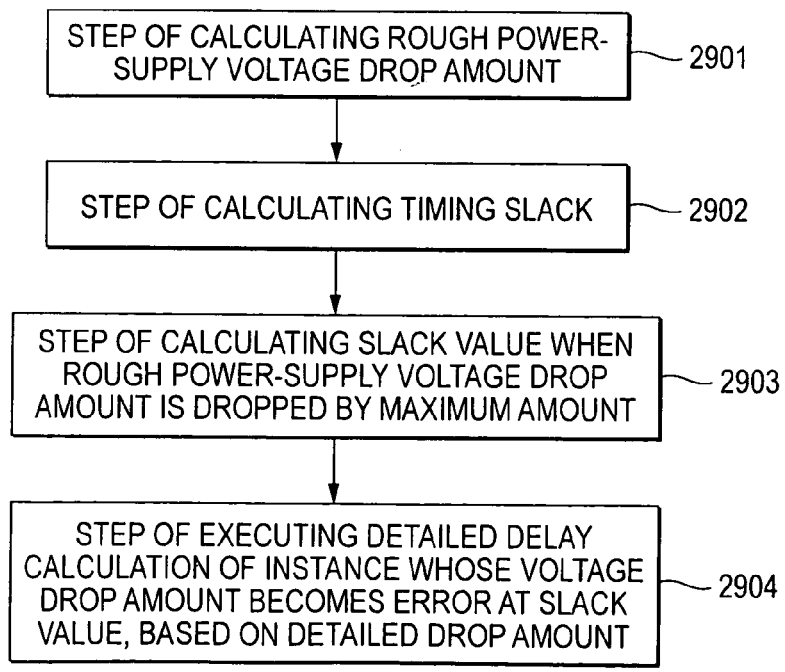
FIG. 29 is an explanatory view showing a method of a thirteenth embodiment of the present invention.

The present embodiment is made to utilize such a respect that the instance on the path, which has a margin for the timing slack at the maximum voltage drop amount, does not cause the setup timing error at all at the timing in which the voltage drop amount being smaller than the maximum voltage drop amount is reflected. The present embodiment is characterized in that the delay value is not calculated in the instance that has a margin in the timing of the path. As shown in FIG. 29, the step of calculating the delay value includes the step 2901 of calculating a rough voltage drop amount, the step 2902 of calculating a timing slack, the step 2903 of calculating a slack value of the instance whose rough voltage drop amount becomes maximum, and the step 2904 of executing the detailed delay calculation of the instance in which the voltage drop amount becomes an error at the slack value.

Here, the maximum voltage drop value in all instances in the voltage analyzing step in FIG. 56, for example, may be employed as the step of calculating the rough voltage drop amount.

In this case, in the related art, the delay calculation to take the voltage drop into account (as the mean value) is applied to all cells. But the instance on the path that has a margin for the timing slack at the maximum voltage drop amount never causes the setup timing error at the timing in which the voltage drop amount being smaller than the maximum voltage drop amount is reflected. For this reason, the maximum voltage drop amount is calculated by executing the rough drop amount calculation previously before the detailed drop amount calculation, and then the delay calculation executed based on the detailed drop amount is not applied to the instance on the path that has a margin for the timing slack at the maximum voltage drop amount.

As a result, reduction in an amount of delay calculation can be achieved and also shortening of a calculation time can be achieved.

Also, upon executing the optimization, the cell or the instance having an influence on the unit window of the cell that is weak in a voltage drop is reported based on the analyzed result obtained by using the above operation analyzing method, and then the optimization is carried out.

Fourteenth Embodiment

Next, an optimizing method executed based on the analyzed result will be explained hereunder.

Figure 30:
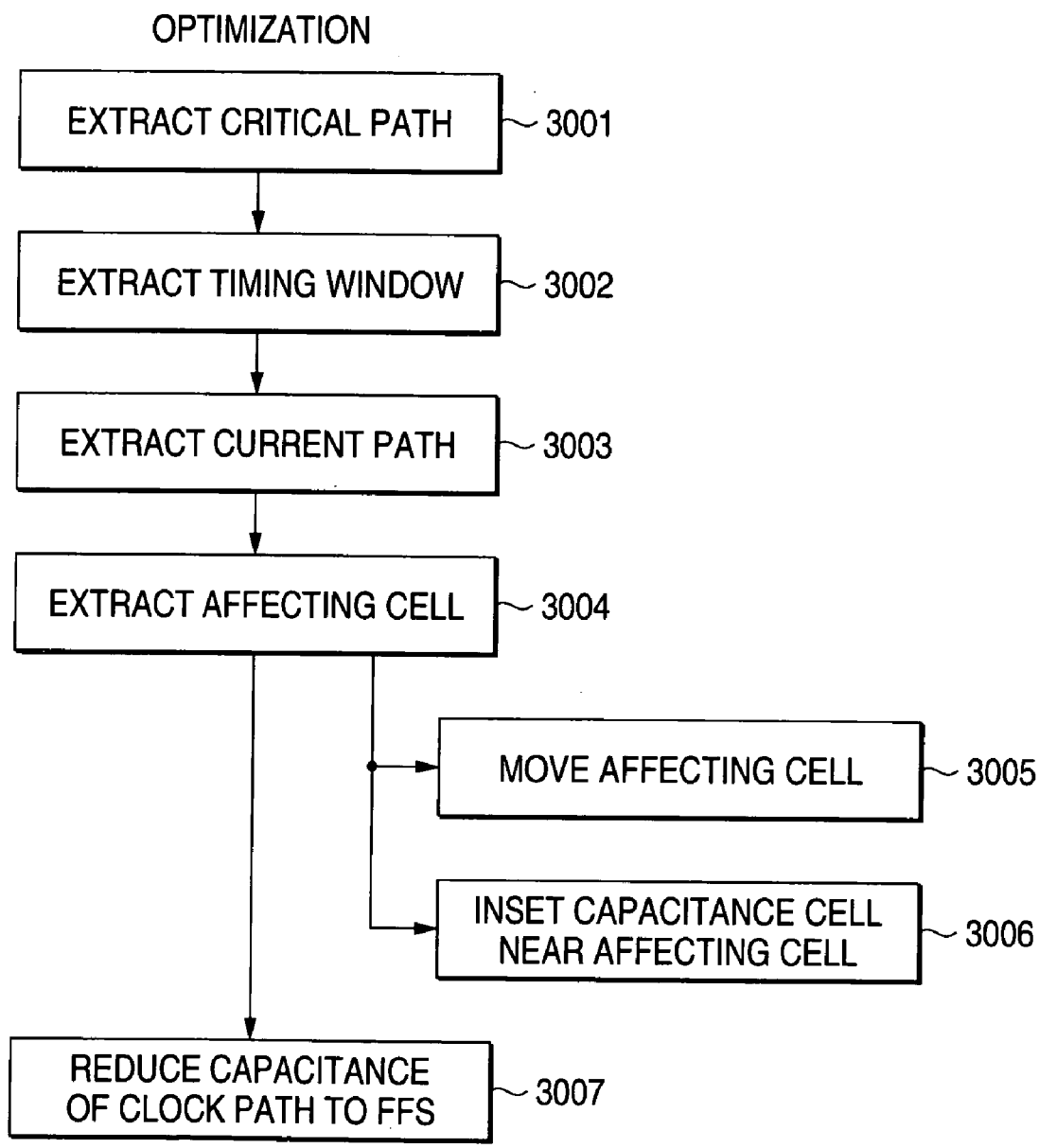
FIG. 30 is a flowchart showing a method of a fourteenth embodiment of the present invention.

As shown in FIG. 30, the present embodiment includes the steps of reporting the result obtained by the operation analyzing method for the semiconductor integrated circuit device of the present invention, and moving the affecting cell or instance or inserting a capacitance cell near the affecting cell or instance based on this result.

Figure 31:
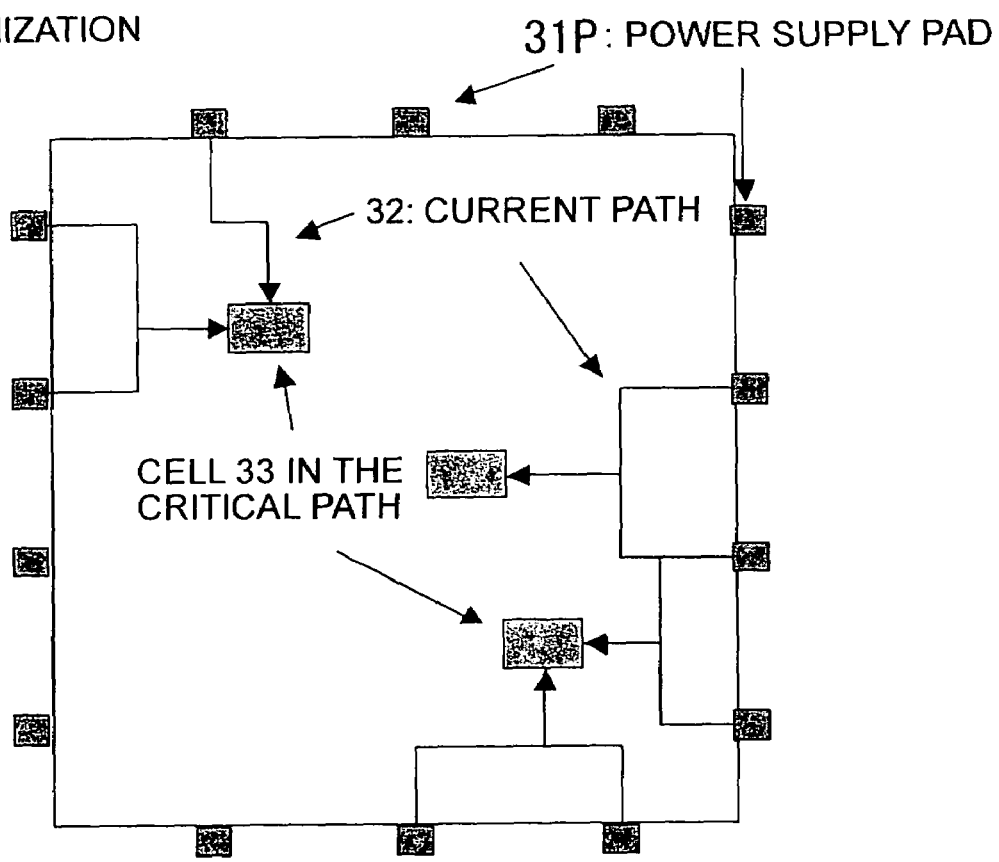
FIG. 31 is an explanatory view showing the method of the fourteenth embodiment of the present invention.
Figure 32:
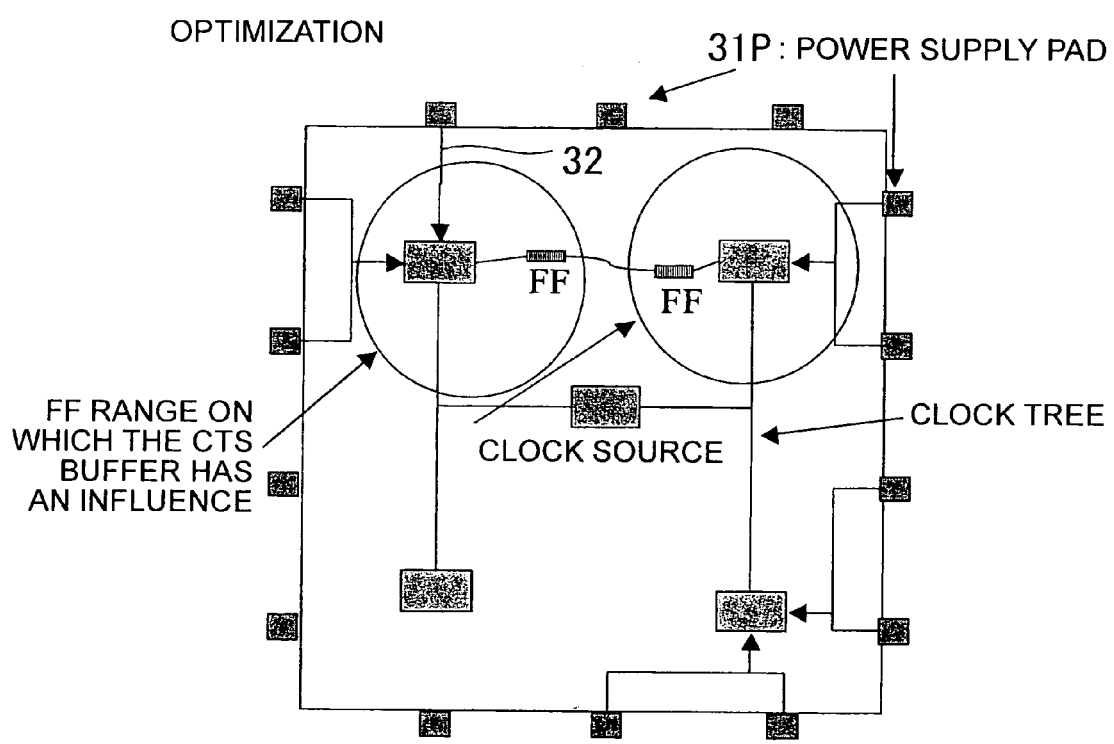
FIG. 32 is an explanatory view showing the method of the fourteenth embodiment of the present invention.

More particularly, as shown in explanatory views of FIG. 31 and FIG. 32, a critical path 32 of the signal such as a path having the largest delay value is extracted from the reported result shown in FIG. 1 (step 3001), then the unit window is extract in accordance with the extracted information (step 3002), then a current path is extracted in response to the extracted result (step 3003), then the cell that has an influence on the unit window through which a current flows and needs a large power consumption is extracted as the affecting cell 33 (step 3004), and then the affecting cell is moved (step 3005) or the capacitance cell is inserted near the affecting cell (step 3006).

Meanwhile, in case a clock skew is generated from a clock source shown in FIG. 32 to respective FFs by the influence of the voltage drop in the clock path, the unit window on which a CTS buffer in the clock path that is affected largely by the voltage drop is operated is extracted, then the current path in the unit window is extracted and also the affecting cell that has an influence on that path is extracted, and then moving of the affecting cell (step 3005) or inserting of the capacitance cell (step 3006) is executed like the above. Otherwise, in case the capacitance is present near the CTS buffer in the clock path that is not affected by the voltage drop, the clock skew can be adjusted by reducing the capacitance of the clock path to the FFs (step 3007).

In this manner, the process is carried out. Thus, if the processing step and the analyzing step are repeated until it is decided in the analyzing step that a timing difference is suppressed smaller than a predetermined value, the highly reliable process can be executed effectively.

Fifteenth Embodiment

In the above-mentioned embodiments, in case the delay value calculation is carried out, such delay value is calculated by referring to the library. In the present embodiment, the abstraction of the cell will be explained hereunder. This method can be applied to both the cell library 1013 and the macro library 1023 shown in FIG. 1.

Here, the library used in this operation analyzing method is composed of combinations of plural time points and plural voltages and their delay values. The delay value calculating method calculates the delay value corresponding to the voltage abstracting information formed in the abstracting step by referring to the library.

Figure 33:
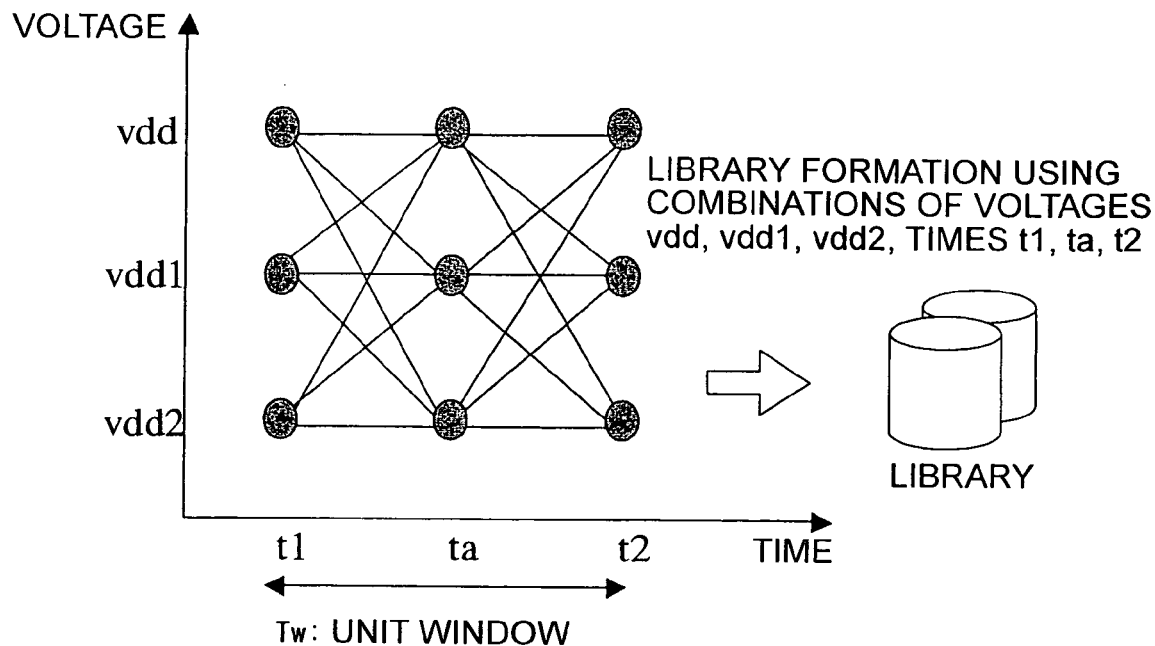
FIG. 33 is an explanatory view showing the method of the fifteenth embodiment of the present invention.

First, in this example, as shown in FIG. 33, the library is formed by using combinations of plural times t1, ta, t2 and plural voltages vdd, vdd1, vdd2.

For example, when changing to voltage vdd, vdd, and vdd1 in time t1, ta, and t2, respectively, delay time is measured in the combination of input slew rates and load capacity, and Library A is created.

If the library formed by combinations of plural times and plural voltages in this manner is employed, the delay value can be calculated from the library including combinations of the times and the voltages, which have the similar voltage waveform.

According to this configuration, since the library is formed by using combinations of a change of the voltage waveform (FIGS. 33 and 35B), the delay value can be obtained in the state close to the actual operation not to execute actually the calculation. Also, the operation becomes close to the actual operation and the high-precision delay value can be obtained. Also, because the data are prepared as the library, the delay calculation is facilitated extremely.

Figure 34:
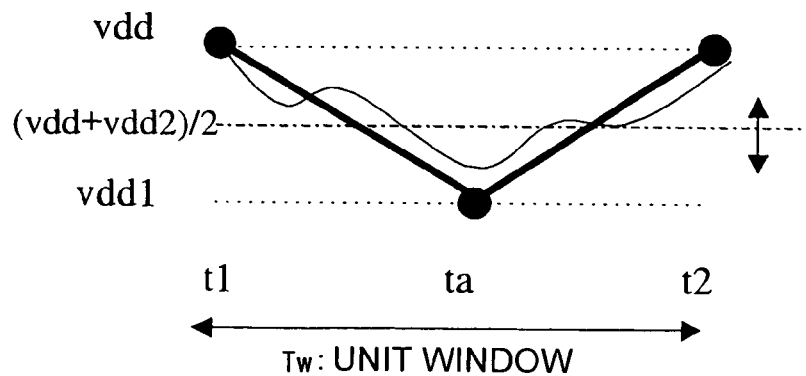
FIG. 34 is an explanatory view showing the method of the fifteenth embodiment of the present invention.

The abstraction process using three time which serves as a start point t1, an end point t2, and intermediate point ta of the unit window in this case is explained. As shown in FIG. 34, the voltage in a start point t1, an end point t2, and intermediate point ta in voltage waveform information perform abstraction by whether it is larger than the middle voltage (vdd+vdd1)/2 of voltage vdd and vdd1. In the example of FIG. 34, the voltage in a start point t1, an end point t2, and intermediate point ta serves as a waveform which changes to vdd, vdd1, and vdd.

Also, the above compared point is not limited to the intermediate point, and plural points may be employed.

In this case, the information based on delay time information, power consumption information, timing check value information, input pin capacity information, threshold value information, cell characteristic, for example, are set forth in the library.

The delay time information are stored as a delay time table composed of input slew rates (transition time of the input signal waveforms) and load capacities.

The power consumption information are stored as a power consumption table composed of input slew rates (transition time of the input signal waveforms) and load capacities.

The timing constraint information are stored as a setup, hold constraint table composed of input slew rates (transition time of the input signal waveforms) of clocks and data.

This is true of the macro library.

Figure 35:
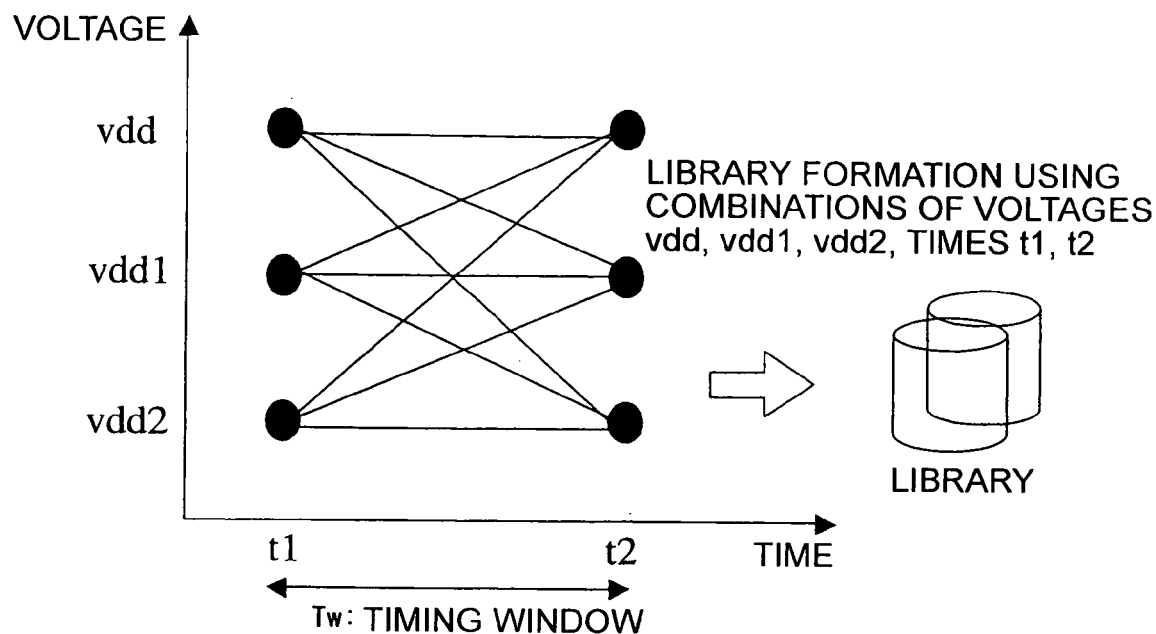
FIGS. 35(a) and 35(b) are explanatory views showing the method of the fifteenth embodiment of the present invention.

Also, in the above embodiments, the library is formed by detecting respective voltages at three time points and then calculating the delay value information. The library may be formed if the information at two time points or more are present. As shown in FIG. 35, the information at two time points may be employed.

According to this configuration, the library is formed by using combination of plural times t1, t2 and plural voltages. Therefore, since three types of voltages such as monotone increasing, monotone decreasing, and constant voltages may be supposed in the unit window, an amount of data can be widely reduced.

Sixteenth Embodiment

Next, a method of forming the library used in the fifteenth embodiment will be explained hereunder.

Figure 36:
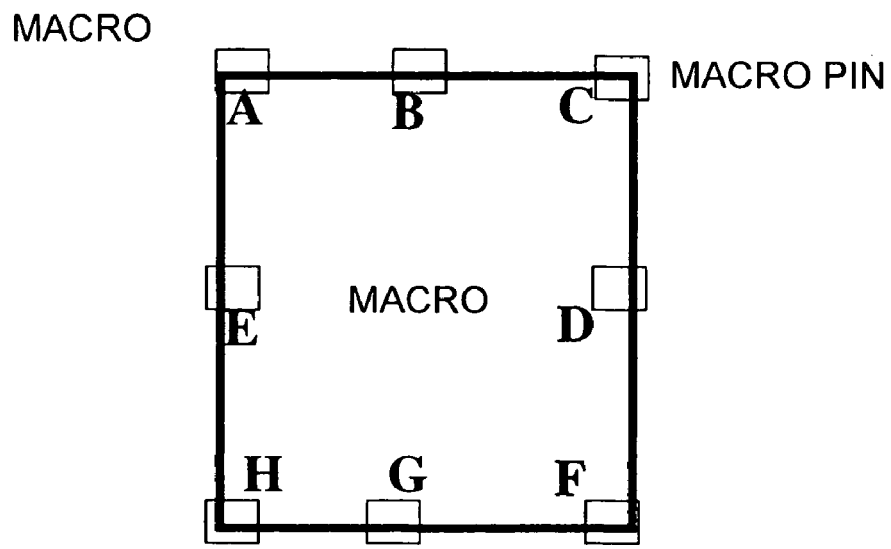
FIG. 36 is an explanatory view showing a method of a sixteenth embodiment of the present invention.
Figure 36:
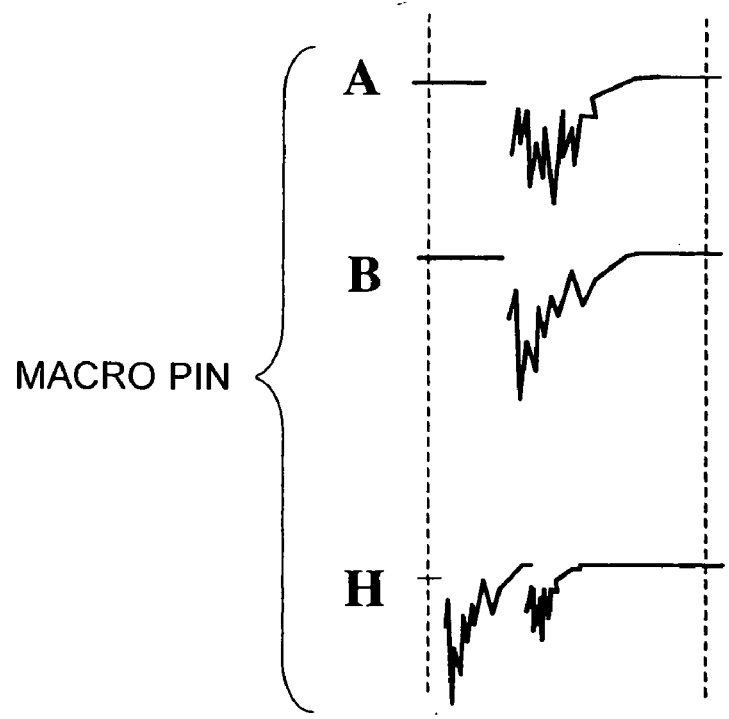

The semiconductor chip shown in FIG. 2 is divided into macros M1 to M8. As shown in FIG. 36A, a macro pin is used as the power-supply terminal in one macro, and a current waveform chart (FIG. 36B) of each macro pin is obtained. Here, the "macro" signifies a unit indicating a function module such as DSP, memory, etc. and indicates a unit that is larger than the standard cell. In this manner, since the chip is grasped not by a cell unit but by a macro unit and also the operation, the power consumption, and so forth are formulated into the library, this embodiment makes it possible to use these data in the chip design.

Figure 37:
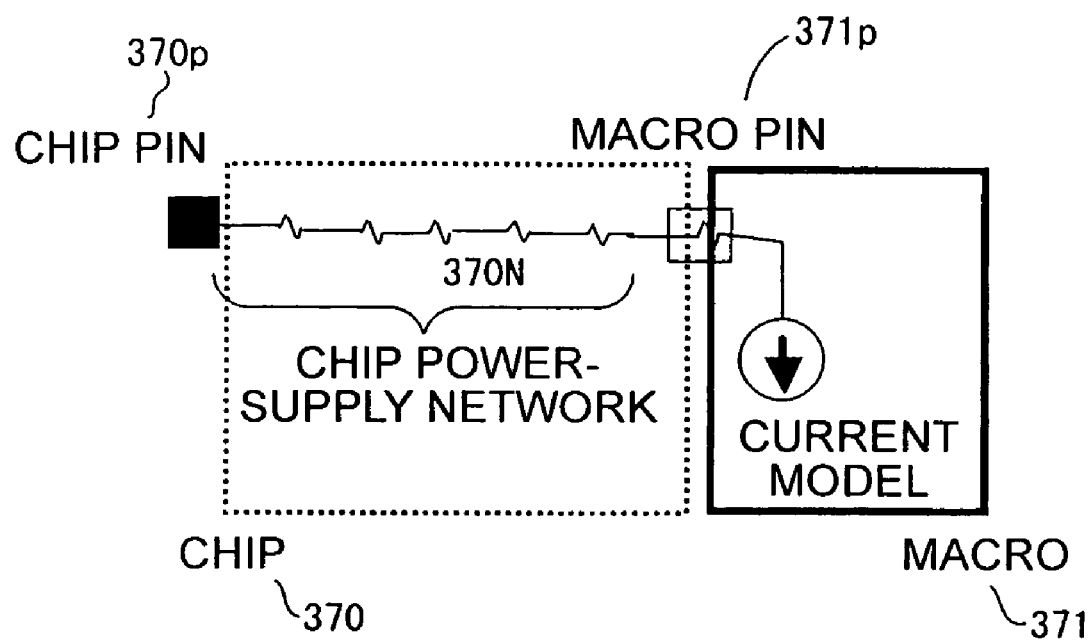
FIG. 37 is an explanatory view showing the method of the sixteenth embodiment of the present invention.

More particularly, as shown in an explanatory view of a voltage-drop analyzing macro current model in FIG. 37, a chip 370 is divided into a plurality of macros 371, and a chip power-supply network 370N is formed between a chip pin 370p as an external connecting terminal formed on the outer periphery of the chip and a macro pin 371p as a terminal provided to the macro. A voltage drop is caused by this network.

Figure 38:
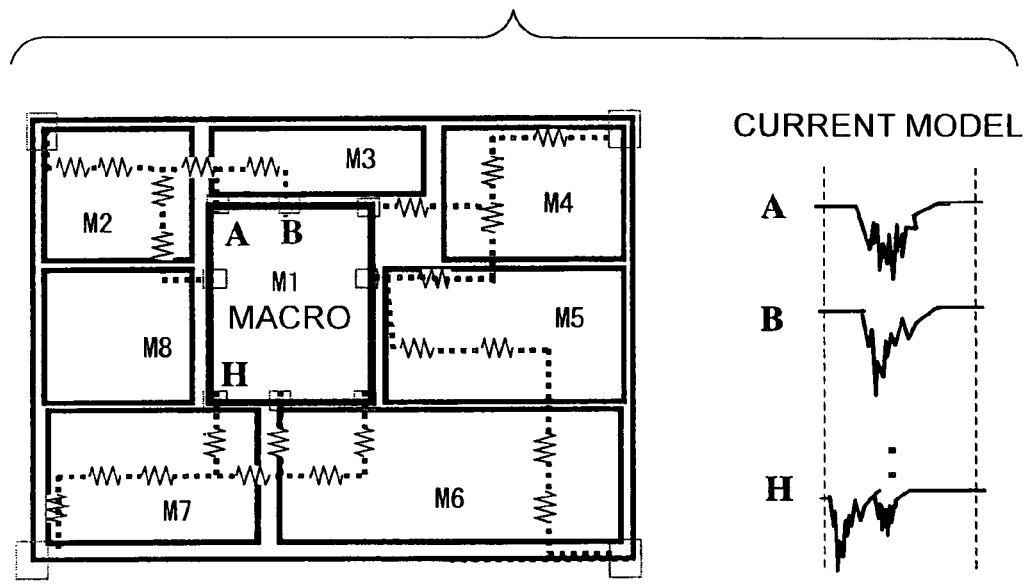
FIG. 38 is an explanatory view showing the method of the sixteenth embodiment of the present invention.
Figure 38:
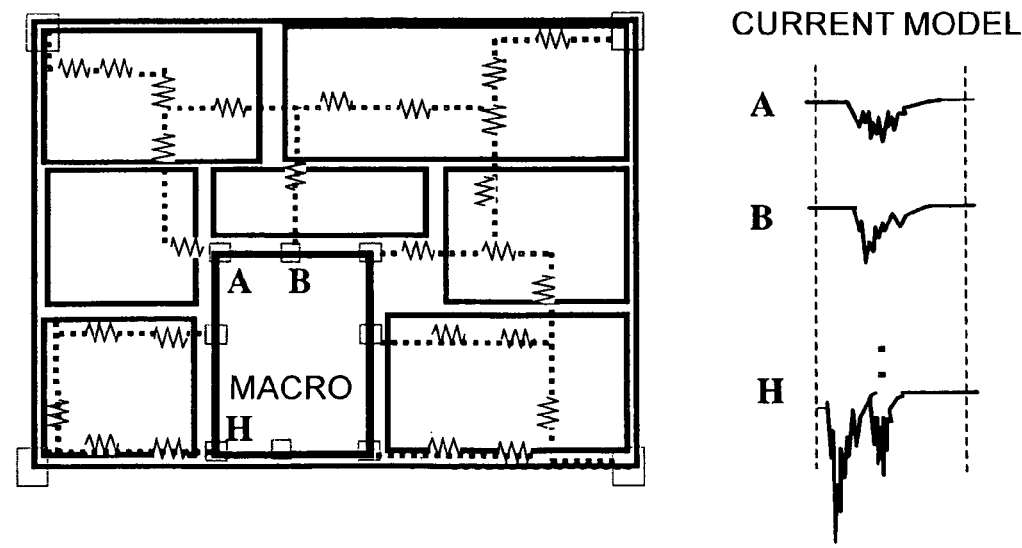

First, this macro M1 is selected and the current waveform is obtained. In this case, the current waveform is different according to a position of the macro in the chip. For example, as shown in FIGS. 38A and 38B, for example, a macro pin H of the macro M1 is positioned closer than an arrangement in FIG. 38A to a power-supply pad of the chip in FIG. 38B, and thus an impedance from the chip is reduced. Therefore, a current that is larger than that in FIG. 38A flows in FIG. 38B.

As appreciated from this, if the current analysis (voltage analysis) is executed while taking account of the position of the macro on the chip, the current analysis can be carried out with higher accuracy. Also, in case the library is formed by using this analyzed result, the high-accuracy library can be obtained.

Here, upon executing the current analysis with regard to the position of the macro on the chip, as shown in FIG. 37, the chip power-supply network 370N extended from the chip pin 370p to the macro pin 371p is calculated and then a macro current is calculated by taking this network into consideration.

Figure 39:
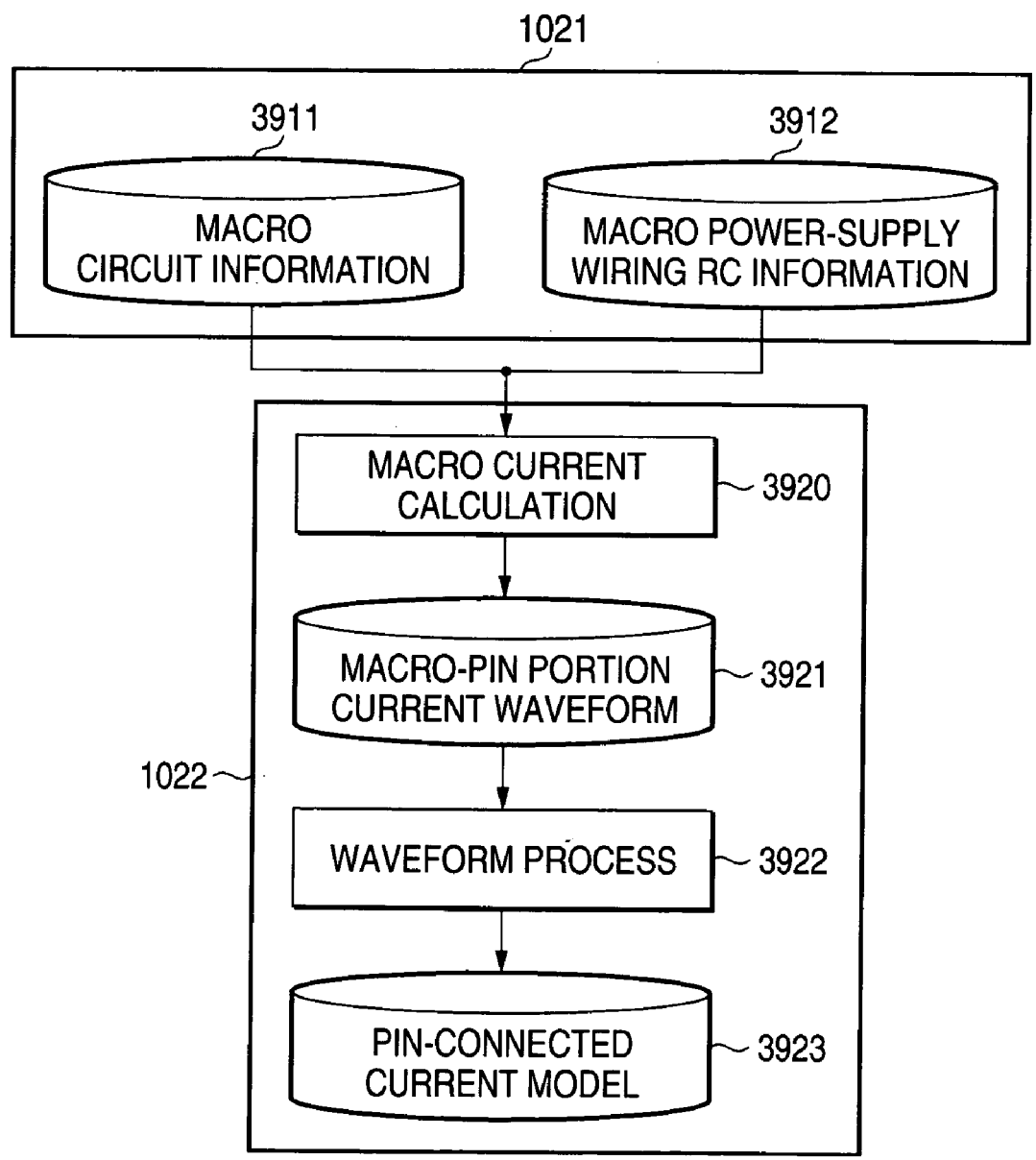
FIG. 39 is an explanatory view showing the method of the sixteenth embodiment of the present invention.

In other words, as shown in a flowchart of FIG. 39, macro circuit information 3911 and macro power-supply wiring RC information 3912 are extracted from the circuit information 1001 and then a macro current is calculated based on this information (step 3920), then a macro-pin portion current waveform is calculated (step 3921), then a waveform processing step is executed (step 3922), and then a pin-connected current model is formed (step 3923).

In this example, a chip power-supply network between the power-supply pin and the macro pin of the chip has an influence on an arranged position of the macro. In many cases, a value of the chip power-supply network is not decided at a point of time when the normal macro abstracting step is executed.

Figure 40:
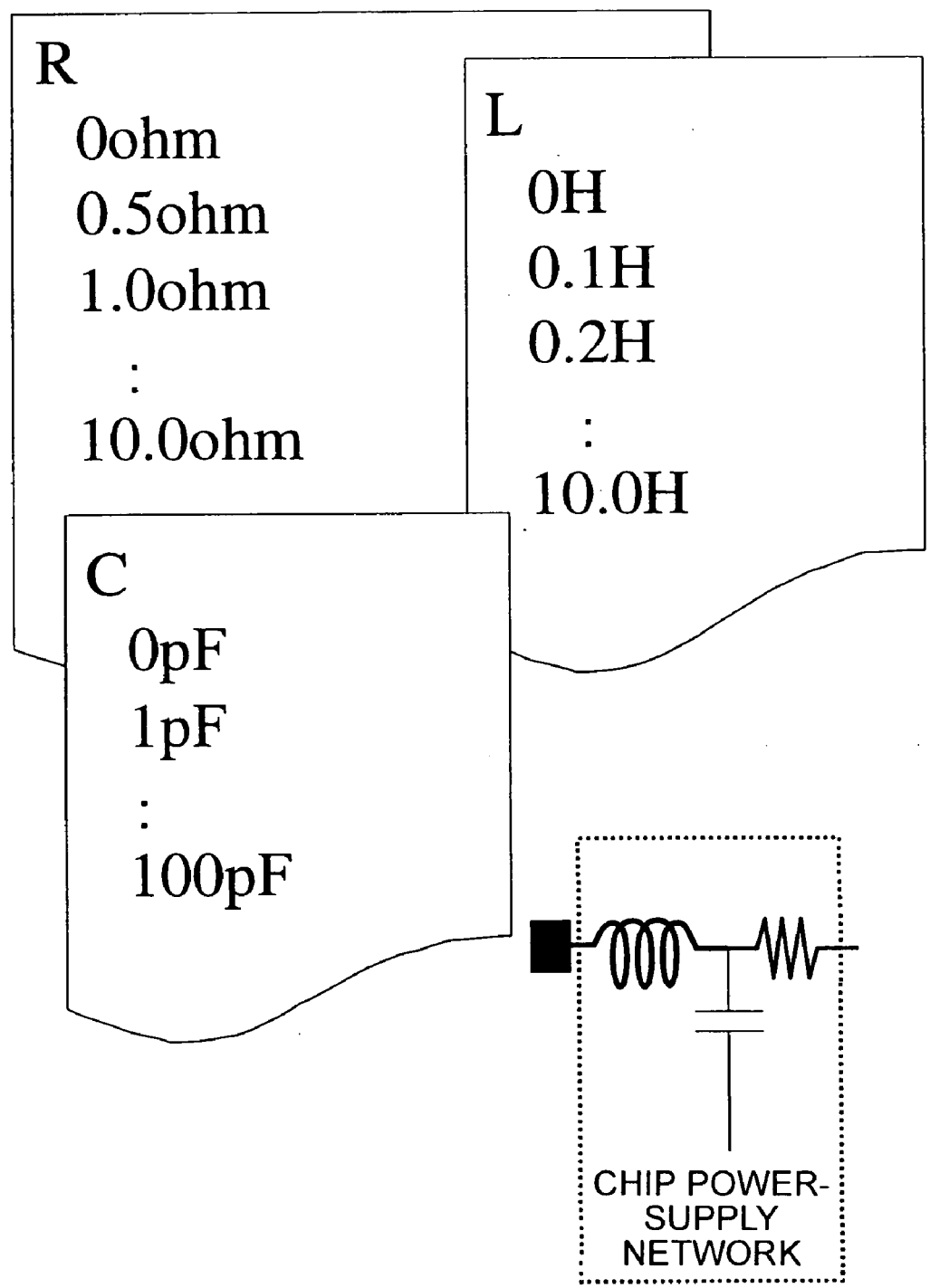
FIG. 40 is an explanatory view showing the method of the sixteenth embodiment of the present invention.

Therefore, in a variation, difference in RC information due to the arranged position of the macro is formed as an impedance sheet by using a chip impedance sheet and, as shown in FIG. 40, inductances L, resistances R, capacitances C are formed as the library. Therefore, R, L, C may be selected in response to this position and be introduced.

Figure 41:
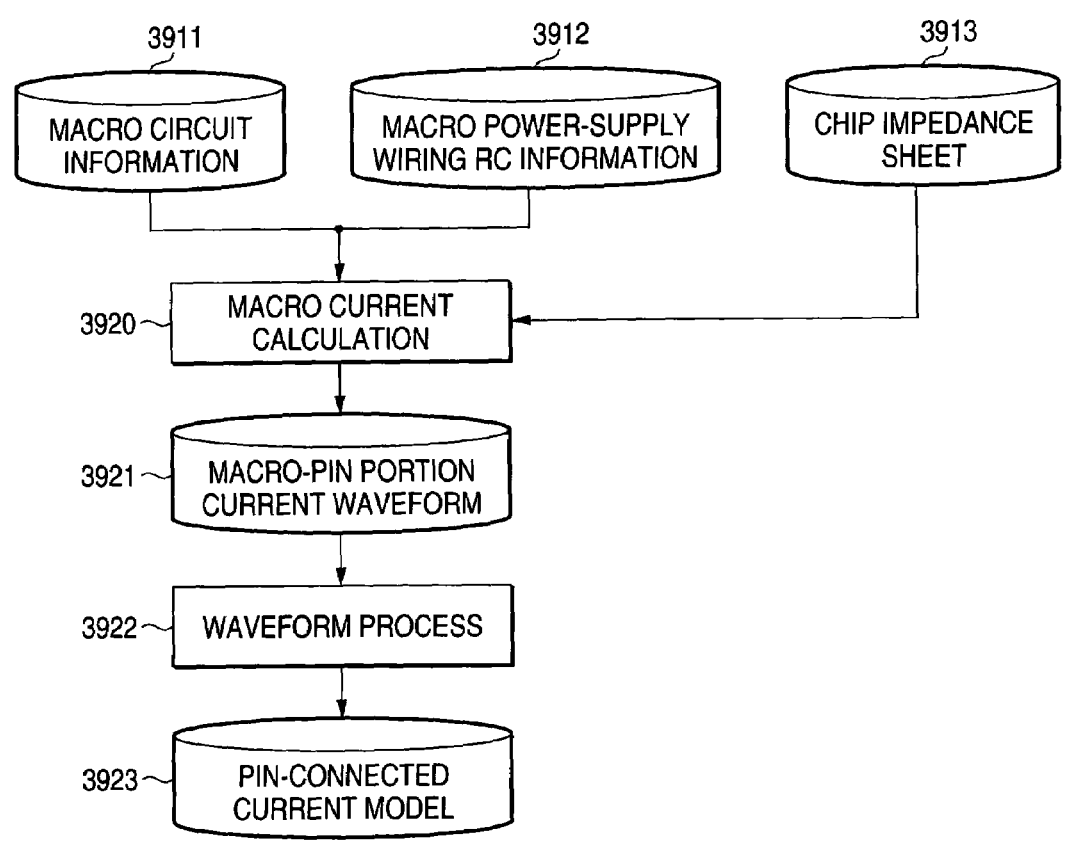
FIG. 41 is an explanatory view showing the method of the sixteenth embodiment of the present invention.

Here, a flowchart is similar to the above embodiments. Here, a flowchart is as shown in FIG. 41, A macro current calculation is carried out by introducing a chip impedance sheet 3913 (step 3920). Others are same in FIG. 39.

In this case, pin-connected current models are generated as many as the case number of R, C, L combinations on the chip impedance sheet.

Also, upon executing the chip voltage drop analysis, the chip impedance value is calculated and then the appropriate pin-connected current model is selected to fit to the chip impedance value.

In this way, not only the high-precision voltage drop value can be obtained at a high speed but also the delay value corresponding to this can be obtained.

Seventeenth Embodiment

Next, a seventeenth embodiment of the present invention will be explained hereunder.

Normally, the macro has several major modes, In case of a memory macro, it has a write mode, a read mode, or the like and different internal circuits for these modes. For this reason, a power consumption distribution and power consumption are different by mode.

Therefore, in the present embodiment, a higher-accuracy current model is formed by taking account of an influence of the mode.

Figure 42:
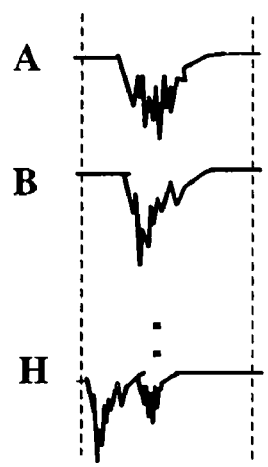
FIG. 42 is an explanatory view showing a method of a seventeenth embodiment of the present invention.
Figure 42:
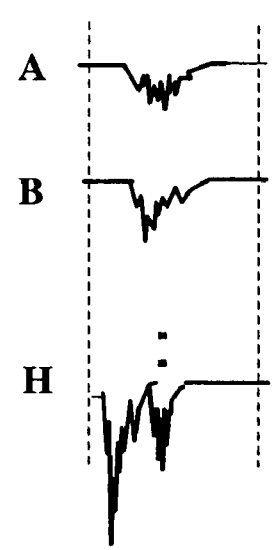

FIGS. 42A and 42B are a current model in each macro pin in the read mode and the write mode respectively.

Here, a macro mode sheet shown in FIG. 43 may be formed, then the waveform information of respective modes may be prepared as the library by using this macro mode sheet, and then such waveform information may be selected and introduced from the library with regard to the mode.

Figure 44:
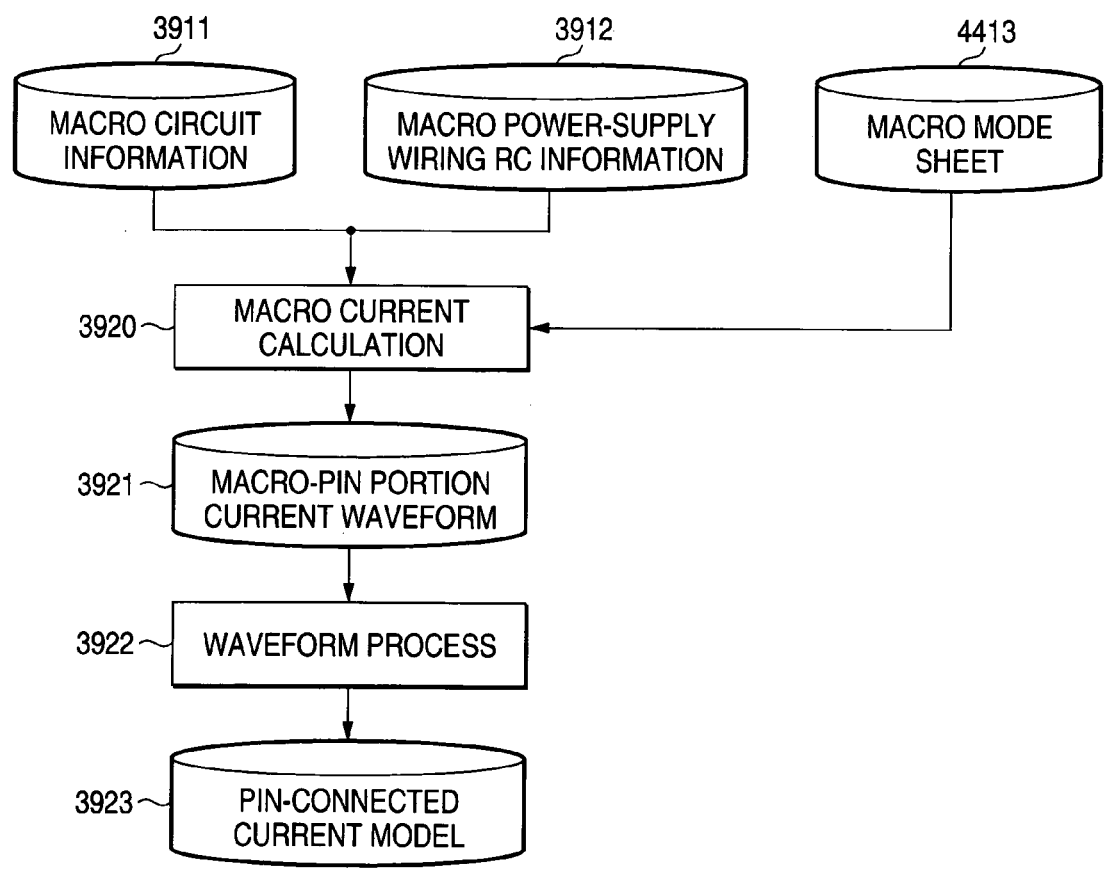
FIG. 44 is an explanatory view showing the method of the seventeenth embodiment of the present invention.

Now, a flowchart is as shown in FIG. 44. A macro current is calculated by introducing a macro mode sheet 4413 (step 3920). Others are identical to the above embodiment.

In this case, the pin-connected current models are also generated as many as the case number of mode combinations on the macro mode sheet.

Also, upon executing the chip voltage-drop analysis, the pin-connected current model corresponding to the employed mode is selected.

In this fashion, a high-speed processing can be implemented, the high-precision voltage drop value can be derived, and also the delay value corresponding to this value can be obtained.

Eighteenth Embodiment

Next, an eighteenth embodiment of the present invention will be explained hereunder.

In the present embodiment, the voltage analysis can be implemented at a high speed with high precision by forming wiring structures constructed by connecting the wirings in the macro via equivalent impedances and then preparing them as the library.

Figure 45:
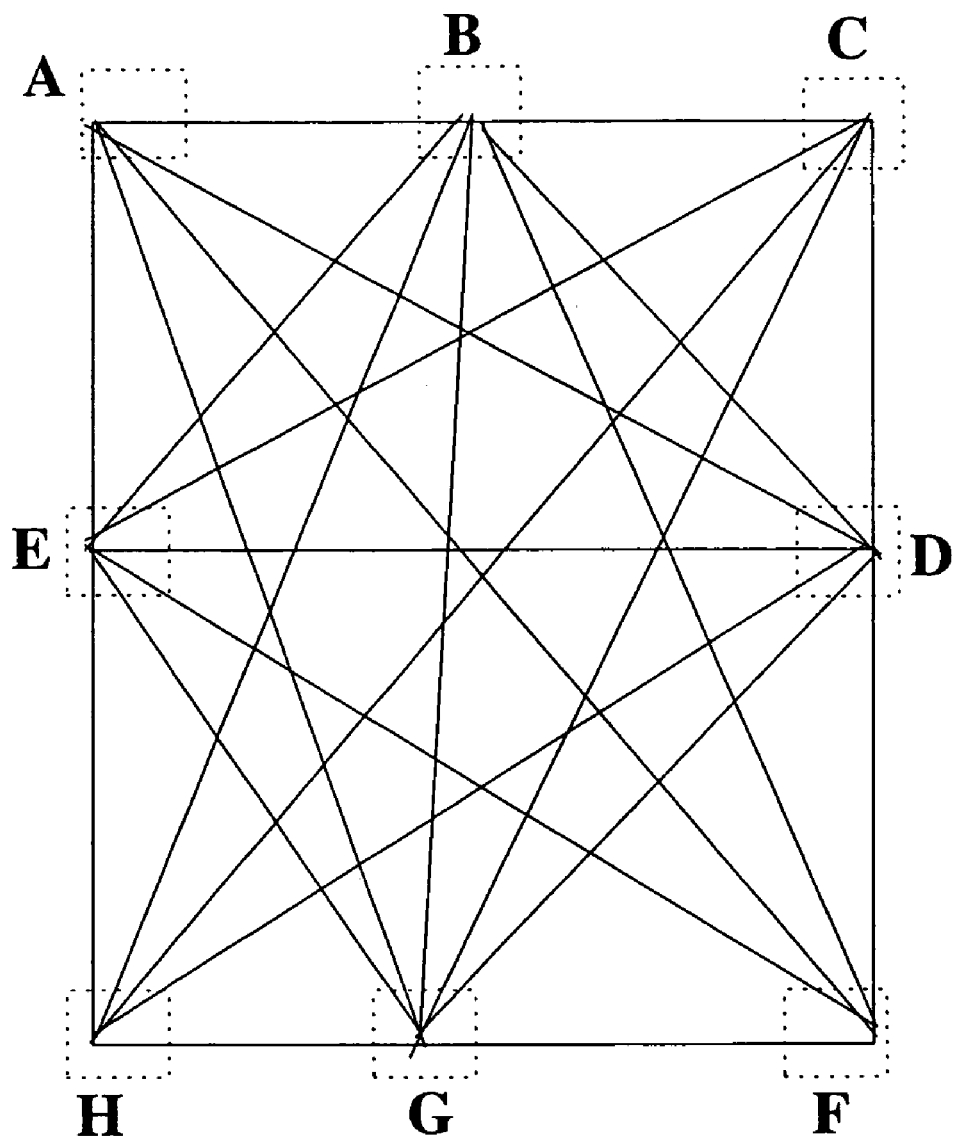
FIG. 45 is an explanatory view showing a method of an eighteenth embodiment of the present invention.
Figure 46:
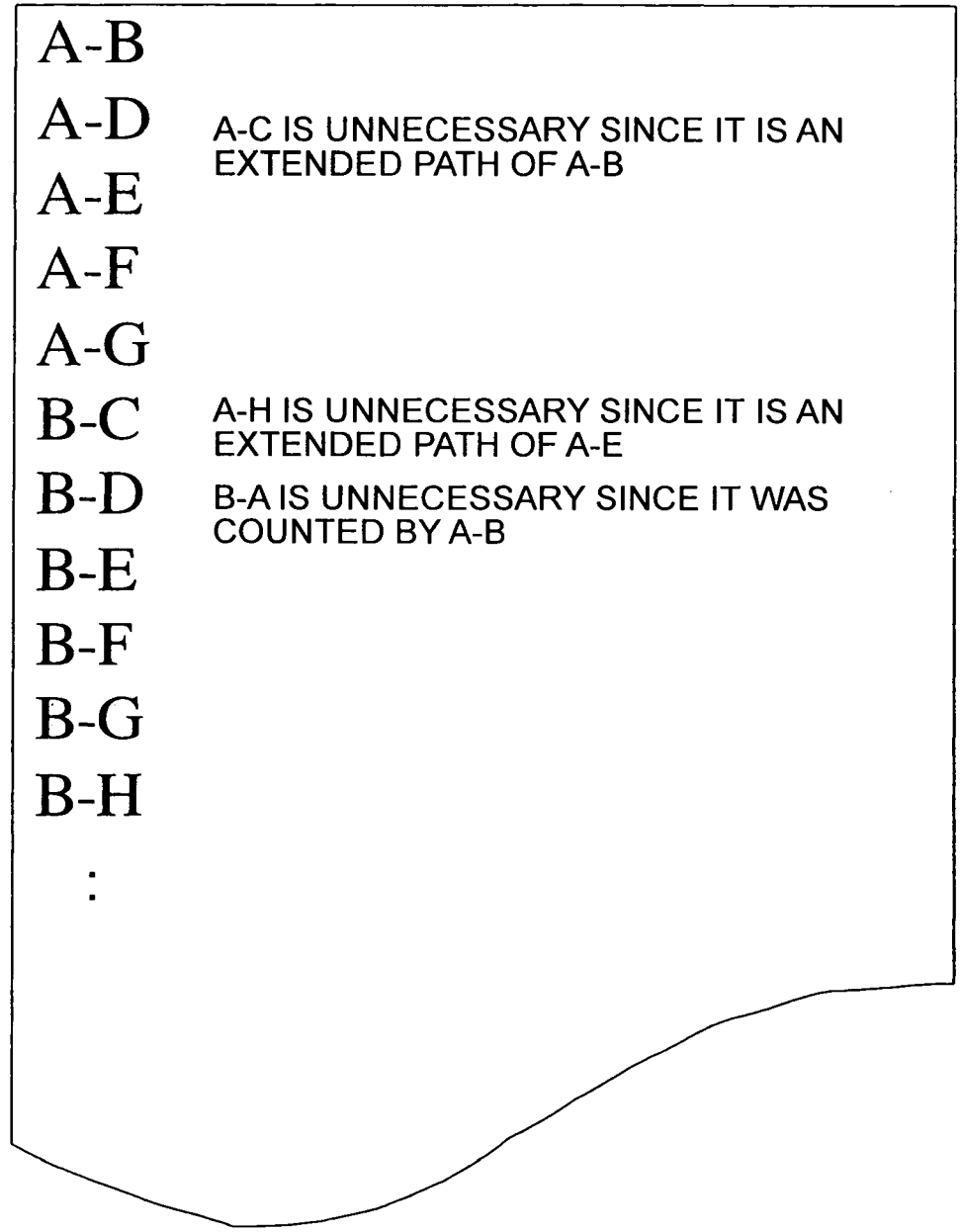
FIG. 46 is an explanatory view showing the method of the eighteenth embodiment of the present invention.
Figure 47:
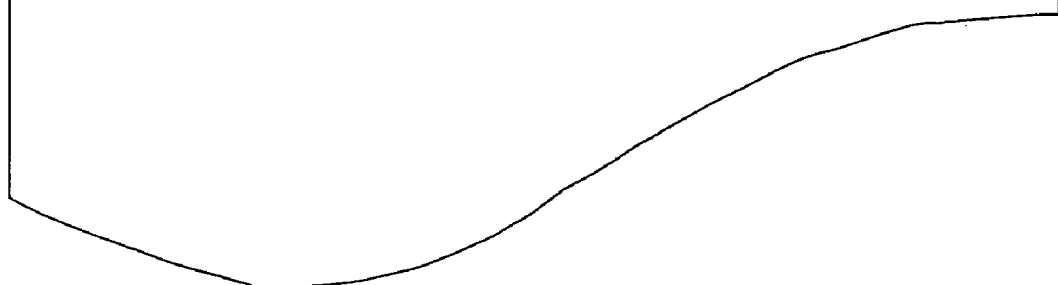
FIG. 47 is an explanatory view showing the method of the eighteenth embodiment of the present invention.

More specifically, as shown in FIG. 45, the macro pins are connected by an impedance resistance, and impedances between respective macro pins are formed as the library. At this time, first pin pairs necessary for calculation of the impedance resistances are selected by using a pin selecting macro wiring sheet, as shown in FIG. 46. Then, a macro wiring sheet shown in FIG. 47 is obtained.

Figure 48:
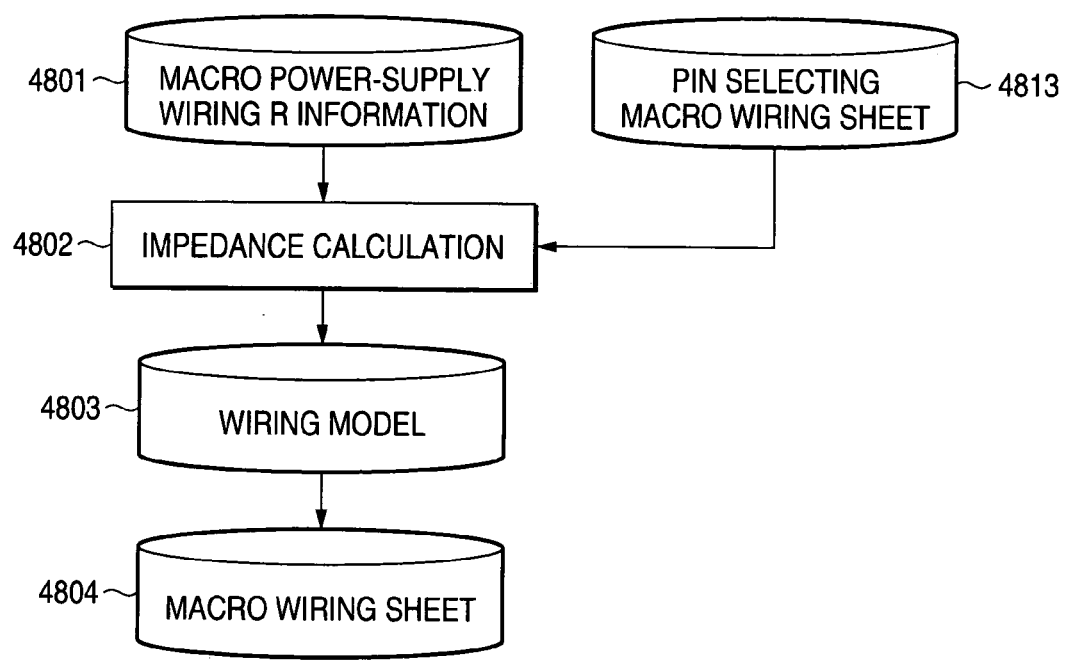
FIG. 48 is an explanatory view showing the method of the eighteenth embodiment of the present invention.

FIG. 48 is a flowchart showing a method of forming the macro wiring sheet to take paths of the power-supply wirings in the macro into consideration.

First, macro power-supply wiring resistance (R) information 4801 are picked up from the circuit information, and then the impedances are calculated by using the above pin selecting macro wiring sheet 4813 based on the macro power-supply wiring R information (step 4802).

Then, a wiring model 4803 is formed, and then this data is stored in a macro library as a macro wiring sheet 4804.

By the way, in the related art, in case that paths of the power-supply wirings in the macro must be considered, a huge amount of data is required because all layers of the power-supply wirings of major wirings are selected, extracted and calculated as the power-supply wirings in the macro. In contrast, in the present method, the calculation is required merely $(N-1)(N/2)$ times, where N is the number of macro pins. Thus, even in the chip into which large-scale macros are incorporated, the chip voltage drop can be calculated at a high speed while taking account of the wiring impedance internal the macro.

Nineteenth Embodiment

Next, a nineteenth embodiment of the present invention will be explained hereunder.

In the above eighteenth embodiment, the method of accelerating the voltage analysis by forming the wiring structures constructed by connecting the wirings in the macro via the equivalent impedances and then preparing them as the library is described. In the present embodiment, the chip voltage drop analysis can be implemented at a high speed with high precision by grasping internal circuit elements together with the actual power-supply wirings at a transistor level to model and then modeling the inside of the macro as connected structures of equivalent impedances and current models.

Figure 49:
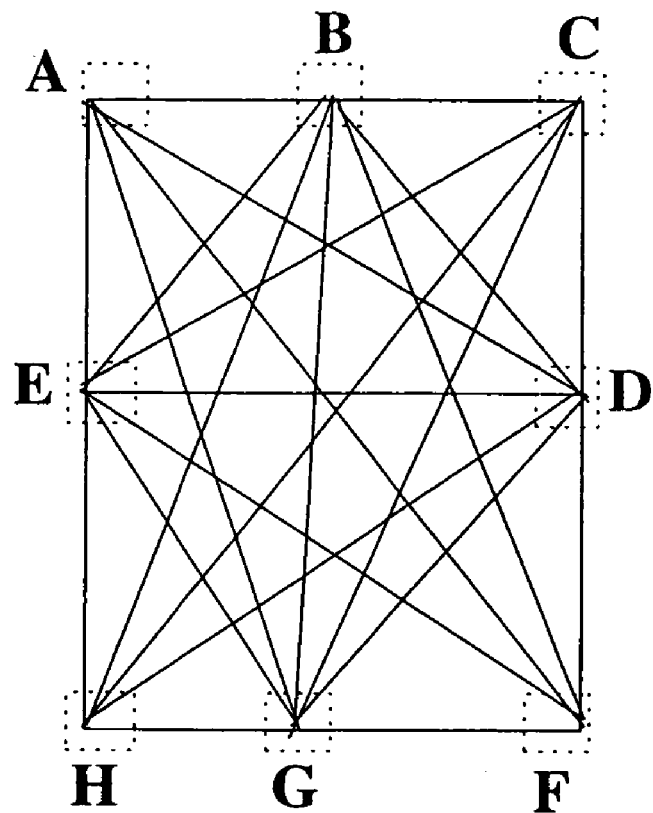
FIG. 49 is a explanatory view showing a method of a nineteenth embodiment of the present invention.
Figure 49:
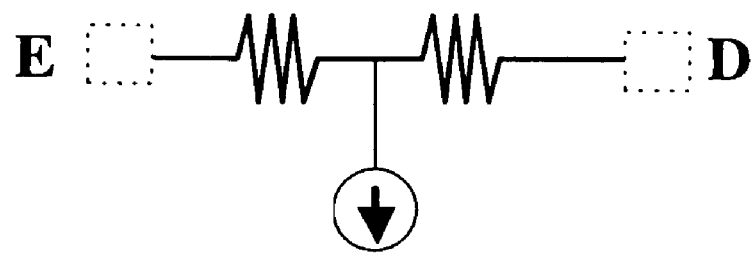

In other words, in the macro shown in FIG. 49A, the current models are generated by dividing a total current waveform in the macro in proportion to the wiring impedances, as shown in FIG. 49B.

Figure 50:
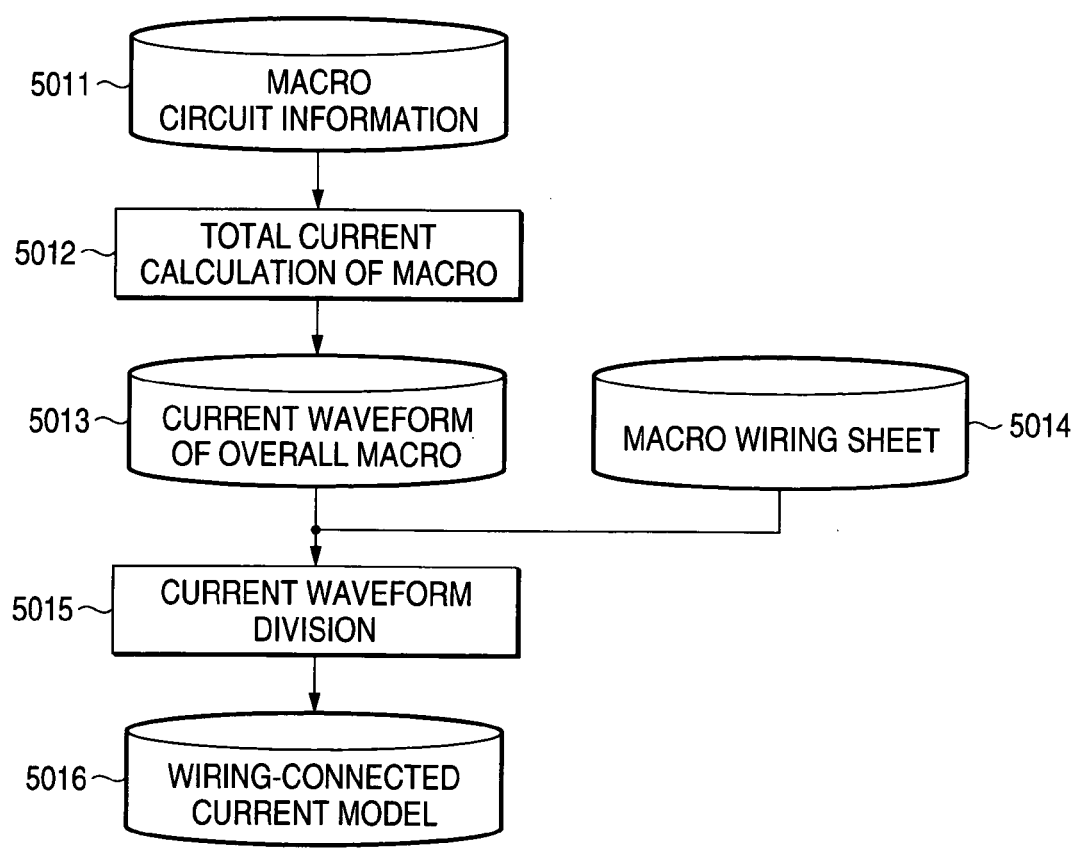
FIG. 50 is a explanatory view showing the method of the nineteenth embodiment of the present invention.

Procedures for this are shown in FIG. 50. That is, current waveform information of the overall macro are obtained by calculating a total current of the macro based on macro circuit information 5011 (step 5012), then the current waveform is divided based on this current waveform information and the macro wiring sheet shown in FIG. 47 (step 5015), and then a wiring-connected current model 5016 is formed.

According to this method, the voltage drop in the macro can be calculated simultaneously with the analysis of the voltage drop in the chip.

Twentieth Embodiment

Next, a twentieth embodiment of the present invention will be explained hereunder.

Figure 51:
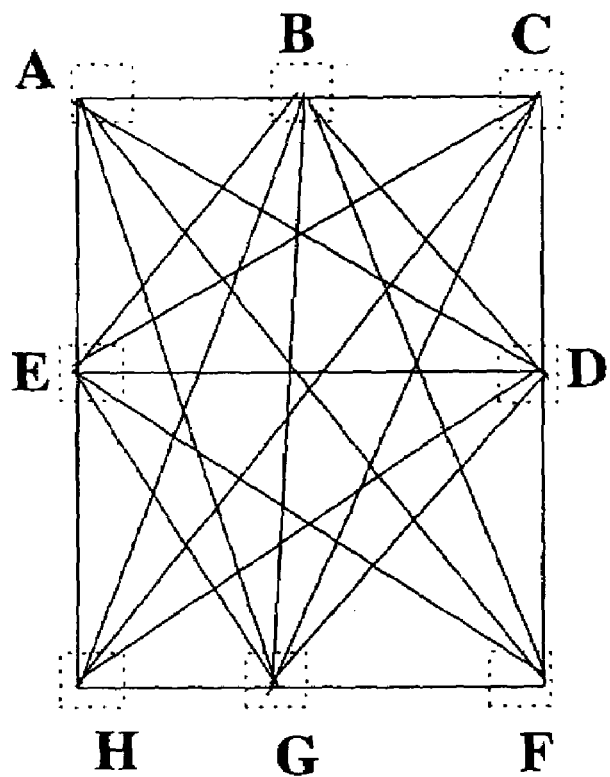
FIG. 51 is an explanatory view showing a method of a twentieth embodiment of the present invention.
Figure 51:
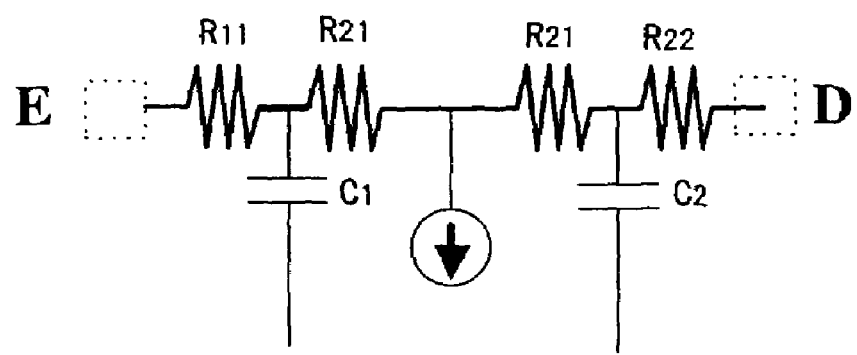

In the above nineteenth embodiment, after the wiring structures constructed by connecting the wirings in the macro via the equivalent impedances are formed, the current models are formed between the wirings by grasping the internal circuit elements together with the actual power-supply wirings at a transistor level to model. In addition, in the present embodiment, capacitance models are formed by dividing a total capacitance of the macro in proportion to the wiring impedances, then wiring-connected capacitances are modeled by adding decoupling capacitances between the wirings to contain resistances R11, R12, R21, R22, . . . , capacitances C1, C2, as shown in FIGS. 51A and 51B. Thus, the voltage drop analysis is accelerated by forming the inside of the macro as the library.

In other words, in the macro shown in FIG. 51A, the capacitance models are generated by dividing a total capacitance in the macro in proportion to the wiring impedances, as shown in FIG. 51B.

Figure 52:
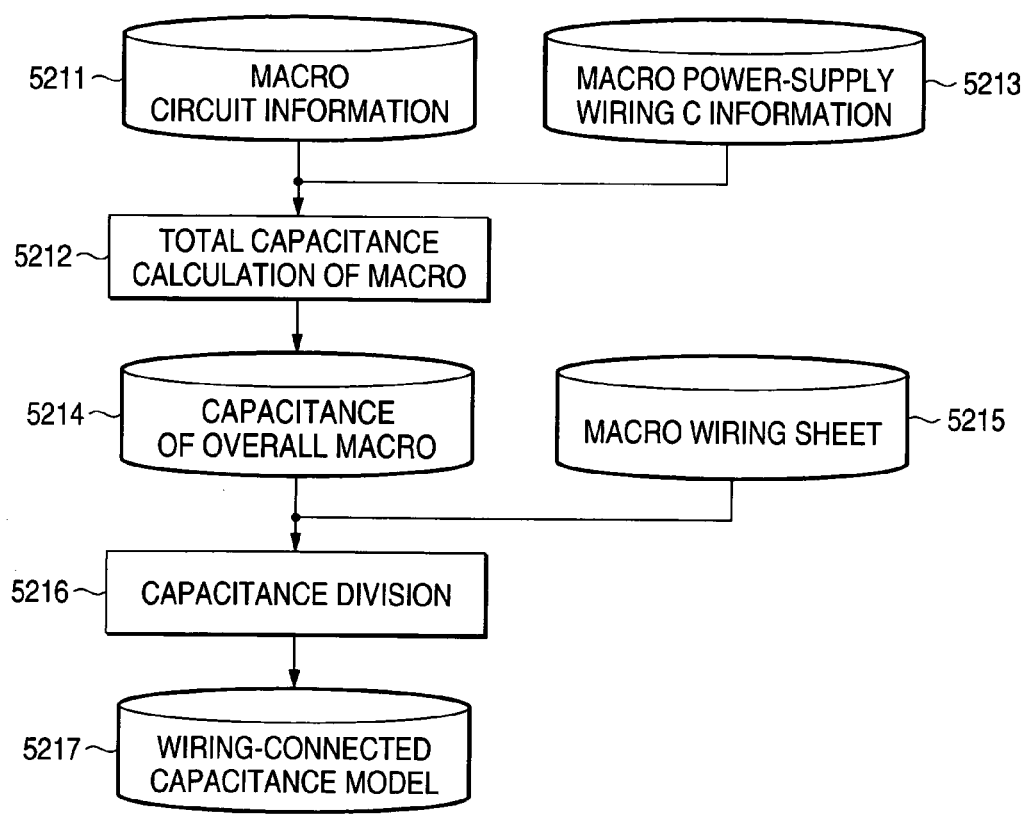
FIG. 52 is an explanatory view showing the method of the twentieth embodiment of the present invention.

Procedures for this are shown in FIG. 52. That is, capacitance information of the overall macro are obtained by calculating a total capacitance of the macro based on macro circuit information 5211 (step 5212), then the capacitance is divided based on this capacitance information and a macro wiring sheet 5215 shown in FIG. 47 (step 5216), and then a wiring-connected capacitance model 5217 is formed.

According to this method, the voltage drop in the macro can be calculated simultaneously with the analysis of the voltage drop in the chip.

Also, a high-precision voltage drop analysis that takes account of a decoupling capacitance component can be realized.

Twenty-First Embodiment

Next, a twenty-first embodiment of the present invention will be explained hereunder.

This example executes a timing analysis while considering the voltage drop, and has such a feature that a macro processing portion 5404 is employed to calculate the delay value.

In this example, the case that a macro-inside analyzable library 5411 that can analyze the interior of the macro will be explained hereunder. The data paths via the memory cell, the timing windows for respective data paths, and the voltage drops are shown in FIGS. 53A to 53C.

Figure 54:
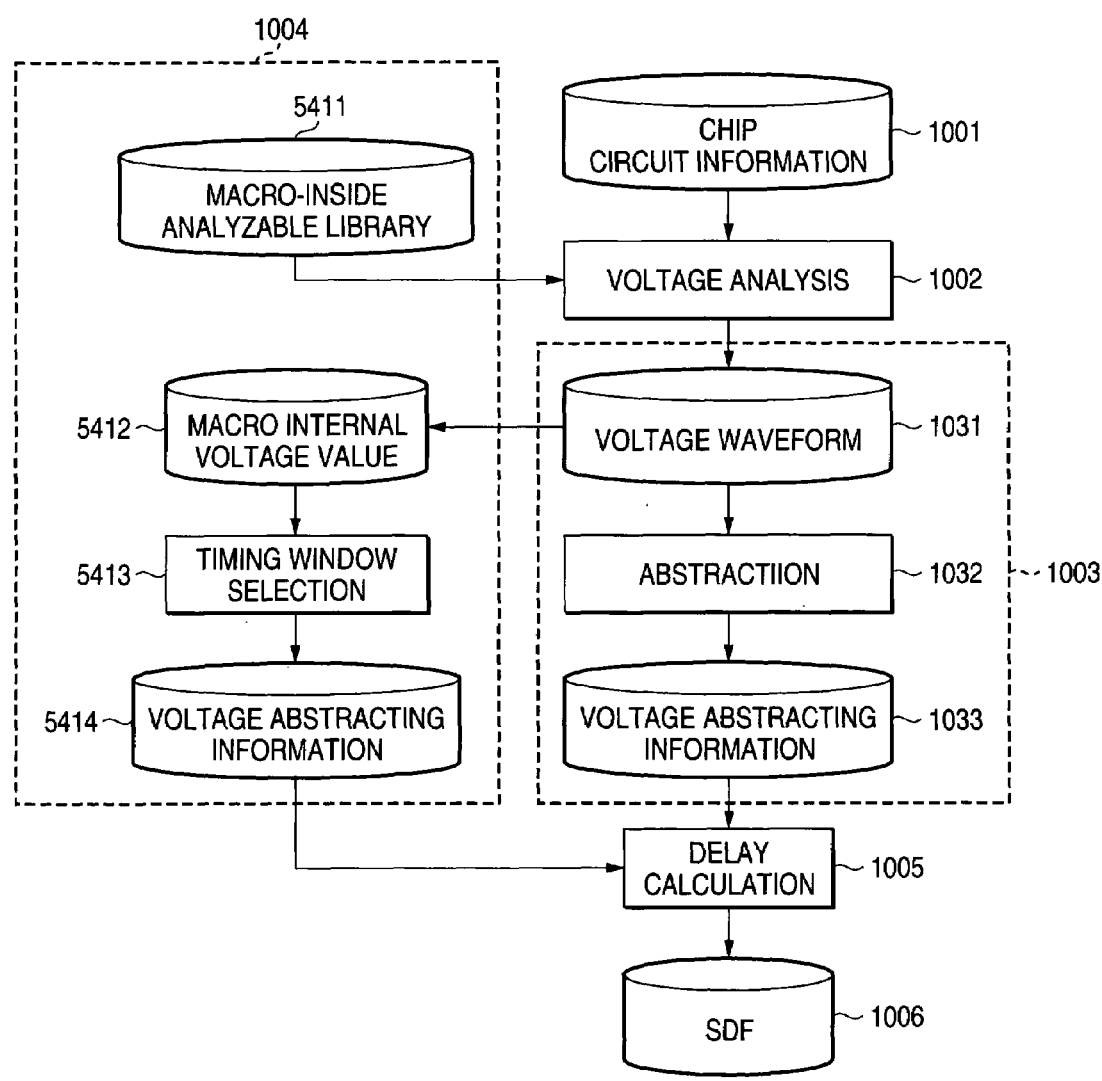
FIG. 54 is an explanatory view showing the method of the twenty-first embodiment of the present invention.

In this method, as shown in a flowchart of FIG. 54, the macro processing portion 5404 including the macro-inside analyzable library 5411 is employed. The macro-inside analyzable library 5411 is composed of the macro wiring sheet 4804, the wiring-connected current model 5016, and the wiring-connected capacitance model 5217.

For example, a memory cell in the macro shown in FIG. 53A is considered. AD0, AD10 are input addresses, and DO5, DO10 are output data. Timing charts of respective data paths in the memory cell are shown in FIG. 53B.

First, the voltage analysis is executed by referring to the chip circuit information 1001 and the macro-inside analyzable library 5411 in the macro processing portion 5404 (step 1002) to get voltage waveform information 1031. A macro internal voltage value 5412 is obtained from the voltage waveform information 1031.

Figure 53:
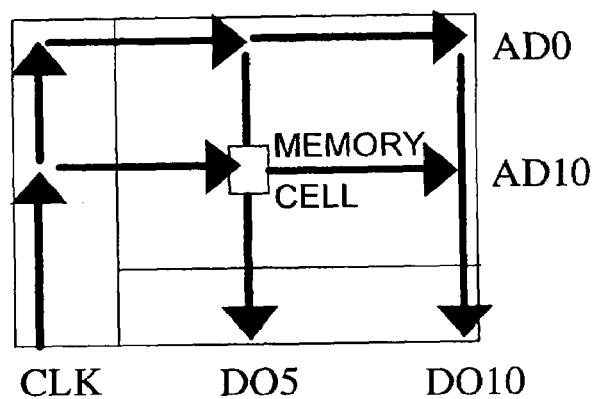
FIG. 53 is an explanatory view showing a method of a twenty-first embodiment of the present invention.
Figure 53:
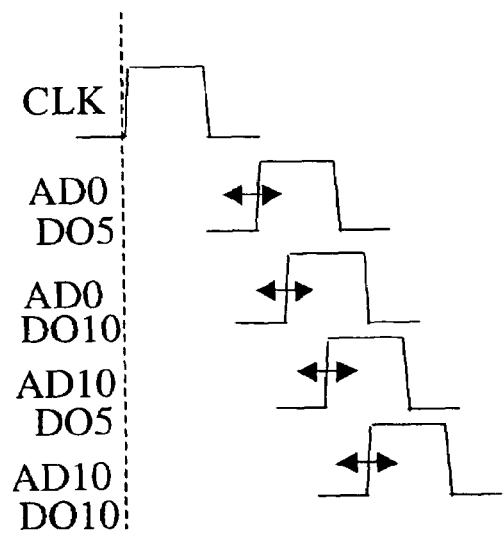
Figure 53:
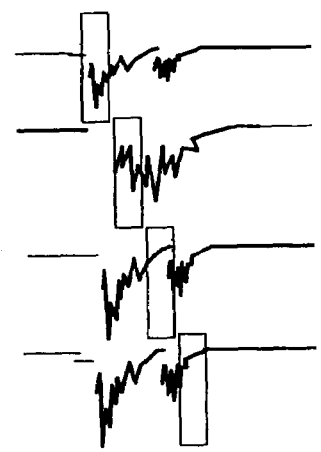

FIG. 53 shows an example of the macro. FIG. 53A shows four data paths of AD0–DO5, AD0–DO10, AD10–DO5, and AD10–DO10. FIG. 53B shows transition information of respective memory cells of respective data paths. FIG. 53C shows voltages at positions of respective memory cells in respective data paths.

For example, in FIG. 53A, if the data should be picked up from the address AD0 to DO5 via the memory cell, a rise time when a clock signal CLK in FIG. 53B is input is extracted. Then, the timing window is selected to contain this time (transition time) (step 5413). Then, voltage abstracting information 5414 shown in FIG. 53C are obtained by cutting out the information that are derived by abstracting the voltage waveforms of respective data paths.

Then, the delay calculation is executed in response to the voltage abstracting information 5414 (step 1005). Then, the process may be carried out, like the first embodiment shown in FIG. 1.

In this manner, according to the method of the present invention, since the voltage drop values shown in FIG. 53C are referred to every data path extending from the input to the output of the macro while executing the high-speed/high-precision voltage analysis using the macro library, a voltage-drop considering timing analysis can be carried out at a higher-precision.

Also, since the timing window is stipulated every data path, the event that the too pessimistic analysis is carried out by using the voltage drop value at an impossible timing can be eliminated.

Twenty-Second Embodiment

Next, a twenty-second embodiment of the present invention will be explained hereunder.

In this example, the voltage-drop considering timing analysis is executed, and the analysis of a macro-inside unanalyzable library is carried out. The present embodiment is characterized in that, upon calculating the delay value, the macro-inside voltage and the delay value are calculated by executing the macro voltage analysis based on macro pin voltage information as the voltage abstracting information and the circuit information, power-supply RC information, mode information, and chip impedance information.

This example executes the voltage-drop considering timing analysis, and has a feature that a macro processing portion 5504 is employed upon calculating the delay value. In this example, the case that a macro-inside unanalyzable library 5511 that cannot analyze the interior of the macro will be explained hereunder.

Figure 55:
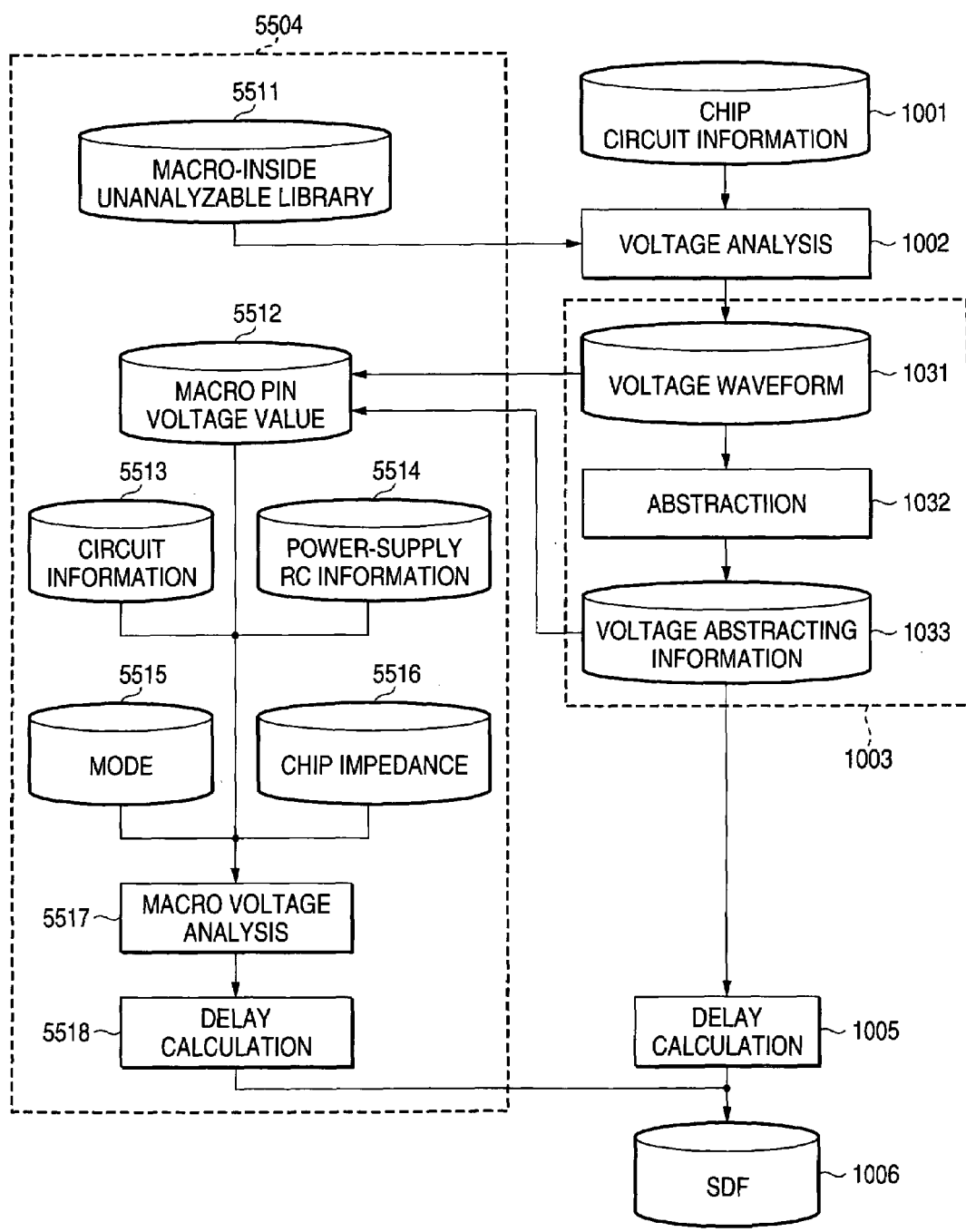
FIG. 55 is an explanatory view showing a method of a twenty-second embodiment of the present invention.

According to this method, the macro processing portion 5404 having the macro-inside unanalyzable library 5511 as shown in a flowchart of FIG. 55 is employed.

First, the voltage analysis is executed by referring to the chip circuit information 1001 and the macro-inside unanalyzable library 5511 in the macro processing portion 5504 (step 1002) to get the voltage waveform information. The macro-inside unanalyzable library 5511 is constructed by the macro wiring sheet 4804, the wiring-connected, and the pin-connected current model 3922 (3923). A macro pin voltage value 5512 is obtained from the voltage abstracting information 1033, then the macro voltage analysis is carried out based on circuit information 5513, power-supply RC information 5514, mode information 5515, and chip impedance information 5516, and then the macro internal voltage and the delay value 5518 are calculated.

In this manner, the delay value of the macro are calculated. Also for the out of macro such as standard cell, the delay calculation is carried out in answer to the voltage abstraction information 1033 (step 1005). Then, the processes similar to those in the first embodiment shown in FIG. 1 may be carried out.

According to such configuration, a high-precision voltage-drop considering timing analysis can be applied to the macro such as the analog, etc. for which it is difficult to prepare the delay library.

In this case, in order to attain the optimization, the analysis is carried out once again after conditions are changed virtually, and then the result is reported. As a result, it is feasible to get the best layout readily via several processes.

As explained above, according to the present invention, upon analyzing the voltage drop in the semiconductor integrated circuit, a high-precision and highly reliable analysis can be carried out not by calculating the delay value based on the average voltage information but by calculating the voltage-drop information over two points to estimate the timing based on the information and calculate the delay value.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. An operation analyzing method for a semiconductor integrated circuit device, comprising the steps of:
   forming voltage waveform information by calculating a time-dependent voltage waveform of each instance of a semiconductor integrated circuit at a power-supply terminal based on circuit information of a semiconductor integrated circuit device and analyzing the time-dependent voltage waveform of each instance;
   forming discrete voltage information by approximating the voltage waveform information; and
   calculating a delay value of the instance based on the discrete voltage information.

2. An operation analyzing method for a semiconductor integrated circuit device according to claim 1, wherein the step of forming the voltage waveform information includes the step of calculating the voltage waveform information of all instances in the semiconductor integrated circuit device.

3. An operation analyzing method for a semiconductor integrated circuit device according to claim 1, wherein the step of calculating the delay value is the step of referring to a library in response to the discrete voltage information to read a concerned delay value from the library and outputting the delay value as delay value information.

4. An operation analyzing method for a semiconductor integrated circuit device according to claim 3, wherein the library includes a cell library for storing approximated cell information and a macro library for storing approximated macro information.

5. An operation analyzing method for a semiconductor integrated circuit device according to claim 3, wherein the library is constructed by combinations of plural times and plural voltages in each cell or each macro consisting of an assembly of cells.

6. An operation analyzing method for a semiconductor integrated circuit device according to claim 5, wherein a longest interval of the plural times is equal to a width of the unit window.

7. An operation analyzing method for a semiconductor integrated circuit device according to claim 1, further comprising the step of calculating an active time of each instance based on the circuit information prior to the step of forming the discrete voltage information.

8. An operation analyzing method for a semiconductor integrated circuit device according to claim 1, wherein the step of forming the voltage waveform information is the step of forming the time-dependent voltage waveform by referring to a previously formed library based on the circuit information.

9. An operation analyzing method for a semiconductor integrated circuit device according to claim 1, wherein the step of forming the discrete voltage information includes the linearing step of partitioning the time-dependent voltage waveform every predetermined unit window and linearing such waveform in the unit window.

10. An operation analyzing method for a semiconductor integrated circuit device according to claim 9, wherein the linearing step is the step of forming linear information by connecting a start point and an end point of the time-dependent voltage waveform in the unit window by a straight line to linearize.

11. An operation analyzing method for a semiconductor integrated circuit device according to claim 9, wherein the linearing step includes the step of forming linear information by linearing the voltage waveform in the unit window by a method of least squares.

12. An operation analyzing method for a semiconductor integrated circuit device according to claim 9, wherein the predetermined unit window is set to a maximum value of delay times of all instances.

13. An operation analyzing method for a semiconductor integrated circuit device according to claim 9, wherein the step of forming the discrete voltage information includes the step of forming stepwise information by picking up a maximum value in the unit window from the linear information if an absolute vale of a gradient of the linear information in the unit window is larger than 1 and picking up a minimum value in the unit window if the absolute vale of the gradient is smaller than 1.

14. An operation analyzing method for a semiconductor integrated circuit device according to claim 1, wherein the step of calculating the delay value includes the steps of,
calculating transition times of an input signal and an output signal of the instance from the circuit information,
extracting the unit window through which the input signal and the output signal are translated based on the transition times calculated in the calculating step,
deciding whether or not the output signal is translated through the unit window, based on the extracted unit window, and
calculating the delay value based on a decision result in the deciding step.

15. An operation analyzing method for a semiconductor integrated circuit device according to claim 14, wherein the step of calculating the delay value is the step of employing a steady voltage in delay calculation as a voltage obtained after a voltage drop in the unit window when it is decided in the deciding step that the output signal does not translate over unit windows and a delay time of the instance is smaller than the unit window.

16. An operation analyzing method for a semiconductor integrated circuit device according to claim 14, wherein the step of calculating the delay value is the step of employing a value calculated with regard to voltage values in both translated unit windows calculation as a voltage obtained after a voltage drop in the unit window when a delay time of the instance is larger than the unit window.

17. An operation analyzing method for a semiconductor integrated circuit device according to claim 14, wherein the step of calculating the delay value is the step of calculating the delay value by modeling the instance in terms of the instance and a wiring network by which the instance is driven when a delay time of the instance is larger than the unit window.

18. An operation analyzing method for a semiconductor integrated circuit device according to claim 14, wherein the step of calculating the delay value is the step of calculating a mean value of power-supply voltages in translated unit windows and calculating the delay value based on the mean value when it is decided in the deciding step that the output signal translates over unit windows and input/output signals of the instance translate within the unit window.

19. An operation analyzing method for a semiconductor integrated circuit device according to claim 14, wherein the step of calculating the delay value is the step of calculating a weighted mean value of power-supply voltages based on translated positions in translated unit windows and calculating the delay value based on the weighted mean value when it is decided in the deciding step that the output signal translates over unit windows and input/output signals of the instance translate within the unit window.

20. An operation analyzing method for a semiconductor integrated circuit device according to claim 14, wherein the step of calculating the delay value includes the step of expanding a voltage considering period of the instance up to a threshold voltage of an input signal waveform of the instance when it is decided in the deciding step that the output signal translates over unit windows.

21. An operation analyzing method for a semiconductor integrated circuit device according to claim 14, wherein the step of calculating the delay value includes the step of calculating a power-supply voltage in delay calculation from a voltage drop value obtained until an input signal waveform of the instance comes up to a delay measuring threshold voltage when it is decided in the deciding step that the output signal translates over unit windows.

22. An operation analyzing method for a semiconductor integrated circuit device according to claim 1, wherein, upon binarizing the voltage, the approximating step decides the voltage depending on whether or not a value of the time-dependent voltage waveform at each time is larger than an intermediate point.

23. An operation analyzing method for a semiconductor integrated circuit device according to claim 1, wherein the step of forming the discrete voltage information divides the semiconductor integrated circuit into plural areas like a mesh such that instances in each area share same voltage data.

24. An operation analyzing method for a semiconductor integrated circuit device according to claim 23, wherein a time constant of the power-supply wiring is calculated based on parasitic element information of the power-supply wiring, and a same group holds voltage data in common in a certain range of the time constant.

25. An operation analyzing method for a semiconductor integrated circuit device according to claim 24, wherein macros are generated by current waveforms of grouped instance groups and a degenerated power-supply wiring RC circuit, and voltage analysis is executed by using respective macros.

26. An operation analyzing method for a semiconductor integrated circuit device according to claim 23, wherein the same group holds voltage data in common when a waveform difference of the power-supply voltage in the range is within a predetermined range.

27. An operation analyzing method for a semiconductor integrated circuit device according to claim 1, wherein the step of calculating the delay value includes the step of detecting a voltage drop value at a time when an object cell operates lastly in a timing window, and the step of calculating the delay value based on a detected value, in a calculation to detect a maximum delay time.

28. An operation analyzing method for a semiconductor integrated circuit device according to claim 1, wherein the step of calculating the delay value includes the step of detecting a voltage drop value at a time when an object cell operates first in a timing window, and the step of calculating the delay value based on a detected value, in a calculation to detect a minimum delay time.

29. An operation analyzing method for a semiconductor integrated circuit device according to claim 1, wherein the step of calculating the delay value includes the step of extracting a cell that drives a clock, and the step of calculating selectively only the delay value of the cell that drives the clock.

30. An operation analyzing method for a semiconductor integrated circuit device according to claim 1, wherein the step of calculating the delay value executes a delay calculation of all time relationships in timing windows based on the time-dependent voltage waveform, in a circuit in which a plurality of timing windows are present.

31. An operation analyzing method for a semiconductor integrated circuit device according to claim 1, wherein the step of calculating the delay value includes the steps of,
   calculating a rough voltage drop amount,
   detecting the instance in which the voltage drop amount becomes maximum, and
   deciding whether or not a timing in a path that reaches the instance has a margin, and
   the delay value is not calculated in the instance that has a margin in the voltage drop amount.

32. An operation analyzing method for a semiconductor integrated circuit device according to claim 1, wherein the analyzing step includes the steps of,
   calculating time-dependent voltage waveforms of respective circuit elements in a semiconductor integrated circuit, and
   calculating delay values of the circuit elements based on the time-dependent voltage waveforms of respective circuit elements at a power-supply terminal.

33. An operation analyzing method for a semiconductor integrated circuit device according to claim 1, wherein the step of calculating the delay value is the step of calculating a macro-inside voltage and the delay value by executing a macro voltage analysis based on macro pin voltage information as the discrete voltage information and the circuit information, power-supply RC information, mode information, and chip impedance information.

34. An optimizing method of a semiconductor integrated circuit device, comprising the steps of:
   reporting an instance that affects a unit window of a cell that is weak in a voltage drop, based on an analyzed result obtained by using the operation analyzing method set forth in claim 1; and
   executing optimization based on the reporting step.

35. An optimizing method of a semiconductor integrated circuit device according to claim 34, wherein the step of executing the optimization includes the step of moving an affecting instance reported in the reporting step.

36. An optimizing method of a semiconductor integrated circuit device according to claim 34, wherein the step of executing the optimization includes the step of inserting a capacitance cell near an affecting instance reported in the reporting step.

37. An analyzing system for implementing the operation analyzing method set forth in claim 1.

38. An operation analyzing method for a semiconductor integrated circuit device according to claim 1, wherein the time-dependent voltage is calculated by taking account of voltage variation during when each instance is operated.

* * * * *